United States Patent
Arai et al.

(10) Patent No.: US 10,872,952 B1
(45) Date of Patent: Dec. 22, 2020

(54) MOSFET AND POWER CONVERSION CIRCUIT

(71) Applicant: SHINDENGEN ELECTRIC MANUFACTURING CO., LTD., Tokyo (JP)

(72) Inventors: Daisuke Arai, Saitama (JP); Mizue Kitada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/497,797

(22) PCT Filed: May 26, 2017

(86) PCT No.: PCT/JP2017/019817
§ 371 (c)(1),
(2) Date: Sep. 26, 2019

(87) PCT Pub. No.: WO2018/216222
PCT Pub. Date: Nov. 29, 2018

(51) Int. Cl.
*H01L 29/00* (2006.01)
*H01L 29/06* (2006.01)
(Continued)

(52) U.S. Cl.
CPC ...... *H01L 29/0634* (2013.01); *H01L 29/0688* (2013.01); *H01L 29/1095* (2013.01);
(Continued)

(58) Field of Classification Search
CPC ............. H01L 29/0634; H01L 29/7813; H01L 29/0688; H01L 29/1095; H01L 29/1608; H02M 7/537; H02M 3/156; H02M 1/32
See application file for complete search history.

(56) References Cited

U.S. PATENT DOCUMENTS 6,888,195 B2    5/2005  Saito et al.
9,524,966 B2 *  12/2016 Kaindl ............... H01L 29/7802
(Continued)

FOREIGN PATENT DOCUMENTS

JP   2004-119611 A   4/2004

OTHER PUBLICATIONS

International Search Report in PCT/JP2017/019817, dated Jul. 11, 2017, 4pp.
(Continued)

*Primary Examiner* — Adolf D Berhane
*Assistant Examiner* — Afework S Demisse
(74) *Attorney, Agent, or Firm* — Hauptman Ham, LLP

(57) ABSTRACT

A MOSFET according to the present invention includes a semiconductor base substrate having a super junction structure. A gate electrode is on a first main surface side of the semiconductor base substrate by way of a gate insulation film, wherein in a state where a total amount of dopant in an n-type column region differs from a total amount of dopant in a p-type column region, assuming a depth position where an average positive charge density $\rho(x)$ becomes 0 as $X_m'$, assuming a deepest depth position of the surface of the depletion layer on the first main surface side as $X_0'$, assuming a depth position where the reference average positive charge density $\rho_0(x)$ becomes 0 as $X_m$, and assuming a deepest depth position of the depletion layer on the first main surface side as $X_0$, a relationship of $|X_0-X_0'|<|X_m-X_m'|$ is satisfied.

17 Claims, 19 Drawing Sheets

(51) Int. Cl.
*H01L 29/78* (2006.01)
*H01L 29/10* (2006.01)
*H02M 3/156* (2006.01)
*H02M 7/537* (2006.01)
*H01L 29/16* (2006.01)

(52) U.S. Cl.
CPC ........ *H01L 29/7813* (2013.01); *H02M 3/156* (2013.01); *H02M 7/537* (2013.01); *H01L 29/1608* (2013.01)

(56) References Cited

U.S. PATENT DOCUMENTS

| | | | |
|---|---|---|---|
| 2003/0222327 A1* | 12/2003 | Yamaguchi | H01L 29/7802 257/500 |
| 2006/0151806 A1 | 7/2006 | Fukuda et al. | |
| 2007/0013000 A1 | 1/2007 | Shiraishi | |
| 2010/0025760 A1 | 2/2010 | Kawashima | |
| 2015/0115354 A1* | 4/2015 | Kaindl | H01L 29/0878 257/330 |

OTHER PUBLICATIONS

Search report in NL application No. 2020930, dated Jan. 9, 2019, 11pp.

\* cited by examiner

US 10,872,952 B1

MOSFET AND POWER CONVERSION CIRCUIT

RELATED APPLICATIONS

The present application is a National Phase of International Application Number PCT/JP2017/019817, filed May 26, 2017.

TECHNICAL FIELD

The present invention relates to a Metal-Oxide Semiconductor Field-Effect Transistor (MOSFET) and a power conversion circuit.

BACKGROUND ART

Conventionally, there has been known a MOSFET which includes a semiconductor base substrate having a super junction structure which is formed of an n-type column region and a p-type column region (see patent document 1, for example).

In this specification, "super junction structure" means a structure where an n-type column region and a p-type column region are alternately and repeatedly arranged as viewed in a predetermined cross section.

As shown in FIG. 25, a conventional MOSFET 900 includes: a semiconductor base substrate 910 having a super junction structure 917 formed of n-type column regions 914 and p-type column regions 916, base regions 918 formed on a surface of a first main surface, all surfaces of the p-type column regions 916 and portions of surfaces of the n-type column regions 914, n-type surface high concentration regions 919 formed on the surface of the first main surface and surfaces of the n-type column regions 914 such that the n-type surface high concentration region 919 is disposed adjacently to the base region 918, and n-type source regions 920 formed on surfaces of the base regions 918; and a gate electrode 936 formed on surfaces of the base regions 918 each of which is sandwiched between the source region 920 and the n-type surface high concentration region 919 by way of a gate insulation film 934.

In the conventional MOSFET 900, the n-type column region 914 and the p-type column region 916 are formed such that a total amount of dopant in the n-type column region 914 is equal to a total amount of dopant in the p-type column region 916. That is, the n-type column region 914 and the p-type column region 916 are well-balanced with each other in terms of a charge. Further, both the dopant concentration in the n-type column region 914 and the dopant concentration in the p-type column region 916 are respectively set to a fixed value regardless of a depth. Still further, side walls of the n-type column region 914 are formed into a tapered shape which is narrowed toward a first main surface side, and side walls of the p-type column region 916 are formed into a tapered shape which is narrowed toward a bottom thereof.

In the specification, "total amount of dopant" means a total amount of dopant in a constitutional element (the n-type column region or the p-type column region) in the MOSFET.

The conventional MOSFET 900 includes the semiconductor base substrate 910 having the super junction structure 917 formed of the n-type column regions 914 and the p-type column regions 916 thus providing a switching element which has a low ON resistance and a high withstand voltage.

PRIOR ART DOCUMENT

Patent Document

Patent document 1: JP-A-2004-119611

SUMMARY OF INVENTION

Problem to be Solved by the Invention

The conventional MOSFET 900 has a drawback that in a case where an irregularity exists in a charge balance around the gate, an irregularity is liable to occur in switching characteristics when the MOSFET 900 is turned off.

Accordingly, the present invention has been made so as to overcome the above-mentioned drawback, and it is an object of the present invention to provide a MOSFET where an irregularity minimally occurs in switching characteristics when the MOSFET is turned off even in a case where an irregularity occurs in a charge balance around a gate, and a power conversion circuit which uses the MOSFET.

Solution to Problem

[1] According to the present invention, there is provided a MOSFET which includes:

a semiconductor base substrate having a super junction structure which is formed of an n-type column region and a p-type column region; and a gate electrode formed on a first main surface side of the semiconductor base substrate by way of a gate insulation film, wherein using a deepest depth position of a surface of a depletion layer on the first main surface side when the depletion layer extends most in the super junction structure by turning off the MOSFET as a reference, in a graph where a depth x at a predetermined depth position of the super junction structure is taken on an axis of abscissas, average positive charge density $\rho(x)$ at the predetermined depth position of the super junction structure expressed by a following formula (1) when the super junction structure is depleted by turning off the MOSFET is taken on an axis of ordinates, and assuming a depth of a surface of the depletion layer on a second main surface side at a shallowest depth position when the depletion layer extends most in the super junction structure by turning off the MOSFET as a, in a curve which expresses the average positive charge density $\rho(x)$, a value of the average positive charge density $\rho(0)$ when x=0 becomes a negative value and a value of the average positive charge density $\rho(a)$ when x=a becomes a positive value, an area of a region surrounded by a curve which expresses the average positive charge density $\rho(x)$, a straight line when x=0, and an x axis is equal to an area of a region surrounded by the curve which expresses the average positive charge density $\rho(x)$, a straight line when x=a, and the x axis, in a case that a state where a total amount of dopant in the n-type column region differs from a total amount of dopant in the p-type column region is brought about, using a surface of the super junction structure on the first main surface side as a reference, in the state where the total amount of dopant in the n-type column region differs from the total amount of dopant in the p-type column region, assuming a depth position where the average positive charge density $\rho(x)$ becomes 0 as $X_m'$, and assuming a deepest depth position of the surface of the depletion layer on the first main surface side when the depletion layer extends most in the super junction structure by turning off the MOSFET as $X_0'$, and using the surface of the super junction structure on the first main surface side as a reference, in a case where the average positive charge density when the super junction structure is depleted by turning off the reference MOSFET which is configured such that the total amount of dopant in the n-type column region is set equal to the total amount of dopant in the p-type column region is set as a reference average positive charge density $\rho_0(x)$, assuming a depth position where the reference average positive charge density $\rho_0(x)$ becomes 0 as $X_m$, and assuming a deepest depth position of the depletion layer on the first main surface side when the depletion layer extends most in the super junction structure by turning off the reference MOSFET as $X_0$, a relationship of $|X_0-X_0'|<|X_m-X_m'|$ is satisfied.

[Formula 1]

$$\rho(x) = \frac{q}{2w}[w_n(x) \cdot N_d(x) - w_p(x) \cdot N_a(x)] \quad (1)$$

(In the formula (1), $W_n(x)$ indicates a width of the n-type column region at the predetermined depth position, $N_d(x)$ indicates average density of a positive charge at the predetermined depth position of the n-type column region when the super junction structure is depleted by turning off the MOSFET, $W_p(x)$ indicates a width of the p-type column region at the predetermined depth position, $N_a(x)$ indicates average density of a negative charge at the predetermined depth position of the p-type column region when the super junction structure is depleted by turning off the MOSFET, q indicates an elementary charge, and w indicates a positive constant which satisfies $W_n(x)+W_p(x)=2w$.)

In this specification, "a depth at a predetermined depth position of the super junction structure" means a depth at a predetermined depth position of the super junction structure using a deepest depth position of a surface of a depletion layer on the first main surface side when the depletion layer extends most in the super junction structure by turning off the MOSFET as a reference. "second main surface" means a main surface on a side opposite to the first main surface. "average density of a positive charge at the predetermined depth position of the n-type column region" means average density of a positive charge generated by a donor in the n-type column region when the n-type column region is depleted by turning off the MOSFET, and "average density of a negative charge at the predetermined depth position of the p-type column region" means average density of a negative charge generated in an acceptor of the p-type column region when the p-type column region is depleted by turning off the MOSFET.

In this specification, "reference MOSFET" means a MOSFET where a shape of the super junction structure (a p-type column region and an n-type column region) is equal to the super junction structure of the MOSFET according to the present invention, a concentration gradient of a p-type dopant in the p-type column region and a concentration gradient of an n-type dopant in the n-type column region are equal to the corresponding concentration gradients of the p-type dopant and the n-type dopant used in the MOSFET according to the present invention, and dopant concentration in the p-type column region is adjusted such that a total amount of dopant in the p-type column region becomes equal to a total amount of dopant in the n-type column region. On the other hand, "reference average positive charge density $\rho_0(x)$" means average positive charge density of the reference MOSFET. The MOSFET according to the present invention includes a MOSFET in a state where a total amount of dopant in an n-type column region becomes equal to a total amount of dopant in a p-type column region (that is, a state where a charge balance is obtained) and a case where the total amount of dopant in the n-type column region and the total amount of dopant in the p-type column region are different from each other (that is, a state where an irregularity occurs in a charge balance).

[2] According to the MOSFET of the present invention, it is preferable that the average positive charge density $\rho(x)$ be expressed by an upward convex curve projecting in a right upward direction.

In this specification, "average positive charge density $\rho(x)$ at a predetermined depth position of the super junction structure is expressed by an upward convex curve projecting in a right upward direction" means not only the case where the average positive charge density is expressed by a monotonous upward convex curve projecting in a right upward direction but also a case where the average positive charge density is expressed in a stepped shape (a line (an envelope) which connects corner portions of steps forming a monotonous upward convex curve projecting in a right upward direction), and a case where the average positive charge density is formed of a curve where a concave shape and a convex shape are repeated (an envelope forming a monotonous upward convex curve projecting in a right upward direction).

[3] According to the MOSFET of the present invention, it is preferable that in a graph where a depth x of the predetermined depth position of the super junction structure is taken on an axis of abscissas and a width $W_p(x)$ at the predetermined depth position of the p-type column region or a width $W_n(x)$ at the predetermined depth position of the n-type column region is taken on an axis of ordinates, the width $W_p(x)$ at the predetermined depth position of the p-type column region be expressed by a following formula (2), and

[Formula 2]

$$Wp(x) = -\left[-A\exp\left(-\frac{x}{\lambda}\right) + B\right] + W \quad (2)$$

(symbols $A$, $B$, $\lambda$ being constants)

the width $W_n(x)$ at the predetermined depth position of the n-type column region be expressed by a following formula (3).

[Formula 3]

$$Wn(x) = \left[-A\exp\left(-\frac{x}{\lambda}\right) + B\right] + W \quad (3)$$

(symbols $A$, $B$, $\lambda$ being constants)

[4] According to the MOSFET of the present invention, it is preferable that in a graph where a depth x at a predetermined depth position of the super junction structure is taken on an axis of abscissas and average density $N_a(x)$ of a negative charge at the predetermined depth position of the p-type column region or average density $N_d(x)$ of a positive charge at the predetermined depth position of the n-type column region when the super junction structure is depleted by turning off the MOSFET is taken on an axis of ordinates, the average density $N_a(x)$ of a negative charge at the predetermined depth position of the p-type column region when the super junction structure is depleted by turning off the MOSFET be expressed by a following formula (4), and

[Formula 4]

$$Na(x) = -\left[-A\exp\left(-\frac{x}{\lambda}\right) + B\right] + N \quad (4)$$

(symbols $A$, $B$, $\lambda$ being constants)

the average density $N_d(x)$ of the positive charge at the predetermined depth position of the n-type column region when the super junction structure is depleted by turning off the MOSFET be expressed by a following formula (5).

[Formula 5]

$$Nd(x) = \left[-A\exp\left(-\frac{x}{\lambda}\right) + B\right] + N \quad (5)$$

(symbols $A$, $B$, $\lambda$ being constants)

[5] According to the MOSFET of the present invention, it is preferable that in the case that in the state where the total amount of dopant in the n-type column region differs from the total amount of dopant in the p-type column region is brought about, using the surface of the super junction structure on the first main surface side as the reference, in the state where the total amount of dopant in the n-type column region differs from the total amount of dopant in the p-type column region, assuming the average positive charge density at the deepest depth position $X_0'$ of the surface of the depletion layer on the first main surface side when the depletion layer extends most in the super junction structure by turning off the MOSFET as $\rho(X_0')$, and assuming the reference average positive charge density at the deepest depth position $X_0$ of the depletion layer on the first main surface side when the depletion layer extends most in the super junction structure by turning off the reference MOSFET as $\rho_0(X_0)$, a relationship of $\rho_0(X_0) > \rho(X_0')$ be satisfied.

[6] According to the MOSFET of the present invention, it is preferable that in the case that in the state where the total amount of dopant in the n-type column region differs from the total amount of dopant in the p-type column region is brought about, using the surface of the super junction structure on the first main surface side as the reference, in the state where the total amount of dopant in the n-type column region differs from the total amount of dopant in the p-type column region, assuming the depth position where the average positive charge density $\rho(x)$ becomes 0 as $X_m'$, and assuming the depth of the surface of the depletion layer on the second main surface side at a shallowest depth position when the depletion layer extends most in the super junction structure by turning off the MOSFET as $X_1'$, assuming the depth position where the reference average positive charge density $\rho_0(x)$ becomes 0 as $X_m$, and assuming the shallowest depth position of the surface of the depletion layer on the second main surface side when the depletion layer extends most in the super junction structure by turning off the reference MOSFET as $X_1$, a relationship of $|X_m - X_m'| < |X_1 - X_1'|$ be satisfied.

[7] According to the MOSFET of the present invention, it is preferable that in the case that in the state where the total amount of dopant in the n-type column region differs from the total amount of dopant in the p-type column region is brought about, using the surface of the super junction structure on the first main surface side as the reference, in the state where the total amount of dopant in the n-type column region differs from the total amount of dopant in the p-type column region, assuming the average positive charge density at a depth $X_1'$ of the surface of the depletion layer on the second main surface side at the shallowest depth position when the depletion layer extends most in the super junction structure by turning off the MOSFET as $\rho(X_1')$, and assuming the reference average positive charge density at the shallowest depth position $X_1$ of the surface of the depletion layer on the second main surface side when the depletion layer extends most in the super junction structure by turning off the reference MOSFET as $\rho_0(X_1)$, a relationship of $\rho_0(X_1) < \rho(X_1')$ be satisfied.

[8] According to the MOSFET of the present invention, it is preferable that in a case where the total amount of dopant in the p-type column region is larger than the total amount of dopant in the n-type column region, in a graph where a difference between the total amount of dopant in the n-type column region and the total amount of dopant in the p-type column region is taken on an axis of abscissas, and a depth $X_1$ of a surface of the depletion layer on the second main surface side at a shallowest depth position when the depletion layer extends most in the super junction structure by turning off the MOSFET using the surface of the super junction structure on the first main surface side as a reference is taken on an axis of ordinates, a curve which expresses the depth $X_1$ be converged to a predetermined value when a difference between the total amount of dopant in the n-type column region and the total amount of dopant in the p-type column region is increased.

[9] According to the MOSFET of the present invention, it is preferable that in the state where the total amount of dopant in the n-type column region differs from the total amount of dopant in the p-type column region, using a deepest depth position of a surface of a depletion layer on the first main surface side when the depletion layer extends most in the super junction structure by turning off the MOSFET as a reference, assuming a depth of a surface of the depletion layer on the second main surface side at a shallowest depth position when the depletion layer extends most in the super junction structure by turning off the MOSFET as a', and assuming a depth of a surface of the depletion layer on the second main surface side at a shallowest depth position when the depletion layer extends most in the super junction structure by turning off the reference MOSFET as a, an area of a region surrounded by a curve which expresses the average positive charge density $\rho(x)$, a straight line when x=a', and an x axis be set equal to an area of a region surrounded by a curve which expresses the reference average positive charge density $\rho_0(x)$, a straight line when x=a, and an x axis.

[10] According to the MOSFET of the present invention, it is preferable that using a deepest depth position of a surface of a depletion layer on the first main surface side when the depletion layer extends most in the super junction structure by turning off the MOSFET as a reference, assuming a shallowest depth position of a surface of the depletion layer on the second main surface side when the depletion layer extends most in the super junction structure by turning off the MOSFET as a, and assuming a depth of a depth position where the average positive charge density ρ(x) becomes 0 in the super junction structure as d, a relationship of 0<d≤a/2 be satisfied.

[11] According to the MOSFET of the present invention, it is preferable that the semiconductor base substrate further include a p-type base region formed on the n-type column region and the p-type base region, and an n-type source region formed on a surface of the base region, the MOSFET further comprise, in a region where the n-type column region is positioned as viewed in a plan view, a trench formed so as to extend from a surface of the first main surface of the semiconductor base substrate to a depth position deeper than a deepest position of the base region and a portion of the source region is exposed on an inner peripheral surface of the trench, the gate insulation film be formed on the inner peripheral surface of the trench, and the gate electrode be embedded in the trench by way of the gate insulation film.

[12] According to the MOSFET of the present invention, it is preferable that the semiconductor base substrate further include: a base region formed on a surface of the first main surface of the semiconductor base substrate, a whole surface of the p-type column region, and a portion of a surface of the n-type column region; an n-type surface high concentration region formed on a surface of the first main surface of the semiconductor base substrate and a surface of the n-type column region such that the n-type surface high concentration region is disposed adjacently to the base region; and an n-type source region formed on a surface of the base region, and the gate electrode be formed on a surface of the base region sandwiched between the source region and the n-type surface high concentration region by way of the gate insulation film.

[13] According to the MOSFET of the present invention, it is preferable that using a deepest depth position of a surface of a depletion layer on the first main surface side when the depletion layer extends most in the super junction structure by turning off the MOSFET as a reference, assuming an axis along a depth direction as an x axis, an x coordinate at a depth position of a lowermost surface of the base region as −t, an x coordinate at a depth position of a lowermost portion of the p-type column region as b, and an x coordinate at a depth position where the average positive charge density ρ(x) becomes 0 as d, a relationship of 0<t+d≤(t+b)/2 be satisfied.

[14] According to the present invention, there is provided a power conversion circuit which includes at least:

a reactor;

a power source which supplies an electric current to the reactor;

the MOSFET according to any one of claims 1 to 13 for controlling an electric current supplied from the power source to the reactor; and a rectifier element which performs a rectifying operation of the electric current supplied from the power source to the reactor or an electric current from the reactor.

[15] According to the power conversion circuit of the present invention, it is preferable that the rectifier element be a fast recovery diode.

[16] According to the power conversion circuit of the present invention, it is preferable that the rectifier element be a built-in diode of the MOSFET.

[17] According to the power conversion circuit of the present invention, it is preferable that the rectifier element be a silicon-carbide Schottky barrier diode.

Advantageous Effects of the Present Invention

According to the MOSFET of the present invention, the relationship of $|X_0-X_0'|<|X_m-X_m'|$ is satisfied and hence, even when an irregularity occurs in a charge balance so that the MOSFET becomes n-type dopant rich, when the MOSFET is turned off, deviation of average positive charge density ρ(x) on a first main surface side (gate electrode side) is small so that a region where an electric field is high minimally approaches the gate electrode. Accordingly, an electric field in the n-type column region around the gate electrode becomes minimally high so that a change in potential of the n-type column region around the gate becomes small easily. As a result, an irregularity minimally occurs in switching characteristics when the MOSFET is turned off.

According to the MOSFET and the power conversion circuit of the present invention, the relationship of $|X_0-X_0'|<|X_m-X_m'|$ is satisfied and hence, even when an irregularity occurs in a charge balance, an irregularity in a switching loss when the MOSFET is turned off minimally becomes large. Accordingly, it is possible to prevent the occurrence of a defect in an operation of the power conversion circuit (particularly, a circuit largely affected by a switching loss at the time of turning off the MOSFET such as a current critical type PFC or a current discontinuous type PFC) (see FIGS. 13A and 13B).

Further, the MOSFET according to the present invention includes the semiconductor base substrate where the super junction structure is formed of the n-type column region and the p-type column region. Accordingly, in the same manner as the conventional MOSFET 900, the MOSFET becomes a switching element having a low ON resistance and a high withstand voltage.

In the MOSFET according to the present invention, the average positive charge density ρ(0) when x=0 takes a negative value, and the average positive charge density ρ(a) when x=a takes a positive value. Accordingly, at a depth position in the vicinity of a bottom portion of the p-type column region, a total amount of dopant in the p-type column region becomes smaller than a total amount of dopant in the n-type column region (becoming n-type dopant rich). With such a configuration, a depletion layer generated from the p-type column region when the MOSFET is turned off minimally extends toward a second main surface side. Accordingly, it is possible to provide a MOSFET where a breakdown in a reach through mode minimally occurs so that a withstand voltage is minimally lowered.

BRIEF DESCRIPTION OF DRAWINGS

In FIG. 3, the illustration of constitutional elements other than the super junction structure 117 (n-type column regions 114 and p-type column regions 116) is omitted. FIG. 3 is a view corresponding to a region surrounded by a chain line shown in FIG. 2.

In FIG. 4, the illustration of constitutional elements other than the super junction structure 117 (n-type column regions 114 and p-type column regions 116) and a buffer layer 113 is omitted (the same definition being applied to FIG. 5B). With respect to two axes on a left side of FIG. 4, an X axis on the left side is an axis showing a depth when a depth position of a surface of the super junction structure on a first main surface side (a depth position of a lowermost surface of a base region) is used as a reference (X=0). A position $X_0$ on the X coordinate is a deepest depth position of a surface of a depletion layer on a first main surface side when the depletion layer extends most in the super junction structure by turning off the MOSFET. A position $X_1$ on the X coordinate is a shallowest depth position of a surface of a depletion layer on a second main surface side when the depletion layer extends most in the super junction structure by turning off the MOSFET. A position $X_2$ on the X coordinate is a depth position of a lowermost portion of the p-type column region 116 (the same definition being applied to FIGS. 5A and 5B, FIGS. 10A and 10B and FIGS. 11A and 11B). With respect to two axes on the left side of FIG. 4, an x axis on a right side is an axis showing a depth x when a deepest depth position of a surface of a depletion layer on the first main surface side when the depletion layer extends most in the super junction structure by turning off the MOSFET is used as a reference (x=0). A position –t on the x coordinate is a depth position of a lowermost surface of a base region 118, a position b on the x coordinate is a depth position of a lowermost portion of a p-type column region 116, and a position a on the x coordinate is a shallowest depth position of a surface of a depletion layer on a second main surface side when the depletion layer extends most in the super junction structure by turning off the MOSFET (the same definition being applied to FIG. 5A to FIG. 9D).

FIG. 5A is a cross-sectional view showing the MOSFET 800 according to Comparison example 1, and FIG. 5B is a schematic view for explaining average positive charge density $\rho(x)$ at a predetermined depth position of the super junction structure when the super junction structure is depleted by turning off the MOSFET 800 according to Comparison example 1.

FIG. 6A is a graph expressing a change in width $W_n(x)$ at the predetermined depth position of the n-type column region and a change in width $W_p(x)$ at the predetermined depth position of the p-type column region with respect to the depth x, FIG. 6B is a graph expressing a change in average density $N_d(x)$ of a positive charge at the predetermined depth position of the n-type column region and a change in average density $N_a(x)$ of a negative charge at the predetermined depth position of the p-type column region with respect to the depth x, FIG. 6C is a graph expressing a change in average positive charge density $\rho(x)$ at the predetermined depth position of the super junction structure with respect to the depth x, and FIG. 6D is a graph expressing a change in an electric field $E(x)$ at the predetermined depth position of the super junction structure with respect to the depth x (the same definition being applied to FIGS. 7A to 7D). In FIG. 6A to FIG. 6D, a deepest depth position of a surface of a depletion layer on the first main surface side when the depletion layer extends most in the super junction structure by turning off the MOSFET is used as a reference (x=0) (the same definition being applied to FIG. 7A to FIG. 9D).

FIG. 8A is a graph expressing a change in width $W_n(x)$ at the predetermined depth position of the n-type column region and a change in width $W_p(x)$ at the predetermined depth position of the p-type column region with respect to the depth x, FIG. 8B is a graph expressing a change in average density $N_d(x)$ of a positive charge at the predetermined depth position of the n-type column region and a change in average density $N_a(x)$ of a negative charge at the predetermined depth position of the p-type column region with respect to the depth x, FIG. 8C is a graph expressing a change in average positive charge density $\rho(x)$ at the predetermined depth position of the super junction structure with respect to the depth x, and FIG. 8D is a graph expressing a change in an electric field $E(x)$ at the predetermined depth position of the super junction structure with respect to the depth x (the same definition being applied to FIG. 9A to FIG. 9D). A position –t' on the x coordinate is a depth position of a lowermost surface of a base region 118, a position b' on the x coordinate is a depth position of a lowermost portion of a p-type column region 116, and a position a' on the x coordinate is a shallowest depth position of a surface of a depletion layer on a second main surface side when the depletion layer extends most in the super junction structure by turning off the MOSFET (the same definition being applied to FIG. 9A to FIG. 9D). Further, a relationship of t'+b'=t+b is satisfied (the same definition being applied to FIG. 9A to FIG. 9D).

FIG. 10A is a graph expressing a change in reference average positive charge density $\rho_0(X)$ and a change in average positive charge density $\rho(X)$ with respect to the depth X in the reference MOSFET and the n-type dopant rich MOSFET of Comparison example 1. FIG. 10B is a graph expressing respective changes in the electric fields $E_0(X)$, $E(X)$ with respect to the depth X in the reference MOSFET and the n-type dopant rich MOSFET of Comparison example 1.

FIG. 11A is a graph expressing a change in reference average positive charge density $\rho_0(X)$ and a change in average positive charge density $\rho(X)$ with respect to the depth X in the reference MOSFET and the n-type dopant rich MOSFET of Embodiment 1. FIG. 11B is a graph expressing respective changes in the electric fields $E_0(X)$, $E(X)$ with respect to the depth X in the reference MOSFET and the n-type dopant rich MOSFET of Embodiment 1.

FIG. 13A is the graph showing the relationship established in the MOSFET 800 according to Comparison example 1 between a charge balance and a switching loss Eoff when the MOSFET 800 is turned off, and between a charge balance and a switching loss Eon when the MOSFET 800 is turned on and FIG. 13B is the graph showing the relationship established in the MOSFET 100 according to Embodiment 1 between a charge balance and a switching loss Eoff when the MOSFET 100 is turned off, and between a charge balance and a switching loss Eon when the MOSFET 100 is turned on.

In FIG. 14, "p-type dopant rich" means that a total amount of dopant in the p-type column region is larger than a total amount of dopant in the n-type column region by 10%, "n-type dopant rich" means that a total amount of dopant in the n-type column region is larger than a total amount of dopant in the p-type column region by 10%, and "Just" means that a total amount of dopant in the n-type column region and a total amount of dopant in the p-type column region are equal (the same definition being applied to FIG. 15). A power source voltage is 300V (the same definition being applied to FIG. 15).

In FIG. 16, the illustration of a source region is omitted (the same definition being applied to FIG. 17).

FIG. 17 shows the mode of the depletion layer at the same timing as FIG. 16.

FIG. 18A is the cross-sectional view showing the MOSFET 700 according to Comparison example 2, FIG. 18B is the cross-sectional view showing the MOSFET 100A according to the present invention example. FIG. 18A and FIG. 18B are schematic views and do not strictly reflect sizes and shapes of the structures used in obtaining simulation results shown in FIG. 19A and FIG. 19B.

FIG. 19A is the view showing the simulation result of equal potential lines when the MOSFET is turned off in the MOSFET 700 according to Comparison example 2, and FIG. 19B is the view showing the simulation result of equal potential lines when the MOSFET is turned off in the MOSFET 100A according to the present invention example. FIG. 19A is a view corresponding to a region surrounded by a chain line shown in FIG. 18A, and FIG. 19B is a view corresponding to a region surrounded by a chain line shown in FIG. 18B. In FIG. 19A and FIG. 19B, a bold black solid line indicates a boundary between an n-type column region and a p-type column region, a black fine solid line indicates equal potential lines drawn for every 3V, and a white solid line indicates a boundary between a region where an amount of a carrier becomes 5% compared to the amount of the carrier at the usual time and other regions.

FIG. 20A is a cross-sectional view showing the MOSFET 102 according to Embodiment 2, FIG. 20B is a graph expressing changes when a super junction structure 117 is depleted by turning off the MOSFET, that is, a change in width $W_n(x)$ at a predetermined depth position of an n-type column region 114 with respect to a depth x and a change in width $W_p(x)$ at a predetermined depth position of a p-type column region 116 with respect to the depth x, and FIG. 20C is a graph expressing a change in average density $N_d(x)$ of a positive charge at a predetermined depth position of the n-type column region with respect to the depth x, and a change in average density $N_a(x)$ of a negative charge at a predetermined depth position of the p-type column region with respect to the depth x.

DESCRIPTION OF EMBODIMENTS

Figure 1:
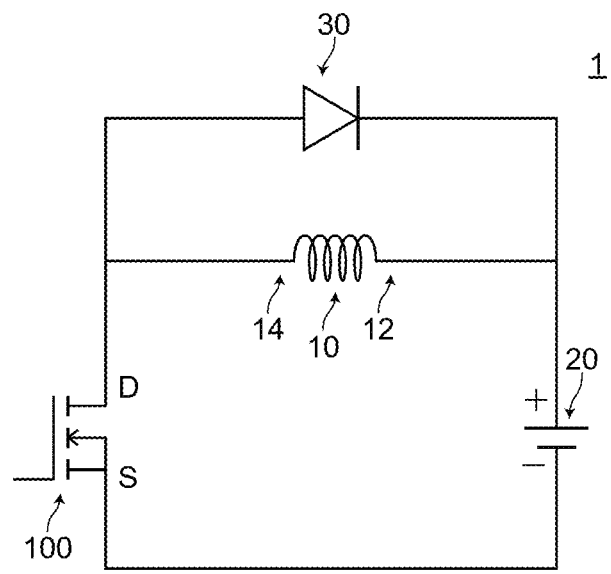
FIG. 1 is a circuit diagram showing a power conversion circuit 1 according to Embodiment 1.

Hereinafter, a MOSFET and a power conversion circuit according to the present invention are described in accordance with Embodiments shown in the drawings. The respective drawings are schematic drawings, and do not always strictly reflect actual sizes of the MOSFET and the power conversion circuit.

Embodiment 1

1. Structure and Operation of Power Conversion Circuit 1 According to Embodiment 1

A power conversion circuit 1 according to Embodiment 1 is a chopper circuit which is a constitutional element such as a DC-DC converter or an inverter. The power conversion circuit 1 according to Embodiment 1 includes, as shown in FIG. 1, a reactor 10, a power source 20, a MOSFET 100 according to Embodiment 1, and a rectifier element 30.

The reactor 10 is a passive element which can store energy in a magnetic field generated by an electric current which flows through the reactor 10.

The power source 20 is a DC power source which supplies an electric current to the reactor 10. The MOSFET 100 controls an electric current supplied from the power source 20 to the reactor 10. To be more specific, the MOSFET 100 is switched to assume an ON state in response to a clock signal applied from a drive circuit (not shown in the drawing) to a gate electrode of the MOSFET 100, and makes the reactor 10 and a negative pole of the power source 20 electrically conductive with each other. The specific structure of the MOSFET 100 is described later.

The rectifier element 30 is a fast recovery diode which performs a rectifying operation of an electric current supplied from the power source 20 to the reactor 10. To be more specific, the rectifier element 30 is a lifetime-controlled PIN diode.

A positive pole (+) of the power source 20 is electrically connected to one end 12 of the reactor 10 and a cathode electrode of the rectifier element 30, and a negative pole (−) of the power source 20 is electrically connected to a source electrode of the MOSFET 100. A drain electrode of the MOSFET 100 is electrically connected to the other end 14 of the reactor 10 and an anode electrode of the rectifier element 30.

In such a power conversion circuit 1, when the MOSFET 100 is in an ON state, an electric current path from a positive pole (+) of the power source 20 to the negative pole (−) of the power source 20 through the reactor 10 and the MOSFET 100 is formed, and an electric current flows through the electric current path. In this case, electric energy of the power source 20 is stored in the reactor 10.

When the MOSFET 100 is turned off, an electric current which flows through the electric current path from the positive pole (+) of the power source 20 to the negative pole (−) of the power source 20 through the reactor 10 and the MOSFET 100 is decreased and becomes 0 soon. On the other hand, the reactor 10 generates an electromotive force in a direction in which a change in an electric current is obstructed (electric energy stored in the reactor 10 is discharged) due to a self induction effect. An electric current generated due to an electromotive force of the reactor 10 flows to the rectifier element 30, and a forward electric current flows in the rectifier element 30.

A sum of an amount of an electric current which flows through the MOSFET 100 and an amount of an electric current which flows through the rectifier element 30 is equal to an amount of an electric current which flows through the reactor 10. A switching period of the MOSFET 100 is short (possibly 100 nsec at maximum) and hence, an amount of an electric current which flows through the reactor 10 minimally changes during such a period. Accordingly, a sum of an amount of an electric current which flows through the MOSFET 100 and an amount of an electric current which flows through the rectifier element 30 minimally changes in either case, that is, an ON state, a turn-off period or an OFF state.

In such a power conversion circuit 1, a case is considered where a MOSFET where side walls of the n-type column region 914 are formed in a tapered shape narrowed toward a first main surface side, and side walls of the p-type column region 916 are formed in a tapered shape with a narrow bottom (for example, a conventional MOSFET 900) is used as the MOSFET. In this case, when an irregularity exists in a charge balance around the gate, there arises a drawback that an irregularity in switching characteristics when the MOSFET is turned off is liable to occur (see FIG. 14 described later).

Particularly, to consider a case where a circuit which is largely affected by a switching loss at the time of turning off the MOSFET such as a current critical type PFC or a current discontinuous type PFC is used as a power conversion circuit, when a MOSFET where side walls of the n-type column region are formed in a tapered shape narrowed toward a first main surface side, and side walls of the p-type column region are formed in a tapered shape with a narrow bottom is used as the MOSFET (for example, when the conventional MOSFET 900 is used), there arises a following drawback. That is, as indicated by Eoff shown in FIG. 13A described later, when an irregularity occurs in a charge balance when the MOSFET is turned off, an irregularity in a switching loss becomes large and hence, a defect may occur in an operation of the power conversion circuit.

Accordingly, in the present invention, as the MOSFET, the MOSFET 100 according to Embodiment 1 having the following structure is used.

2. Structure of MOSFET 100 According to Embodiment 1

Figure 2:
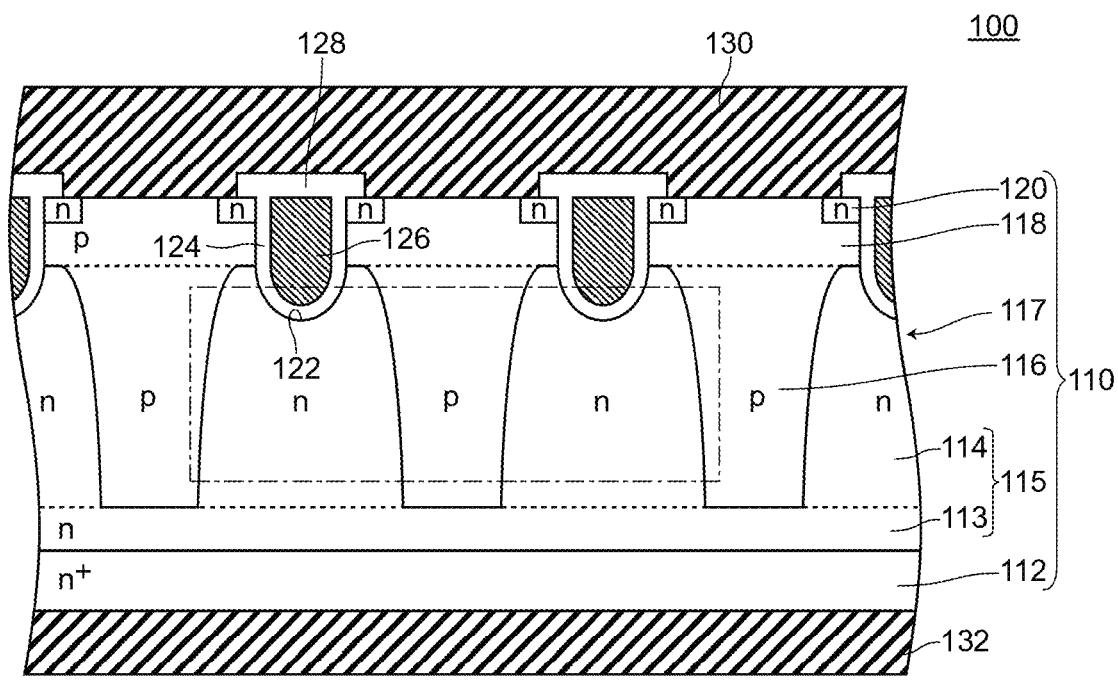
FIG. 2 is a cross-sectional view showing a MOSFET 100 according to Embodiment 1.

As shown in FIG. 2, the MOSFET 100 according to Embodiment 1 is a trench-gate-type MOSFET which includes a semiconductor base substrate 110, a trench 122, a gate electrode 126, an interlayer insulation film 128, a source electrode 130, and a drain electrode 132. A drain-source withstand voltage of the MOSFET 100 is 300V or more, for example, 600V.

The semiconductor base substrate 110 has an n-type low-resistance semiconductor layer 112, an n-type buffer layer 113 formed on the low-resistance semiconductor layer 112 and having a lower dopant concentration than dopant concentration in the low-resistance semiconductor layer 112, a super junction structure 117 formed of n-type column regions 114 and p-type column regions 116 which are formed on the buffer layer 113 such that the n-type column region 114 and the p-type column region 116 are alternately arranged along a horizontal direction, a p-type base region 118 formed on surfaces of the n-type column regions 114 and surfaces of the p-type column regions 116, and n-type source regions 120 formed on a surface of the base region 118. The buffer layer 113 and the n-type column regions 114 are integrally formed with each other, and the buffer layer 113 and the n-type column regions 114 form an n-type semiconductor layer 115.

Figure 7A:
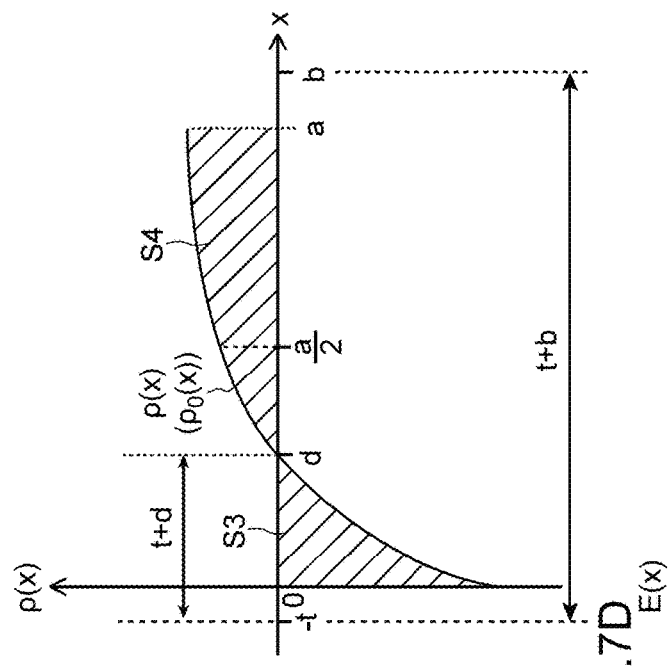
FIG. 7A to FIG. 7D are graphs expressing changes when the super junction structure 117 is depleted by turning off the MOSFET 100 (reference MOSFET) according to Embodiment 1, that is, a change in width $W_n(x)$ at a predetermined depth position of the n-type column region 114 with respect to the depth x, a change in width $W_p(x)$ at a predetermined depth position of the p-type column region 116 with respect to the depth x, a change in average density $N_d(x)$ of a positive charge at a predetermined depth position of the n-type column region 114 with respect to the depth x, a change in average density $N_a(x)$ of a negative charge at a predetermined depth position of the p-type column region 116 with respect to the depth x, and a change in average positive charge density $\rho(x)$ (reference average positive charge density $\rho_0(x)$) and an electric field $E(x)$ ($E_0(x)$) at a predetermined depth position of the super junction structure 117 with respect to the depth x.

In the n-type column region 114 and the p-type column region 116, using a deepest depth position of a surface of a depletion layer on the first main surface side when the depletion layer extends most in the super junction structure by turning off the MOSFET as a reference (x=0), in a graph where a depth x at a predetermined depth position of the super junction structure is taken on an axis of abscissas and a width $W_n(x)$ at a predetermined depth position of an n-type column region or a width $W_p(x)$ at a predetermined depth position of a p-type column region is taken on an axis of ordinates, the width $W_n(x)$ is expressed by an upward convex curve projecting in a right upward direction, and the width $W_p(x)$ is expressed by a downward convex curve projecting in a right downward direction (see FIG. 7A). That is, the n-type column region 114 has a shape of a cup with its open side down in cross section, while the p-type column region 116 has a shape of a funnel in cross section.

To be more specific, in a graph where the depth x at the predetermined depth position of the super junction structure is taken on the axis of abscissas and the width $W_n(x)$ at the predetermined depth position of the n-type column region 114 or the width $W_p(x)$ at the predetermined depth position of the p-type column region 116 is taken on the axis of ordinates, a width Wp(x) of the p-type column region is expressed by a following formula (2), and

[Formula 2]

$$Wp(x) = -\left[-A\exp\left(-\frac{x}{\lambda}\right) + B\right] + W \quad (2)$$

(symbols $A$, $B$, $\lambda$ being constants)

a width Wn(x) of the n-type column region is expressed by a following formula (3).

[Formula 3]

$$Wn(x) = \left[-A\exp\left(-\frac{x}{\lambda}\right) + B\right] + W \quad (3)$$

(symbols $A$, $B$, $\lambda$ being constants)

Figure 3:
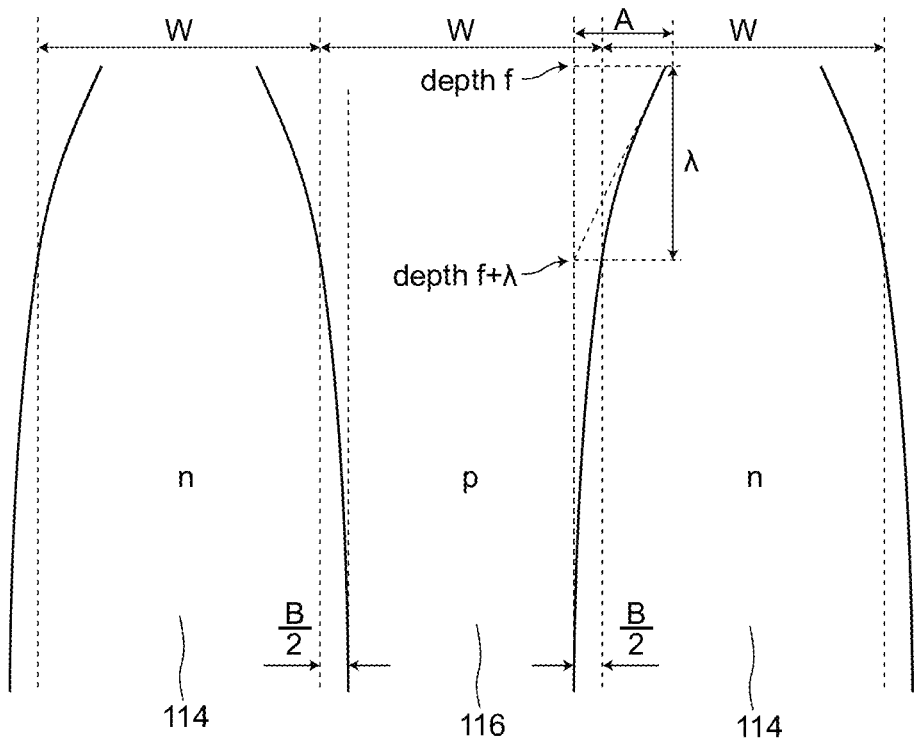
FIG. 3 is a schematic view for explaining constants A, B and λ in a formula (2) and a formula (3).

Meanings of the constants W, A, B and $\lambda$ in the above-mentioned formula (2) and formula (3) are described hereinafter (see FIG. 3).

W indicates a positive constant which satisfies a formula of $W_n(x)+W_p(x)=2W$. In other words, W indicates an average pitch width (average column width) of the n-type column regions 114 and the p-type column regions 116.

The constant B indicates a difference between a width of the p-type column region 116 and the average column width W when a depth x is set to an infinite value. Accordingly, the width of the p-type column region 116 becomes narrower than the average column width W by B when the depth x is set to an infinite value. When a boundary line is drawn between the n-type column region 114 and the p-type column region 116 and divergence between the boundary line and a line of the average column width W is observed, a divergence width on one side becomes B/2. Accordingly, a total divergence width becomes B by adding the divergence widths on both sides. In this case, the n-type column region 114 is larger than the average column width W by B. Further, although naturally induced from the above-mentioned description, assuming a case where a depth x becomes an infinite value, difference between the p-type column region 116 and the n-type column region 114 becomes 2B.

The constant A is a coefficient of an exponential $e^x$, and indicates an amount of width by which a width of the p-type column region 116 where the width of the p-type column region 116 when x=0 is set larger than the width of the p-type column region 116 when the depth is set to an infinite value.

The constant $\lambda$ is also a scale for indicating a speed of attenuation of the exponential. In the embodiment 1, the constant $\lambda$ indicates a scale of a depth when a width of the p-type column region 116 gradually approaches a width W-B of the p-type column region 116 when the depth is set to an infinite value. In the same manner, the constant $\lambda$ indicates a scale of depth when a width of the n-type column region 114 gradually approaches a width W+B of the n-type column region 114 when the depth is set to an infinite value. As shown in FIG. 3, a tangent at an arbitrary depth f is drawn on a boundary line between the n-type column region 114 and the p-type column region 116, and an intersecting point between the tangent and asymptotic line is obtained. In this case, a depth of the intersecting point never fails to become f+$\lambda$. Further, to compare a divergence width between the above-mentioned boundary line and the asymptotic line at a depth a and a divergence width between the above-mentioned boundary line and the asymptotic line at a depth f+$\lambda$, the divergence width of the latter becomes 1/e of the divergence width of the former (approximately 1/2.7).

Both of dopant concentration in the n-type column region 114 and dopant concentration in the p-type column region 116 are respectively set to a fixed value regardless of depth.

All of the n-type column regions 114, the p-type column regions 116, the source regions 120, the trenches 122 and the gate electrodes 126 are formed in a stripe shape as viewed in a plan view.

A thickness of the low-resistance semiconductor layer 112 falls within a range of 100 μm to 400 μm, for example, and dopant concentration in the low-resistance semiconductor layer 112 falls within a range of $1 \times 10^{19}$ cm$^{-3}$ to $1 \times 10^{20}$ cm$^{-3}$, for example. A thickness of the n-type semiconductor layer 115 falls within a range of 5 μm to 120 μm, for example. Dopant concentration in the n-type semiconductor layer 115 falls within a range of $5 \times 10^{13}$ cm$^{-3}$ to $1 \times 10^{16}$ cm$^{-3}$, for example. Dopant concentration in the p-type column region 116 falls within a range of $5 \times 10^{13}$ cm$^{-3}$ to $1 \times 10^{16}$ cm$^{-3}$, for example. Using a depth position of the first main surface of the semiconductor base substrate 110 as a reference, a depth position of a deepest portion of the base region 118 falls within a range of 0.5 μm to 4.0 μm, for example, and dopant concentration in the base region 118 falls within a range of $5 \times 10^{16}$ cm$^{-3}$ to $1 \times 10^{18}$ cm$^{-3}$, for example. A depth position of a deepest portion of the source region 120 falls within a range of 0.1 μm to 0.4 μm, for example, and dopant concentration in the source region 120 falls within a range of $5 \times 10^{19}$ cm$^{-3}$ to $2 \times 10^{20}$ cm$^{-3}$, for example.

The trench 122 is formed in a region where the n-type column region 114 is positioned as viewed in a plan view such that the trench 122 reaches a depth position deeper than the deepest portion of the base region 118 from a surface of the first main surface of the semiconductor base substrate 110 and a portion of the source region 120 is exposed on an inner peripheral surface of the trench 122. A depth of the trench 122 is 5 μm, for example.

The gate electrode 126 is embedded in the inside of the trench 122 by way of a gate insulation film 124 formed on the inner peripheral surface of the trench 122. The gate insulation film 124 is formed of a silicon dioxide film formed by a thermal oxidation method and having a thickness of 100 nm, for example. The gate electrode 126 is made of low-resistance polysilicon formed by a CVD method or an ion implantation method.

The interlayer insulation film 128 is formed so as to cover a portion of the source region 120, the gate insulation film 124 and the gate electrode 126. The interlayer insulation film 128 is formed of a PSG film formed by a CVD method and having a thickness of 1000 nm, for example.

The source electrode 130 is formed so as to cover the base region 118, a portion of the source region 120, and the interlayer insulation film 128. The source electrode 130 is electrically connected with the source region 120. The drain electrode 132 is formed on a surface of the low-resistance semiconductor layer 112. The source electrode 130 is made of aluminum-based metal (Al—Cu-based alloy, for example) formed by a sputtering method and having a thickness of 4 μm, for example. The drain electrode 132 is formed of a multi-layered metal film such as a Ti—Ni—Au film. A total thickness of the multi-layered metal film is 0.5 μm, for example.

3. Average Positive Charge Density ρ(x) at Predetermined Depth Position of Super Junction Structure To evaluate a charge amount of a positive charge in the n-type column region 114 and a charge amount of a negative charge in the p-type column region 116 when the MOSFET is turned off, average positive charge density ρ(x) at a predetermined depth position of the super junction structure when the super junction structure is depleted by turning off the MOSFET (hereinafter, simply referred to as average positive charge density ρ(x)) is used.

Using a deepest depth position of a surface of a depletion layer on the first main surface side when the depletion layer extends most in the super junction structure by turning off the MOSFET as a reference, assuming a depth at a predetermined depth position of the super junction structure 117 (hereinafter, simply referred to as a depth x) as x, average positive charge density ρ(x) is expressed by a following formula (1).

[Formula 1]

$$\rho(x) = \frac{q}{2W}[W_n(x) \cdot N_d(x) - W_p(x) \cdot N_a(x)] \quad (1)$$

Figure 4:
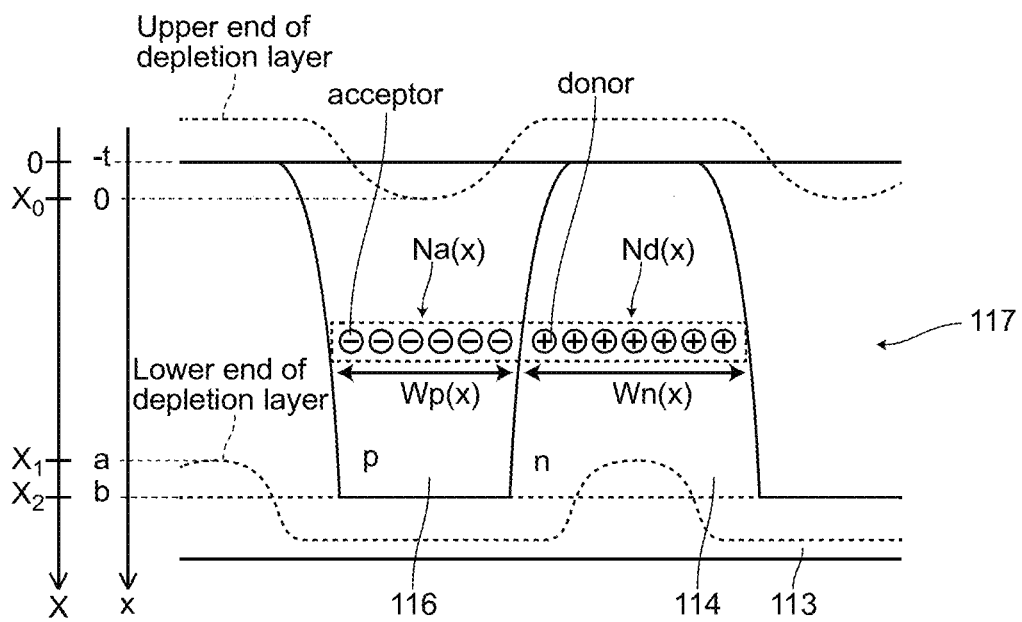
FIG. 4 is a schematic view for explaining average positive charge density $\rho(x)$ at a predetermined depth position of a super junction structure when the super junction structure is depleted by turning off the MOSFET 100 according to Embodiment 1.

(In the formula (1), $W_n(x)$ indicates a width of the n-type column region 114 at the predetermined depth position, $N_d(x)$ indicates average density of a positive charge at the predetermined depth position of the n-type column region 114 when the super junction structure 117 is depleted by turning off the MOSFET, $W_p(x)$ indicates a width of the p-type column region at the predetermined depth position, $N_a(x)$ indicates average density of a negative charge at the predetermined depth position of the p-type column region 116 when the super junction structure 117 is depleted by turning off the MOSFET, q indicates an elementary charge, and W indicates a positive constant which satisfies $W_n(x) + W_p(x) = 2W$. See FIG. 4.)

In this embodiment, assuming that dopant concentration in the n-type column region 114 and dopant concentration in the p-type column region 116 are respectively set to a fixed value regardless of depth, $N_a(x)$ and $N_d(x)$ become $N_0$ ($N_a(x) = N_d(x) = N_0$) and hence, average positive charge density ρ(x) is expressed by a following formula (6).

[Formula 6]

$$\rho(x) = \frac{qN_0}{2W}[W_n(x) - W_p(x)] \quad (6)$$

An electric field E(x) at a predetermined depth position of the super junction structure 117 (hereinafter, simply referred to as an electric field E(x)) when the super junction structure 117 is depleted by turning off the MOSFET expresses an electric field generated by a positive charge (donor) at a predetermined depth position of the n-type column region 114 and an electric field generated by a negative charge (acceptor) at a predetermined depth position of the p-type column region 116 when the super junction structure 117 is depleted by turning off the MOSFET, and is expressed by a following formula (7)

[Formula 7]

$$E(x) = \int_0^x \frac{\rho(x)}{\varepsilon} dx \quad (7)$$

(In the formula (7), ε: dielectric constant of a material (for example, silicon) of a semiconductor base substrate)

To describe average positive charge density ρ(x) of the MOSFET 100 according to Embodiment 1, a MOSFET 800 according to Comparison example 1 is described first.

Figure 5A:
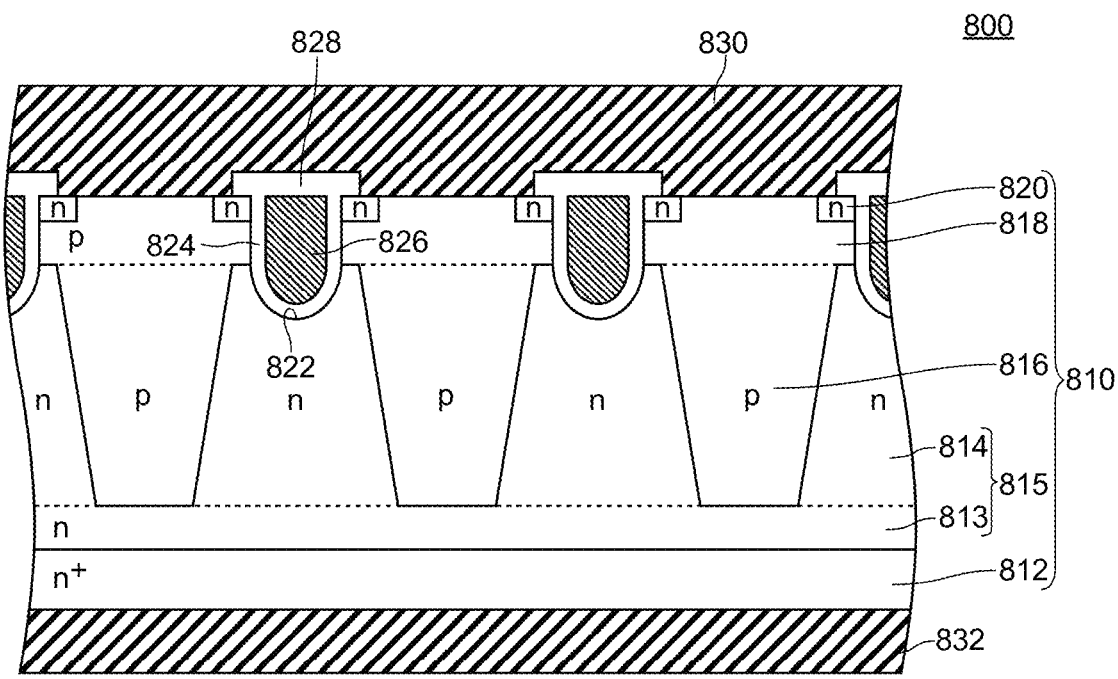
FIG. 5A and FIG. 5B are views for explaining a MOSFET 800 according to Comparison example 1.
Figure 5B:
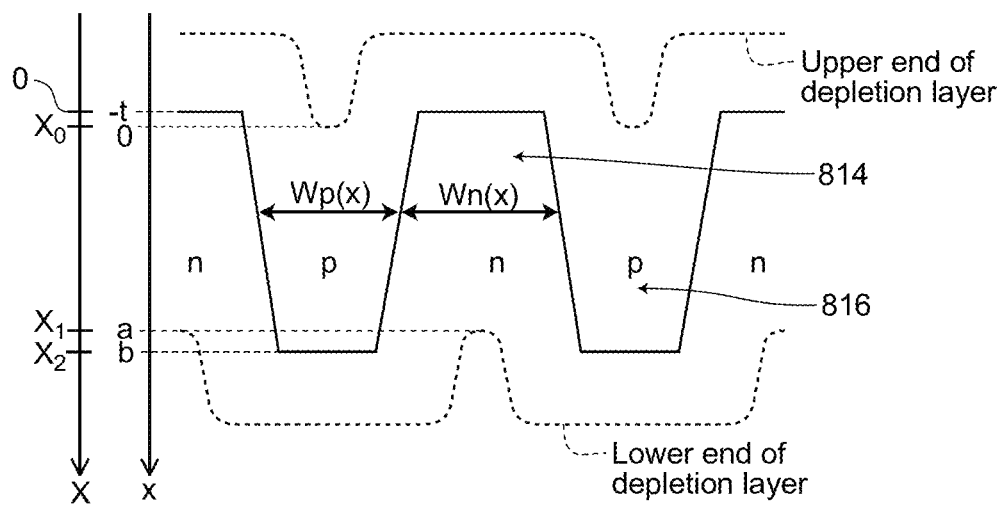

The MOSFET 800 according to Comparison example 1 (see FIG. 5A and FIG. 5B) basically has substantially the same configuration as the MOSFET 100 according to Embodiment 1. However, in the same manner as the conventional MOSFET 900, the MOSFET 800 according to Comparison example 1 differs from the MOSFET 100 according to Embodiment 1 with respect to a point that side walls of an n-type column region 814 are formed in a tapered shape narrowed toward a first main surface side, and side walls of a p-type column region 816 are formed in a tapered shape with a narrow bottom.

Figure 6C:
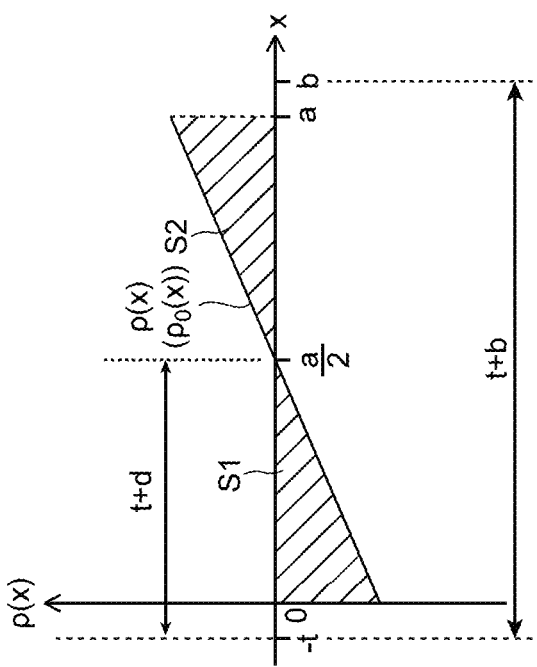
FIG. 6A to FIG. 6D are graphs expressing changes when the super junction structure is depleted by turning off the MOSFET 800 (reference MOSFET) according to Comparison example 1, that is, a change in width $W_n(x)$ at a predetermined depth position of an n-type column region with respect to a depth x, a change in width $W_p(x)$ at a predetermined depth position of a p-type column region with respect to the depth x, a change in average density $N_d(x)$ of a positive charge at a predetermined depth position of the n-type column region with respect to the depth x, a change in average density $N_a(x)$ of a negative charge at a predetermined depth position of the p-type column region with respect to the depth x, a change in average positive charge density $\rho(x)$ (reference average positive charge density $\rho_0(x)$) and an electric field $E(x)$ ($E_0(x)$) at a predetermined depth position of the super junction structure with respect to the depth x.
Figure 6D:
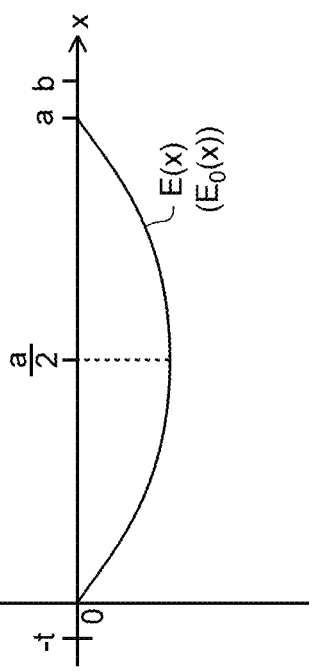
Figure 6A:
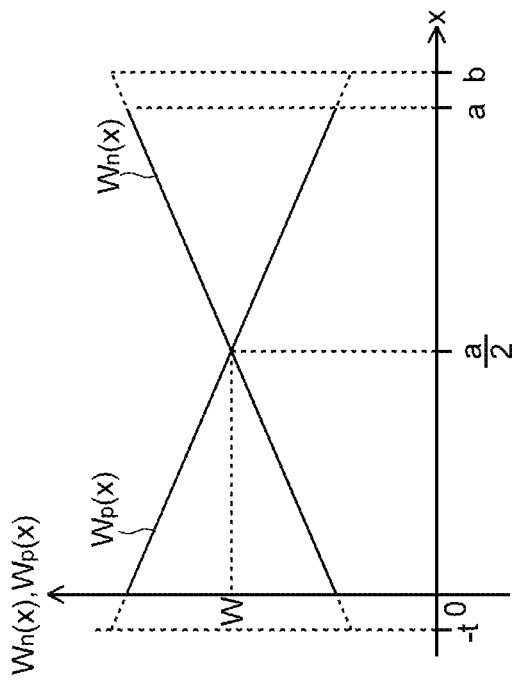

In the MOSFET 800 according to Comparison example 1, in a graph where a depth x is taken on an axis of abscissas and a width $W_n(x)$ at a predetermined depth position of the n-type column region 814 or a width $W_p(x)$ at a predetermined depth position of the p-type column region 816 is taken on an axis of ordinates, the width $W_p(x)$ is expressed by a straight line extending in a right downward direction, and the width $W_n(x)$ is expressed by a straight line extending in a right upward direction (see FIG. 6A).

Figure 6B:
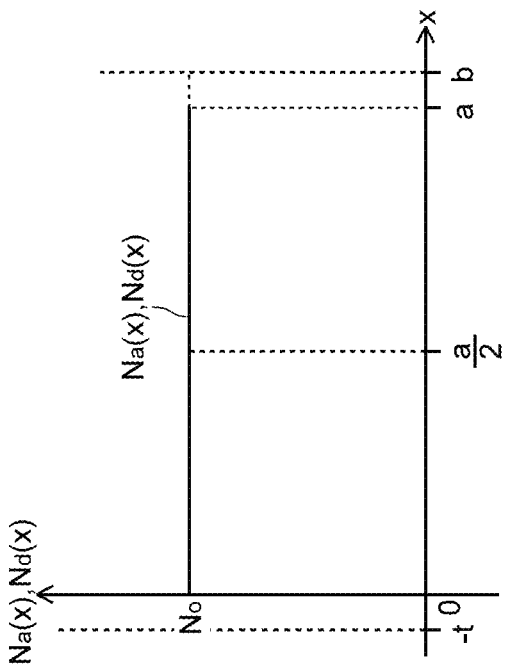

Further, in the MOSFET 800 according to Comparison example 1, in the same manner as the MOSFET 100 according to Embodiment 1, dopant concentration in the n-type column region 814 and dopant concentration in the p-type column region 816 are set to a fixed value regardless of depth (see FIG. 6B).

From the above, in the MOSFET 800 according to Comparison example 1, average positive charge density ρ(x) is expressed by a straight line extending in a right upward direction (see FIG. 6C).

To observe the straight line which expresses average positive charge density ρ(x) in detail, using a deepest depth position of a surface of a depletion layer on the first main surface side when the depletion layer extends most in the super junction structure by turning off the MOSFET as a reference, assuming an axis along a depth direction as an x axis, an x coordinate at a depth position of a lowermost surface of the base region as −t, an x coordinate at depth position of a lowermost portion of the p-type column region as b, an x coordinate at a depth position where the average positive charge density ρ(x) becomes 0 as d, and an x coordinate at a shallowest depth position of a surface of a depletion layer on a second main surface side when the depletion layer extends most in the super junction structure by turning off the MOSFET as a, the following (1) to (3) are established.

(1) The x coordinate d satisfies a relationship of d=a/2. That is, a depth d at the predetermined depth position when the average positive charge density ρ(x) becomes 0 becomes a depth half of the depth a of a surface of the depletion layer on the second main surface side at a shallowest depth position when the depletion layer extends most in the super junction structure by turning off the MOSFET (that is, a charge balance being taken at the depth position where x=a/2).

(2) A value of the average positive charge density ρ(0) when x=0 becomes a negative value, and a value of the average positive charge density ρ(a) when x=a becomes a positive value.

(3) An area S1 of a region surrounded by the straight line expressing the average positive charge density ρ(x), a straight line when x=0, and the axis of abscissas (x axis) is equal to an area S2 of a region surrounded by the straight line expressing the average positive charge density ρ(x), a straight line when x=a and the axis of abscissas (x axis).

Further, in the MOSFET 800 according to Comparison example 1, an electric field E(x) becomes a downwardly convex quadratic function having a peak when x=a/2 (see FIG. 6D). A state where the electric field E(x) becomes a negative value means that an electric field vector is directed in a direction that x approaches 0.

To the contrary, in the MOSFET 100 according to Embodiment 1, in a graph where the depth x at the deepest depth position of a surface of the depletion layer on the first main surface side when the depletion layer extends most in the super junction structure by turning off the MOSFET is used as a reference is taken on an axis of abscissas, and a width $W_n(x)$ at the predetermined depth position of the n-type column region or a width $W_p(x)$ at the predetermined depth position of the p-type column region is taken on an axis of ordinates, the width $W_n(x)$ is expressed by a monotonous upward convex curve projecting in a right upward direction, and the width $W_p(x)$ is expressed by a monotonous downward convex curve projecting in a right downward direction (see FIG. 7A).

Figure 7B:
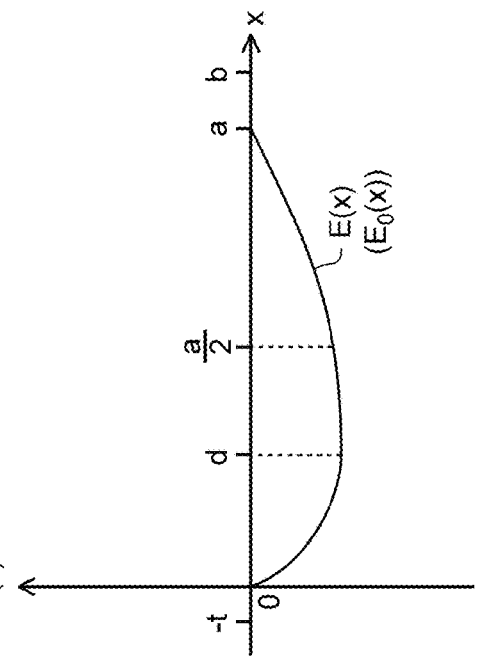
Figure 7C:
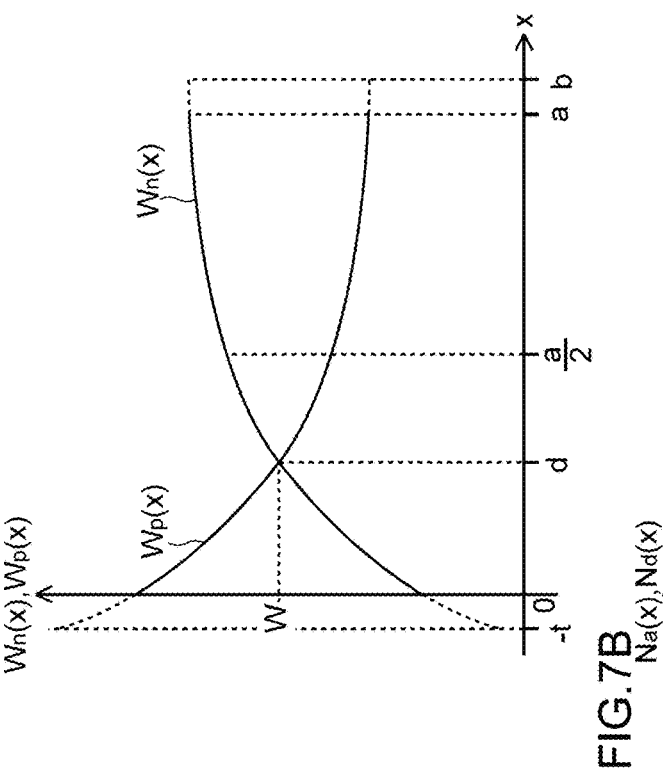

Further, in the MOSFET 100 according to Embodiment 1, average density $N_d(x)$ of a positive charge and average density $N_a(x)$ of a negative charge are set to a fixed value regardless of depth (see FIG. 7B). From these, in the MOSFET 100 according to Embodiment 1, average positive charge density ρ(x) is expressed by a monotonous upward convex curve projecting in a right upward direction (see FIG. 7C).

To observe the curve which expresses average positive charge density ρ(x) in detail, using a deepest depth position of a surface of a depletion layer on the first main surface side when the depletion layer extends most in the super junction structure by turning off the MOSFET as a reference, assuming an axis along a depth direction as an x axis, an x coordinate at a depth position of a lowermost surface of the base region as −t, an x coordinate at the depth position of a lowermost portion of the p-type column region as b, an x coordinate at a depth position where the average positive charge density ρ(x) becomes 0 as d, and an x coordinate at a shallowest depth position of the surface of the depletion layer on a second main surface side when the depletion layer extends most in the super junction structure by turning off the MOSFET as a, the following relationships (1) to (4) are satisfied.

(1) A relationship of 0<d<a/2 is satisfied. That is, a depth d at a predetermined depth position when the average positive charge density ρ(x) becomes 0 is shallower than a depth half of the depth a of a surface of the depletion layer on the second main surface side at the shallowest depth position when the depletion layer extends most in the super junction structure by turning off the MOSFET (the depth position where a charge balance is obtained is shallower than the depth position where a charge balance is obtained in the MOSFET 800 according to Comparison example 1).

(2) A value of the average positive charge density ρ(0) when x=0 becomes a negative value, and a value of the average positive charge density ρ(a) when x=a becomes a positive value.

(3) An area S3 of a region surrounded by a curve expressing the average positive charge density ρ(x), a straight line when x=0 and the axis of abscissas (x axis) is equal to an area S4 of a region surrounded by a curve expressing the average positive charge density ρ(x), a straight line when x=a and the axis of abscissas (x axis).

(4) The relationship of $0<t+d<(t+b)/2$ is satisfied.

Figure 7D:
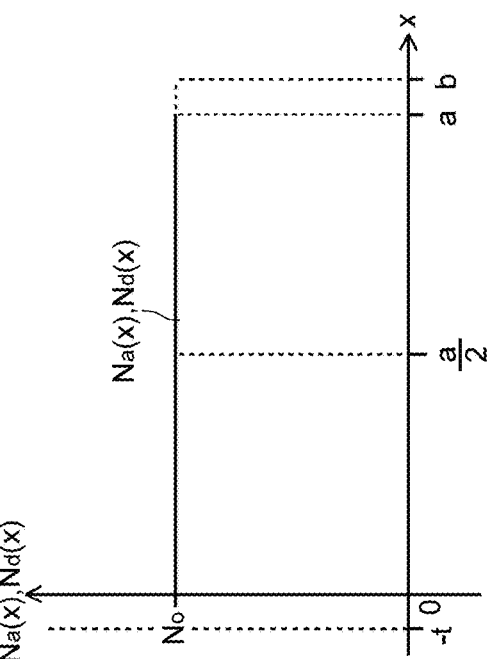

Further, an electric field $E(x)$ becomes a downwardly convex function having a peak when $x=d$ (see FIG. 7D). In this case, the electric field $E(x)$ is sharply decreased when $x<d$, and the electric field $E(x)$ is gently increased when $x>d$.

4. Relationship Between Irregularity in a Charge Balance and Switching Characteristic (1) Irregularity in a Charge Balance and Deviation of Average Positive Charge Density $\rho(x)$ A relationship between irregularity in a charge balance and switching characteristics in the MOSFET according to Embodiment 1 is described. First of all, deviation of average positive charge density $\rho(x)$ when an irregularity occurs in a charge balance in the MOSFET according to Embodiment 1 is described. For this purpose, a reference MOSFET where a shape of the super junction structure (p-type column regions and n-type column regions) is equal and an irregularity does not occur in a charge balance, and a MOSFET (n-type dopant rich MOSFET) where a shape of a super junction structure (p-type column regions and n-type column regions) is equal and an irregularity occurs in a charge balance so that the MOSFET becomes n-type dopant rich are compared with each other.

(1-1) Reference MOSFET in Comparison Example 1

The reference MOSFET in Comparison example 1 is a MOSFET where a shape of the super junction structure (p-type column regions and n-type column regions) is equal to a corresponding shape in the MOSFET 800 according to Comparison example 1, and a total amount of dopant in the n-type column region is equal to a total amount of dopant in the p-type column region so that a charge balance is obtained (see FIG. 6A to FIG. 6D).

To be more specific, the reference MOSFET according to Comparison example 1 is the MOSFET having the configuration where the shape of the super junction structure (p-type column regions and n-type column regions) is equal to the corresponding shape in the MOSFET 800 according to Comparison example 1, and dopant concentration in the p-type column region is adjusted such that a concentration gradient of a p-type dopant in the p-type column region and a concentration gradient of an n-type dopant in the n-type column region are equal to the corresponding concentration gradients in the MOSFET 800 according to Comparison example 1, and a total amount of dopant in the n-type column region and a total amount of dopant in the p-type column region are equal (including a case where a total amount of dopant in the n-type column region is equal to a total amount of dopant in the p-type column region so that the dopant concentration is not adjusted).

Average positive charge density in the reference MOSFET is expressed as reference average positive charge density $\rho_0(x)$.

(1-2) n-Type Dopant Rich MOSFET in Comparison Example 1

An n-type dopant rich MOSFET in Comparison example 1 is a MOSFET having the configuration where a shape of the super junction structure (p-type column regions and n-type column regions) is equal to a corresponding shape in the MOSFET 800 according to Comparison example 1, and a total amount of dopant in the n-type column region 114 is set larger than a total amount of dopant in the p-type column region (see FIG. 8A to FIG. 8D).

Figure 8C:
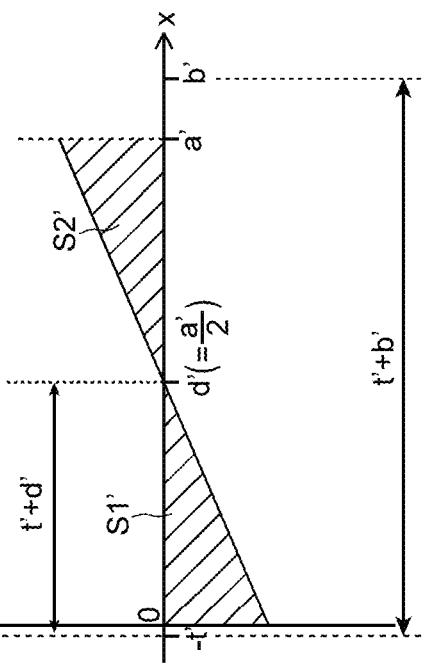
FIG. 8A to FIG. 8D are graphs expressing changes when the super junction structure is depleted by turning off an n-type dopant rich MOSFET according to Comparison example 1, that is, a change in width $W_n(x)$ at a predetermined depth position of an n-type column region with respect to a depth x, a change in width $W_p(x)$ at a predetermined depth position of a p-type column region with respect to the depth x, a change in average density $N_d(x)$ of a positive charge at a predetermined depth position of the n-type column region with respect to the depth x, a change in average density $N_a(x)$ of a negative charge at a predetermined depth position of the p-type column region with respect to the depth x, a change in average positive charge density $\rho(x)$ and an electric field $E(x)$ at a predetermined depth position of the super junction structure with respect to the depth x.
Figure 8D:
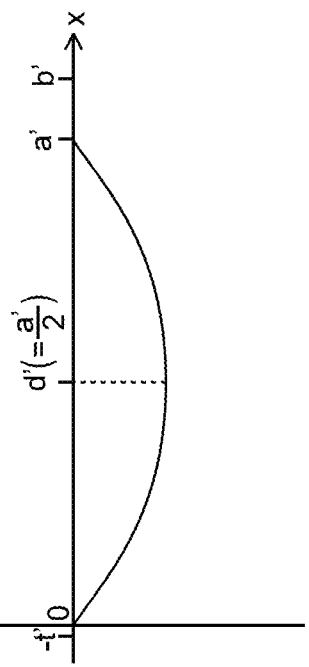
Figure 8A:
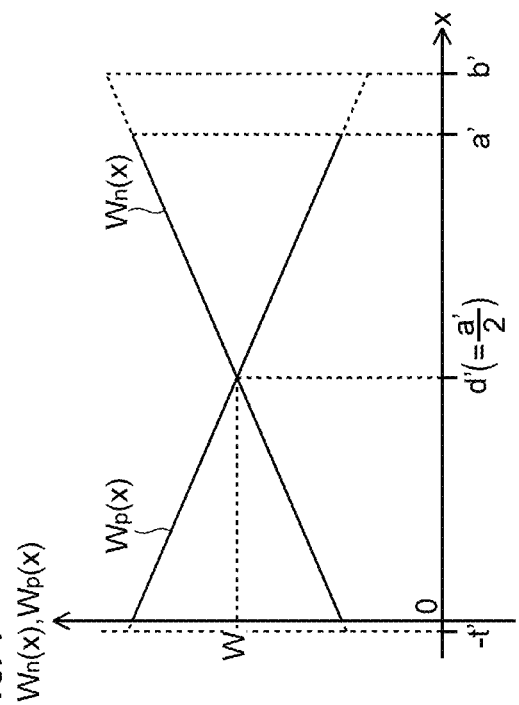
Figure 8B:
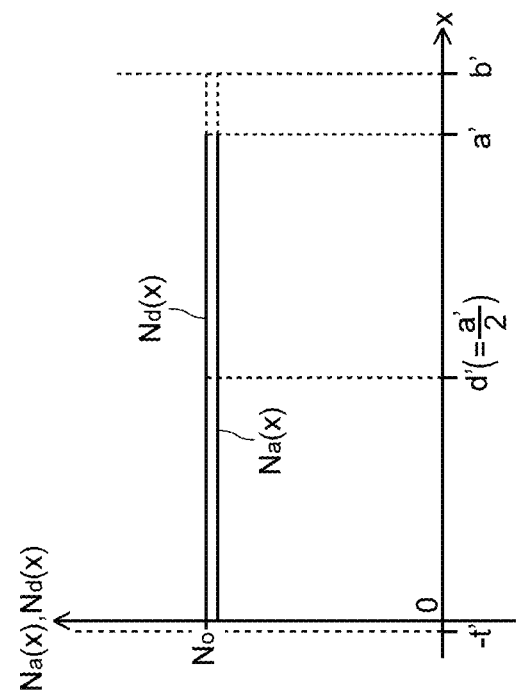

A width $Wn(x)$ at a predetermined depth position of the n-type column region 114, a width $Wp(x)$ at a predetermined depth position of the p-type column region 116, and average density $Na(x)$ of a negative charge at a predetermined depth position of the p-type column region 116 of the n-type dopant rich MOSFET in Comparison example 1 are equal to a width $Wn(x)$ at a predetermined depth position of the n-type column region 114, a width $Wp(x)$ at a predetermined depth position of the p-type column region 116, and average density $Na(x)$ of a negative charge at a predetermined depth position of the p-type column region 116 of the reference MOSFET in Comparison example 1 (see FIG. 8A and FIG. 8B). On the other hand, average density $Nd(x)$ of a positive charge at a predetermined depth position of the n-type column region 114 of the n-type dopant rich MOSFET in Comparison example 1 is set larger than average density $Nd(x)$ of a positive charge at a predetermined depth position of the n-type column region 114 of the reference MOSFET in Comparison example 1.

In the n-type dopant rich MOSFET in Comparison example 1, a total amount of dopant in the n-type column region is set larger than a total amount of dopant in the p-type column region and hence, the n-type dopant rich MOSFET in Comparison example 1 differs from the reference MOSFET in Comparison example 1 with respect to the manner of extension of a depletion layer. That is, it is difficult for the depletion layer to extend in the n-type column region 114, while it is easy for the depletion layer to extend in the p-type column region 116. Accordingly, a relationship of $|-t'|<|-t|$ is satisfied.

Average positive charge density $\rho(x)$ and an electric field $E(x)$ of the n-type dopant rich MOSFET in Comparison example 1 and average positive charge density $\rho(x)$ and an electric field $E(x)$ of the reference MOSFET in Comparison example 1 exhibit extremely similar graphs (see FIG. 8C and FIG. 8D).

An area S1' of a region surrounded by a straight line expressing the n-type dopant rich average positive charge density $\rho(x)$, a straight line when $x=0$, and an x axis is equal to an area S2' of a region surrounded by a straight line expressing the n-type dopant rich average positive charge density $\rho(x)$, a straight line when $x=a$, and an x axis.

(1-3) Reference MOSFET in Embodiment 1

The reference MOSFET in Embodiment 1 is a MOSFET where a shape of the super junction structure (p-type column regions and n-type column regions) is equal to a corresponding shape in the MOSFET 100 according to Embodiment 1, and a total amount of dopant in the n-type column region is equal to a total amount of dopant in the p-type column region so that a charge balance is obtained (see FIG. 7A to FIG. 7D).

To be more specific, the reference MOSFET according to Embodiment 1 is a MOSFET having the configuration where the shape of the super junction structure (p-type column regions and n-type column regions) is equal to the corresponding shape in the MOSFET 100 according to Embodiment 1, and dopant concentration in the p-type column region is adjusted such that a concentration gradient of a p-type dopant in the p-type column region and a concentration gradient of an n-type dopant in the n-type column region are equal to the corresponding concentration gradients in the MOSFET 100 according to Embodiment 1, and a total amount of dopant in the n-type column region and a total amount of dopant in the p-type column region are equal (including a case where a total amount of dopant in the n-type column region is equal to a total amount of dopant in the p-type column region so that the dopant concentration is not adjusted) (see FIG. 7B). In Embodiment 1, the reference MOSFET in Embodiment 1 is equal to the MOSFET according to Embodiment 1.

In this case, average positive charge density in the reference MOSFET is expressed as reference average positive charge density $\rho_0(x)$.

(1-4) n-Type Dopant Rich MOSFET in Embodiment 1

An n-type dopant rich MOSFET in Embodiment 1 is a MOSFET having the configuration where a shape of the super junction structure (p-type column regions and n-type column regions) is equal to a corresponding shape in the MOSFET 100 according to Embodiment 1, and a total amount of dopant in the n-type column region 114 is set larger than a total amount of dopant in the p-type column region.

In the n-type dopant rich MOSFET in Embodiment 1, a total amount of dopant in the n-type column region set larger than a total amount of dopant in the p-type column region and hence, the n-type dopant rich MOSFET in Embodiment 1 differs from the reference MOSFET in Embodiment 1 with respect to the manner of extension of a depletion layer. That is, it is difficult for the depletion layer to extend in the n-type column region 114, while it is easy for the depletion layer to extend in the p-type column region 116. Accordingly, a relationship of $|-t'|<|-t|$ is satisfied.

Figure 9A:
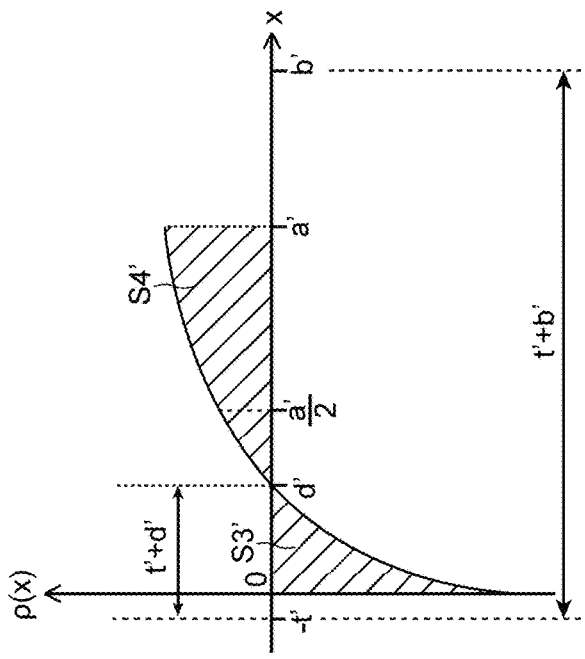
FIG. 9A to FIG. 9D are graphs expressing changes when a super junction structure 117 is depleted by turning off an n-type dopant rich MOSFET according to Embodiment 1, that is, a change in width $W_n(x)$ at a predetermined depth position of an n-type column region 114 with respect to the depth x, a change in width $W_p(x)$ at a predetermined depth position of a p-type column region 116 with respect to the depth x, a change in average density $N_d(x)$ of a positive charge at a predetermined depth position of the n-type column region 114 with respect to the depth x, a change in average density $N_a(x)$ of a negative charge at a predetermined depth position of the p-type column region 116 with respect to the depth x, and a change in average positive charge density $\rho(x)$ and an electric field $E(x)$ at a predetermined depth position of the super junction structure 117 with respect to the depth x.
Figure 9B:
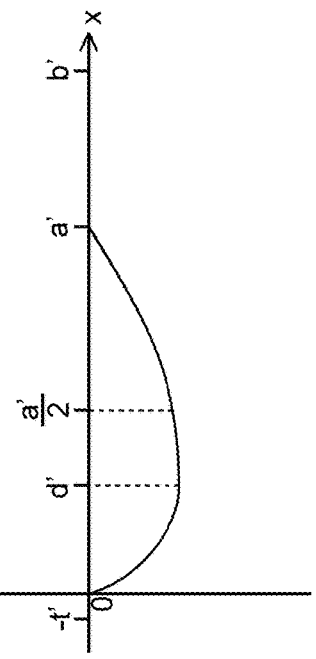

A width Wn(x) at a predetermined depth position of the n-type column region 114, a width Wp(x) at a predetermined depth position of the p-type column region 116, and average density Na(x) of a negative charge at the predetermined depth position of the p-type column region 116 of the n-type dopant rich MOSFET in Embodiment 1 are equal to a width Wn(x) at a predetermined depth position of the n-type column region 114, a width Wp(x) at a predetermined depth position of the p-type column region 116, and average density Na(x) of a negative charge at the predetermined depth position of the p-type column region 116 of the reference MOSFET in Embodiment 1 (see FIG. 9A and FIG. 9B). On the other hand, average density Nd(x) of a positive charge at a predetermined depth position of the n-type column region 114 of the n-type dopant rich MOSFET in Embodiment 1 is set larger than average density Nd(x) of a positive charge at a predetermined depth position of the n-type column region 114 of the reference MOSFET in Embodiment 1.

Figure 9C:
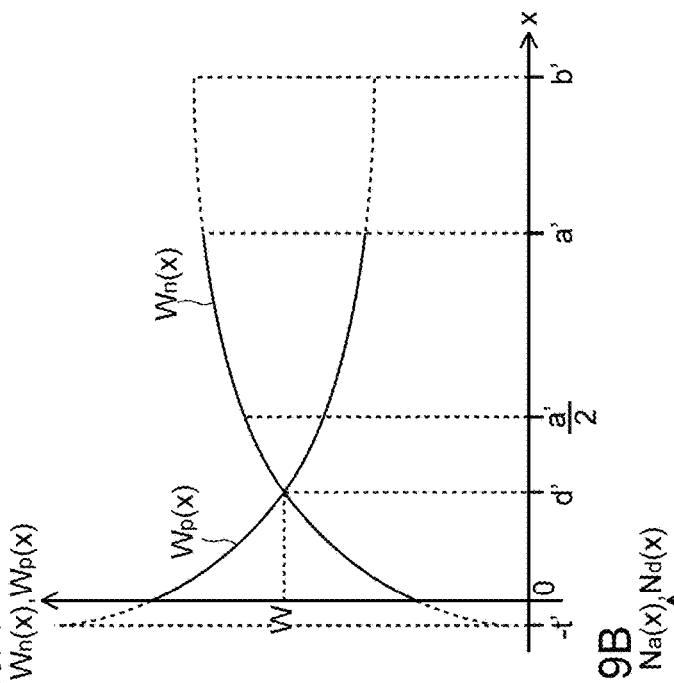
Figure 9D:
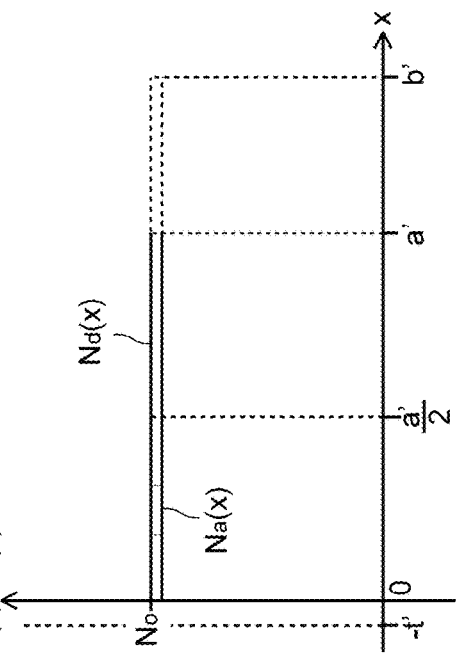

Curves expressing average positive charge density $\rho(x)$ and an electric field E(x) of the n-type dopant rich MOSFET in Embodiment 1 and curves expressing average positive charge density $\rho(x)$ and an electric field E(x) of the reference MOSFET in Comparison example 1 exhibit extremely similar (see FIG. 9C and FIG. 9D).

An area S3' of a region surrounded by a curve expressing the n-type dopant rich average positive charge density $\rho(x)$, the straight line when x=0, and the x axis is equal to an area S4' of a region surrounded by a curve expressing the n-type dopant rich average positive charge density $\rho(x)$, the straight line when x=a, and the x axis.

An area S4' of a region surrounded by a curve expressing n-type dopant rich average positive charge density $\rho(x)$, a straight line when x=a', and an x axis (see FIGS. 9A to 9D) is equal to an area S4 of a region surrounded by a curve expressing reference average positive charge density $\rho(x)$, the straight line when x=a, and the x axis (see FIGS. 7A to 7D)

Figure 10A:
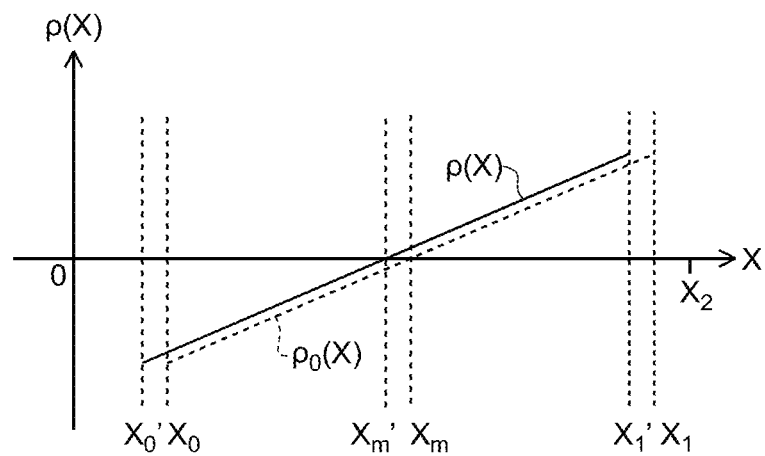
FIG. 10A and FIG. 10B are graphs expressing a change in reference average positive charge density $\rho_0(X)$, a change in average positive charge density $\rho(X)$, and respective changes in electric fields $E_0(X)$, $E(X)$ with respect to a depth X in the reference MOSFET and the n-type dopant rich MOSFET of Comparison example 1.

(1-5) Relationship Between Irregularity in a Charge Balance and Deviation of Average Positive Charge Density $\rho(x)$ A relationship between an irregularity in a charge balance and deviation of average positive charge density $\rho(x)$ is described. Using a surface of the super junction structure on a first main surface side as a reference, in both the case of Comparison example 1 and the case of Embodiment 1, a graph indicating average positive charge density $\rho(X)$ in the n-type dopant rich MOSFET is positioned on a left side of a graph indicating reference average positive charge density $\rho_0(X)$ (see FIG. 10A and FIG. 11A). Accordingly, in the case where an irregularity occurs in a charge balance so that the MOSFET becomes n-type dopant rich, a point $(E(X_m'))$ where an electric field E(X) in the n-type dopant rich MOSFET is highest is positioned closer to a source electrode side than a point $(E(X_m))$ where an electric field E(X) in the reference MOSFET is highest.

In the n-type dopant rich MOSFET according to Comparison example 1 and in the reference MOSFET according to Comparison example 1, to compare a straight line of the average positive charge density $\rho(X)$ in the n-type dopant rich MOSFET with a straight line of the reference average positive charge density $\rho_0(X)$ using an upper surface of the super junction structure (a lowermost surface of the base region) as a reference, neither $\Delta X_0 (=|X_0-X_0'|)$ nor $\Delta X_m (=|X_m-X_m'|)$ largely changes (see FIG. 10A) and hence, it is difficult to read the relationship between the average positive charge density $\rho(X)$ and the reference average positive charge density $\rho_0(X)$ from the graph. However, a relationship of $\Delta X_0 (=|X_0-X_0'|) > \Delta X_m (=|X_m-X_m'|)$ is satisfied. Further, it is understood from the graph that $\Delta X_1 (=|X_1-X_1'|)$ is smaller than $\Delta X_m$. Accordingly, a relationship of $\Delta X_0 > \Delta X_m > \Delta X_1$ is satisfied.

Figure 10B:
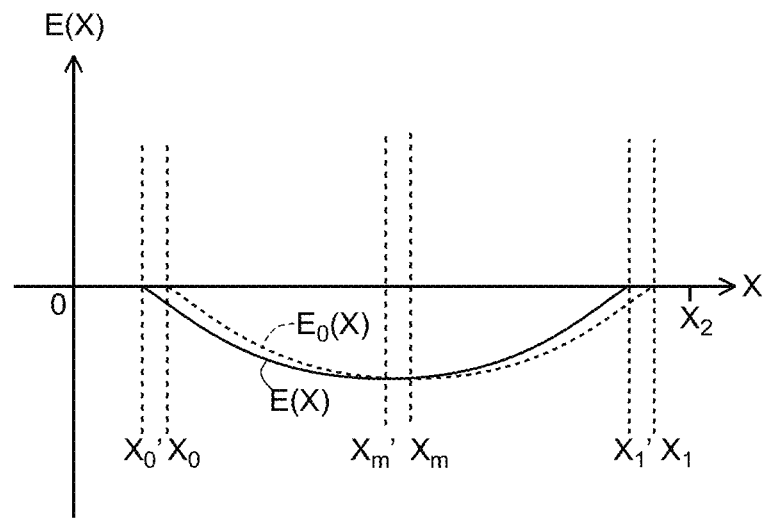

Further, in the electric field E(X), neither $\Delta X_0$ nor $\Delta X_m$ largely changes and hence, a curve of the n-type dopant rich MOSFET in Comparison example 1 and a curve of the reference MOSFET in Comparison example 1 are minimally different from each other in shape, and the curves have shapes translated toward a source electrode side (see FIG. 10B).

On the other hand, in the n-type dopant rich MOSFET according to Embodiment 1 and in the reference MOSFET according to Embodiment 1, to compare a curve of average positive charge density $\rho(X)$ in the n-type dopant rich MOSFET with a curve of reference average positive charge density $\rho_0(X)$ using an upper surface of the super junction structure (a lowermost surface of the base region) as a reference, a relationship of $\Delta X_0 (=|X_0-X_0'|) < \Delta X_m (=|X_m-X_m'|)$ is satisfied. Further, it is also understood from the graph that $\Delta X_1 (=|X_1-X_1'|)$ is larger than $\Delta X_m$ (see FIG. 11A). Accordingly, a relationship of $\Delta X_0 < \Delta X_m < \Delta X_1$ is satisfied. Further, a relationship of $\Delta X_0 < \Delta X_m$ is established in the electric field E(X) and hence, a gradient is set steep within a range of $X_0 < X < X_m$ (see FIG. 11B).

In this manner, the MOSFET 100 according to Embodiment 1 satisfies a relationship of $\Delta X_0 (=|X_0-X_0'|) < \Delta X_m (=|X_m-X_m'|)$. Accordingly, even when an irregularity occurs in a charge balance so that the MOSFET becomes n-type dopant rich, deviation of average positive charge density $\rho(X)$ on a first main surface side (gate electrode side) is small whereby a region where an electric field E(X) is high minimally approaches the gate electrode. Accordingly, an electric field E(X) in the n-type column region around the gate electrode becomes minimally high so that a change in potential of the n-type column region around the gate becomes small easily. As a result, an irregularity minimally occurs in switching characteristics when the MOSFET is turned off.

In the n-type dopant rich MOSFET according to Embodiment 1 and the reference MOSFET according to Embodiment 1, using the surface of the super junction structure on the first main surface side as the reference, assuming the average positive charge density at a depth $X_1$ of the surface of the depletion layer on the second main surface side at the shallowest depth position when the depletion layer extends most in the super junction structure by turning off the MOSFET as $\rho(X_1)$, and assuming the reference average positive charge density at the shallowest depth position $X_1'$ of the surface of the depletion layer on the second main surface side when the depletion layer extends most in the super junction structure by turning off the reference MOSFET as $\rho_0(X_1)$, a relationship of $\rho_0(X_1) < \rho(X_1')$ is satisfied.

Using the surface of the super junction structure on the first main surface side as the reference, assuming the average positive charge density at the deepest depth position $X_0$ of the surface of the depletion layer on the first main surface side when the depletion layer extends most in the super junction structure by turning off the n-type dopant rich MOSFET as $\rho(X_0')$, and assuming the reference average positive charge density at the deepest depth position $X_0$ of the depletion layer on the first main surface side when the depletion layer extends most in the super junction structure by turning off the reference MOSFET as $\rho_0(X_0)$, a relationship of $\rho_0(X_0) > \rho(X_0')$ is satisfied.

(1-6) Relationship Between Configuration of Super Junction Structure and Deviation of Average Positive Charge Density $\rho(x)$ It is confirmed by the following description that the MOSFET 100 according to Embodiment 1 satisfies the relationship of $\Delta X_0(=X_0-X_0') < \Delta X_m(=X_m-X_m')$ as described above.

A width $W_p(x)$ at a predetermined depth position of a p-type column region is expressed by a following formula (2), and a width $W_n(x)$ at a predetermined depth position of an n-type column region is expressed by a following formula (3).

[Formula 2]
$$W_p(x) = -\left[-A\exp\left(-\frac{x}{\lambda}\right) + B\right] + W \tag{2}$$

[Formula 3]
$$W_n(x) = \left[-A\exp\left(-\frac{x}{\lambda}\right) + B\right] + W \tag{3}$$

To modify these formulae, the width $W_p(x)$ at a predetermined depth position of a p-type column region and the width $W_n(x)$ at a predetermined depth position of an n-type column region are expressed by following formulae (8) and (9).

[Formula 8]
$$W_p(x) = -B\left[-\exp\left(-\frac{x - \lambda \ln\frac{A}{B}}{\lambda}\right) + 1\right] + W - \delta \tag{8}$$

[Formula 9]
$$W_n(x) = -B\left[-\exp\left(-\frac{x - \lambda \ln\frac{A}{B}}{\lambda}\right) + 1\right] + W + \delta \tag{9}$$

By substituting $W_p(x)$ in the formula (8) and $W_n(x)$ in the formula (9) for $W_p(x)$ and $W_n(x)$ in the formula (6), by replacing $x-\lambda \ln(A/B)$ with x (this operation corresponding to the translation of the x coordinate) and by arranging the formula (6), a following formula (10) is obtained.

[Formula 10]
$$\rho(x) = \frac{qN_0}{W}B\left[-\exp\left(\frac{x}{\lambda}\right) + 1\right] \tag{10}$$

On the other hand, assume that dopant concentration in the p-type column region 116 is changed as described below (formula (11)).

[Formula 11]
$$N_a(x) = (1+\delta)N_0 \tag{11}$$

(wherein, $|\delta| \ll 1$)

In the formula (11), $\delta$ expresses a width of a change (for example, when dopant concentration in the p-type column region 116 is increased by 5%, $\delta$ becomes 0.05 ($\delta=0.05$), and when dopant concentration in the p-type column region 116 is decreased by 5%, $\delta$ becomes $-0.05$ ($\delta=-0.05$)). A following formula (12) is obtained by substituting $N_a(x)$ in the formula (11) for $N_a(x)$ in the formula (1).

[Formula 12]
$$\rho(x) = \frac{q}{2W}[N_0 W_n(x) - (1+\delta)N_0 W_p(x)] \tag{12}$$

In putting $W_p(x)$ in the formula (8) and $W_n(x)$ in the formula (9) for $W_p(x)$ and $W_n(x)$ in the formula (12), since $|\delta| \ll 1$, it is possible to make the approximation of $\exp(\delta) \cong 1+\delta$. By further arranging the approximated formula (12) by replacing $x-\lambda \ln(A/B)$ with x, a following formula (13) is obtained.

[Formula 13]
$$\rho(x) = \frac{qN_0}{W}\left(\left(1+\frac{\delta}{2}\right)B - \frac{\delta W}{2}\right)\left[-\exp\left(-\frac{x - \frac{\lambda \delta W}{(2+\delta)B}}{\lambda}\right) + 1\right] \tag{13}$$

Figure 11A:
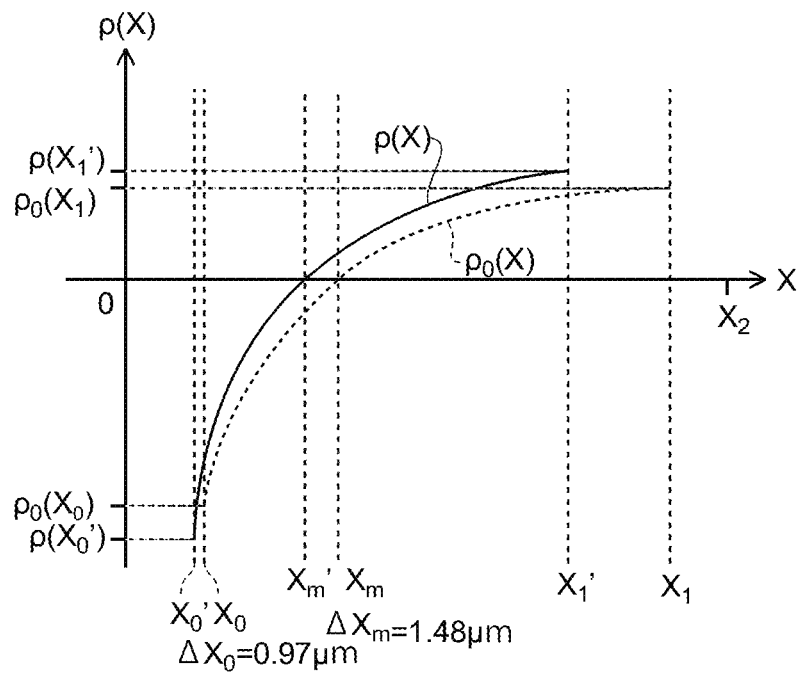
FIG. 11A and FIG. 11B are graphs expressing a change in reference average positive charge density $\rho_0(X)$, a change in average positive charge density $\rho(X)$, and respective changes in electric fields $E_0(X)$, $E(X)$ with respect to a depth X in the reference MOSFET and the n-type dopant rich MOSFET of Embodiment 1.
Figure 11B:
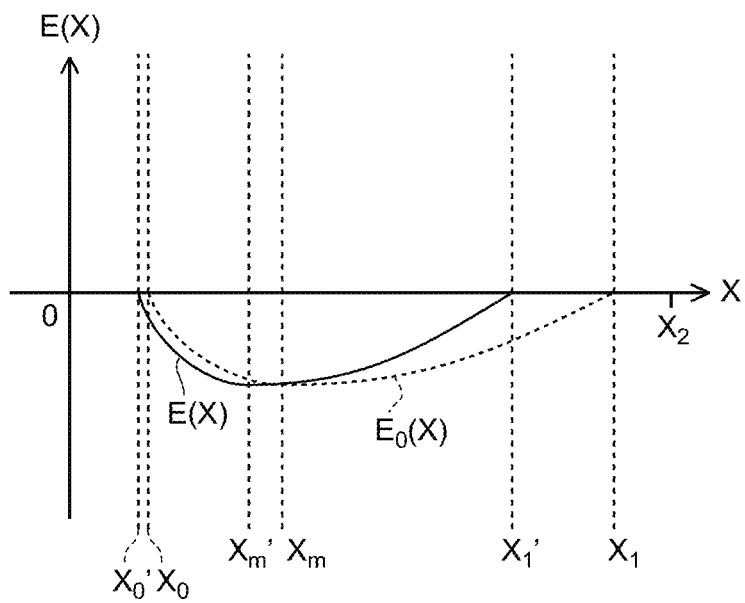

As can be understood from FIG. 11A and FIG. 11B, $\rho(x)$ becomes 0 ($\rho(x)=0$) at a maximum electric field intensity point $X_m$ and hence, the maximum electric field intensity point $X_m$ appears when $x=\lambda\delta W/(2+\delta)B$. To compare the formula (10) with the formula (13), the maximum electric field intensity point $X_m$ is moved toward a source electrode side by an amount of $\lambda\delta W/(2+\delta)B$ when an irregularity occurs in a charge balance (namely, $\Delta X_m = \lambda\delta W/(2+\delta)B$). By substituting specific values in the formula in such a manner as $\delta=-0.05$, $W=5$ μm, $\lambda=10$ μm, $N_0=3\times 10^{15}$ cm$^{-3}$, $B=0.868$ μm, a moving amount $\Delta X_m$ of the maximum electric field intensity point $X_m$ becomes 1.48 μm ($\Delta X_m=1.48$ μm). A value of B is calculated as follows. An electric field $E(X)$ is calculated based on $\rho(X)$. The maximum electric field intensity $E(X_m)$ becomes $-2.5\times 10^5$ (V/cm) ($E(X_m)=-2.5\times 10^5$ (V/cm)), and $E(X_0)$ becomes 0 ($E(X_0)=0$), and $E(X_1)$ becomes 0 ($E(X_1)=0$). Based on these values, the value of B is calculated.

A deepest depth position of a surface of a depletion layer on the first main surface side when the depletion layer extends most in the super junction structure by turning off the MOSFET is a point where $\rho(X)$ takes a minimum value. To compare the formula (10) with the formula (13), such a position is translated toward a source electrode side by $(1+\delta/2)B - \delta W/2$ due to an irregularity in a charge balance (that is, $\Delta X_0 = (1+\delta/2)B - \delta W/2$). To substitute the above-mentioned numerical values in such a manner that $\delta=-0.05$, $W=5$ μm, a moving amount $\Delta X_0$ of the deepest depth position of a surface of a depletion layer on the first main surface side when the depletion layer extends most in the super junction structure by turning off the MOSFET becomes 0.971 μm ($\Delta X_0$=0.971 μm).

Accordingly, $\Delta X_0 < \Delta X_m$ is obtained.

That is, in the MOSFET 100 according to Embodiment 1, Wn(x) and Wp(x) are exponentials expressed by the above-mentioned formulae (2) and (3) and $|\delta|<<1$ is established and hence, average positive charge density ρ(x) is expressed by a following formula (14). Accordingly, even when an irregularity in a charge balance occurs, a functional shape is not changed and, at the same time, an irregularity in a charge balance can be absorbed as a value of translational movement. That is, it is safe to say that the MOSFET 100 according to Embodiment 1 ensure high robust stability against an irregularity in a charge balance.

[Formula 14]

$$(1+\delta)\exp\left(-\frac{x}{\lambda}\right) = \exp\left[-\left(\frac{x-\delta\lambda}{\lambda}\right)\right] \quad (14)$$

In Embodiment 1, the case is considered where a charge balance becomes n-type dopant rich (a total amount of dopant in the n-type column region becoming larger than a total amount of dopant in the p-type column region). However, in the case where a charge balance is deviated to p-type dopant rich, average positive charge density ρ(x) is positioned on a right side of reference average positive charge density $\rho_0(x)$. Also in this case, there is no possibility that the region where an electric field E(x) is high approaches the gate electrode. Accordingly, an electric field E(x) of the n-type column region around the gate electrode is minimally increased and hence, a change in potential of the n-type column region around the gate electrode becomes small easily. As a result, an irregularity minimally occurs in switching characteristics when the MOSFET is turned off. Also in this case, $|X_0-X_0'|<|X_m-X_m'|$ is satisfied.

(2) Irregularity in a Charge Balance and Deviations $X_0$, $X_m$ and $X_1$

Next, using a surface of a super junction structure on the first main surface side as a reference, a relationship between a deepest depth position $X_0$ of a surface of a depletion layer on the first main surface side when the depletion layer extends most in the super junction structure by turning off the MOSFET, a depth position $X_m$ when the average positive charge density ρ(x) becomes 0, a depth $X_1$ of a surface of the depletion layer on a second main surface side at a shallowest depth position when the depletion layer extends most in the super junction structure by turning off the MOSFET, and a charge balance is described.

Figure 12:
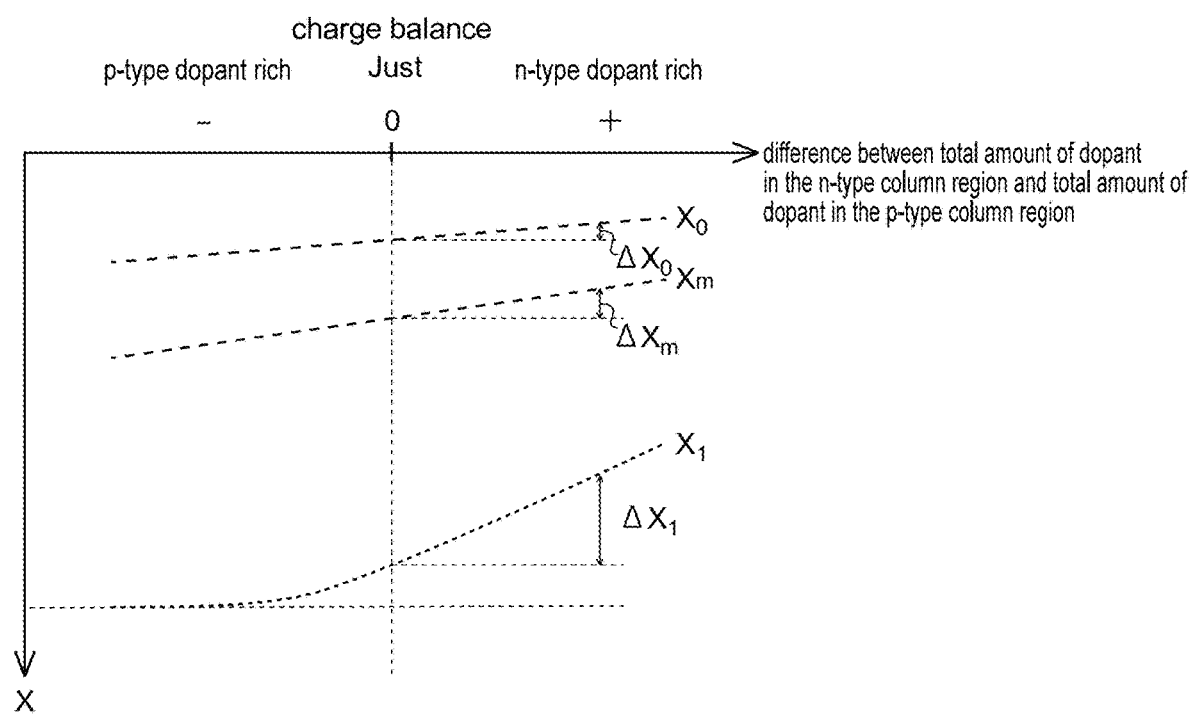
FIG. 12 is a graph expressing a relationship established in the MOSFET 100 of Embodiment 1 between a charge balance which is a difference between a total amount of dopant in the n-type column region and a total amount of dopant in the p-type column region, a deepest depth position $X_0$ of a surface of a depletion layer on the first main surface side when the depletion layer extends most in the super junction structure by turning off the MOSFET, a depth position $X_m$ when the average positive charge density $\rho(x)$ becomes 0, and a depth $X_1$ of a surface of the depletion layer on a second main surface side at a shallowest depth position when the depletion layer extends most in the super junction structure by turning off the MOSFET.

In a graph where a difference between a total amount of dopant in the n-type column region and a total amount of dopant in the p-type column region is taken on an axis of abscissas, and a depth X using the surface of the super junction structure on the first main surface side as a reference is taken on an axis of ordinates, $X_0$ and $X_m$ become straight lines which are monotonously increased (see FIG. 12). When the difference between the total amount of dopant in the n-type column region 114 and the total amount of dopant in the p-type column region 116 is positive (+), $X_1$ becomes a straight line which is monotonously increased. On the other hand, when the difference between the total amount of dopant in the n-type column region 114 and the total amount of dopant in the p-type column region 116 is negative (−), $X_1$ is converged to a predetermined value when the difference between the total amount of dopant in the n-type column region 114 and the total amount of dopant in the p-type column region 116 becomes large. The predetermined value is set to substantially equal to a value of a depth of a bottom of the p-type column region 116.

Further, when the MOSFET is n-type dopant rich, the difference with respect to a value when a charge balance is obtained is increased in order of $X_0$, $X_m$ and $X_1$ and hence, it is understood that the relationship of $\Delta X_0 < \Delta X_m < \Delta X_1$ is satisfied.

Figure 13A:
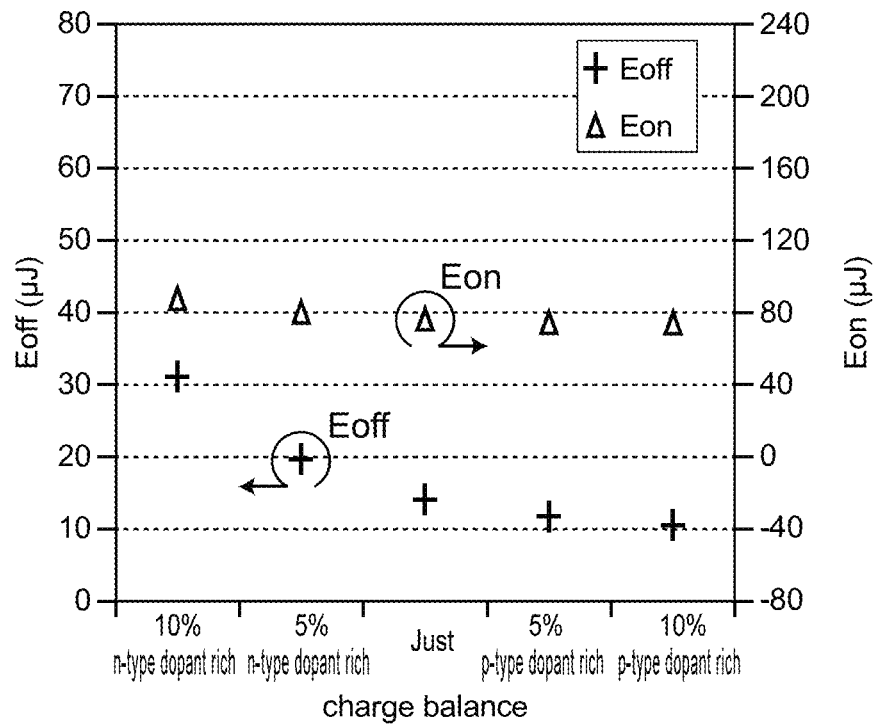
FIG. 13A and FIG. 13B are graphs showing a relationship between a charge balance, a switching loss Eoff when the MOSFET is turned off, and a switching loss Eon when the MOSFET is turned on in the MOSFET 100 of Embodiment 1 and the MOSFET 800 of Comparison example 1.

(3) Relationship Between Irregularity in Charge Balance and Switching Off Loss when MOSFET is Turned Off As shown in FIG. 13A, in the MOSFET 800 according to Comparison example 1, a switching loss Eoff when the MOSFET is turned off falls within a range of approximately from 10 μJ to 15 μJ in the case of Just and in the case where the MOSFET 800 becomes p-type dopant rich. On the other hand, in the MOSFET 800 according to Comparison example 1, the switching loss Eoff is increased as the MOSFET 800 becomes n-type dopant rich, and the switching loss Eoff becomes 20 μJ in the case where the MOSFET 800 becomes n-type dopant rich of 5%, and the switching loss Eoff becomes 30 μJ in the case where the MOSFET 800 becomes n-type dopant rich of 10%. Accordingly, in the case where an irregularity occurs in a charge balance and the MOSFET 800 becomes n-type dopant rich, an irregularity in a switching loss when the MOSFET is turned off is increased and hence, there is a possibility that a defect occurs in an operation of a power conversion circuit (particularly, a circuit largely affected by a switching loss at the time of turning off the MOSFET such as a current critical type PFC or a current discontinuous type PFC).

Figure 13B:
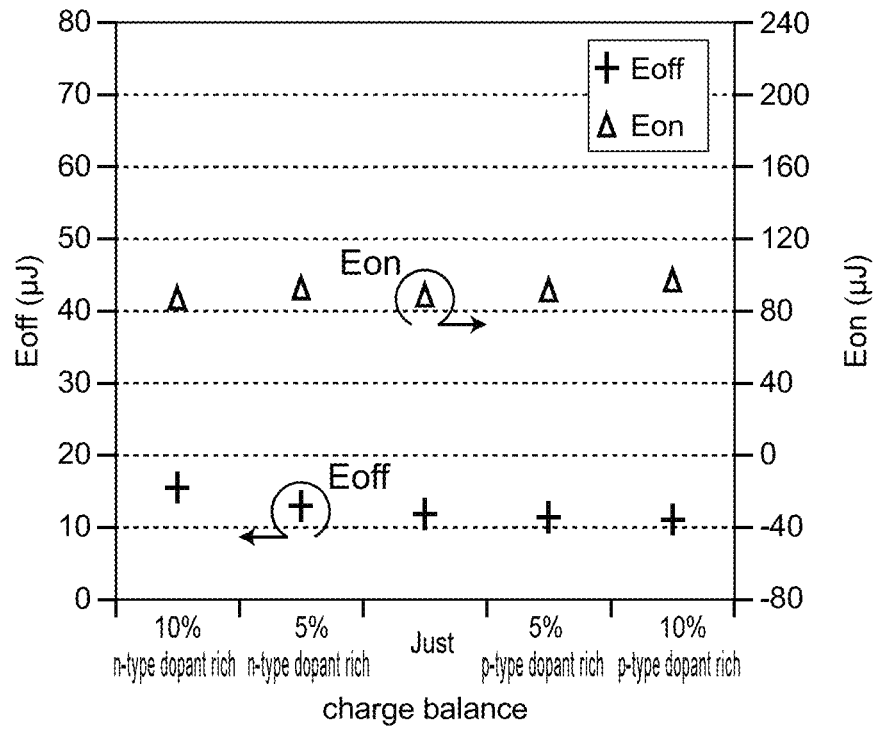

On the other hand, as shown in FIG. 13B, in the MOSFET 100 according to Embodiment 1, a switching loss Eoff when the MOSFET is turned off falls within a range of from 10 μJ to 20 μJ in all cases of Just, n-type dopant rich and p-type dopant rich. Accordingly, even in the case where an irregularity occurs in a charge balance, an irregularity in a switching loss when the MOSFET is turned off is not increased and hence, it is possible to avoid occurrence of a defect in an operation of the power conversion circuit. That is, it is safe to say that the MOSFET 100 according to Embodiment 1 is a MOSFET which can reduce irregularities in a switching loss when the MOSFET is turned off due to the occurrence of an irregularity in a charge balance.

A switching loss when the MOSFET is turned on minimally differs between all cases of Just, n-type dopant rich and p-type dopant rich in either of the MOSFET 800 according to Comparison example 1 and the MOSFET 100 according to Embodiment 1. Although a switching loss when the MOSFET is turned on can be decreased by decreasing gate resistance, a switching loss of the power conversion circuit is largely dependent on a characteristic (recovery characteristic) of a rectifier element (free wheel diode or the like) and hence, the influence caused by a switching loss of the MOSFET when the MOSFET is turned on is small thus minimally contributing to a switching loss of the power conversion circuit.

5. Manner of Operation and Waveform of MOSFET 100 when MOSFET 100 is Turned Off

In the power conversion circuit 1 according to Embodiment 1, in the case where the MOSFET 800 according to Comparison example 1 is used in place of the MOSFET 100, the MOSFET 800 according to Comparison example 1 is operated as follows.

(1) Drain Current Id

In the case where a total amount of dopant in the n-type column region and a total amount of dopant in the p-type column region are equal (hereinafter referred to as "in the case of Just"), the MOSFET 800 is operated such that, during a period from a point of time that a drain current Id starts to be decreased to a point of time that the drain current Id becomes 0 for the first time, a period where the drain current Id is temporarily increased slightly appears (the MOSFET 800 being operated such that a hump waveform slightly appears in a waveform of the drain current Id, see Id(Just) in FIG. 14). The period from a point of time that a drain current Id starts to be decreased to a point of time that the drain current Id becomes 0 for the first time is approximately 0.02 μsec (20 nsec).

In the case where an irregularity exists in a charge balance such that a total amount of dopant in the n-type column region is larger than a total amount of dopant in the p-type column region (hereinafter referred to as "in the case of n-type dopant rich"), the MOSFET 800 is operated such that, during a period from a point of time that a drain current Id starts to be decreased to a point of time that the drain current Id becomes 0 for the first time, a period where the drain current Id is temporarily increased appears (the MOSFET 800 being operated such that a large hump waveform appears in a waveform of the drain current Id, see Id (n-type dopant rich) in FIG. 14). With respect to the hump waveform, the drain current Id is increased to a current value higher than a current value in the case of Just and, at the same time, a period until the drain current Id becomes 0 is largely prolonged compared to the case of Just (approximately 0.02 μsec (20 nsec) in the case of Just and approximately 0.04 μsec (40 nsec) in the case of n-type dopant rich).

In the case where a total amount of dopant in the p-type column region is larger than a total amount of dopant in the n-type column region (hereinafter referred to as "in the case of p-type dopant rich"), the MOSFET 800 is operated such that the drain current Id is monotonously decreased (the MOSFET 800 being operated such that no hump waveform appears in a waveform of the drain current Id, see Id (p-type dopant rich) in FIG. 14).

(2) Drain-Source Voltage Vds

In the case of n-type dopant rich, the MOSFET 800 is operated such that a drain-source voltage Vds is gently increased to approximately 350V compared to the case of Just and, thereafter, the drain-source voltage Vds is gently decreased and becomes stable at a power source voltage (300V). A time until a drain-source voltage Vds becomes stable from a point of time that the drain-source voltage Vds starts to be increased is longer than a corresponding time in the case of Just and is approximately 0.05 μsec (50 nsec) (see Vds (n-type dopant rich) in FIG. 14).

Figure 14:
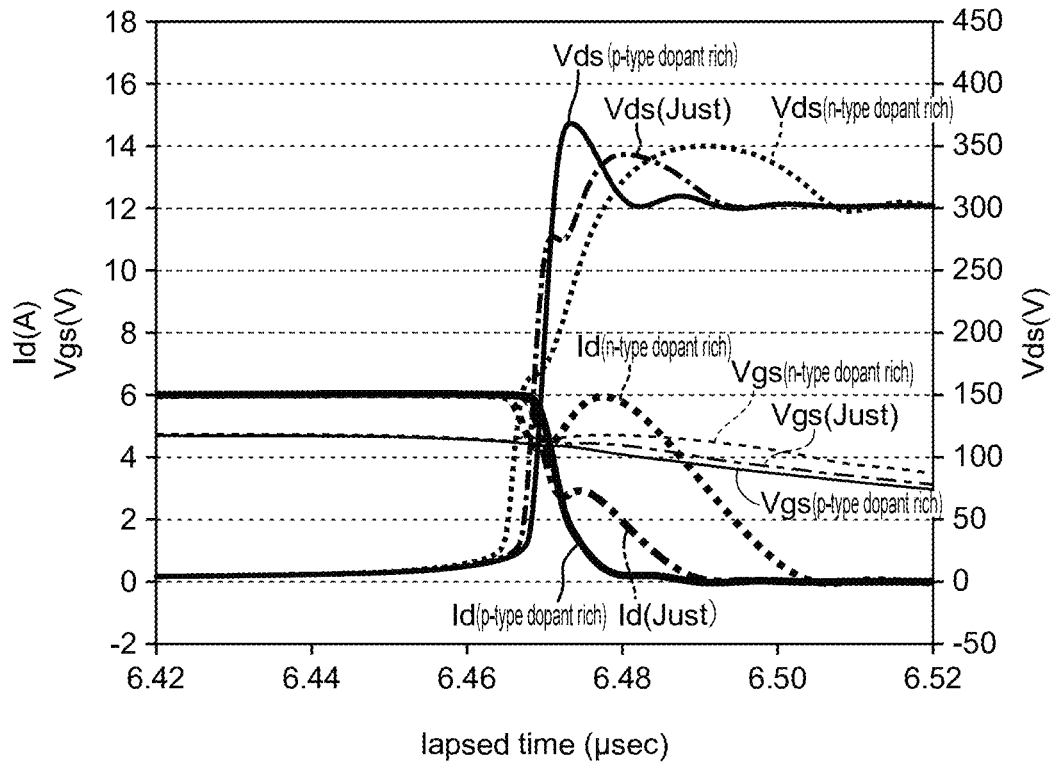
FIG. 14 is a graph showing a result of a time transition simulation of a drain-source voltage Vds, a drain current Id and a gate-source voltage Vgs when the MOSFET is turned off in a power conversion circuit using the MOSFET 800 according to Comparison example 1.

In the case of p-type dopant rich, the MOSFET 800 is operated such that a drain-source voltage Vds is steeply increased to approximately 370V compared to the case of Just and, thereafter, becomes stable at a power source voltage (300V) (see Vds (p-type dopant rich) in FIG. 14). A time until a drain-source voltage Vds becomes stable from a point of time that the drain-source voltage Vds starts to be increased is approximately 0.02 μsec (20 nsec).

(3) Gate-Source Voltage Vgs

In the case of n-type dopant rich, the MOSFET 800 is operated such that a period during which a gate-source voltage Vgs is temporarily increased slightly appears after completion of a mirror period (see Vgs (n-type dopant rich) in FIG. 14). On the other hand, in the case of Just and in the case of p-type dopant rich, the MOSFET 800 is operated such that a gate-source voltage Vgs minimally changes and is monotonously decreased (see Vgs (p-type dopant rich) and Vgs (Just) in FIG. 14).

As can be understood from the above-mentioned (1) to (3), in the MOSFET 800 according to the Comparison example 1, when an irregularity exists in a charge balance around the gate (in case such as Just being changed to n-type dopant rich or p-type dopant rich), an irregularity in switching characteristics when the MOSFET is turned off is increased. Particularly, an irregularity in a drain current Id and an irregularity in a drain-source voltage Vds are increased. When an irregularity occurs in a charge balance so that the MOSFET 800 becomes n-type dopant rich, an irregularity in switching characteristics is particularly increased.

On the other hand, in the power conversion circuit 1 according to Embodiment 1, the MOSFET 100 according to Embodiment 1 is operated as follows.

(1) Drain Current Id

In all cases, that is, in the case of Just, in the case of n-type dopant rich and in the case of p-type dopant rich, a turn-off period becomes short. Further, in all cases, the MOSFET 100 is operated such that the drain current Id adopts a similar waveform (see respective Id in FIG. 15). Particularly, in the case of n-type dopant rich, a hump waveform minimally appears in a waveform of the drain current Id and hence, the MOSFET 100 is operated such that the waveform of the drain current Id becomes similar to a waveform of the drain current Id in the case of Just and the drain current Id in the case of p-type dopant rich.

(2) Drain-Source Voltage Vds

In all cases, that is, in the case of Just, in the case of n-type dopant rich and in the case of p-type dopant rich, a turn-off period becomes short. Further, in all cases, the MOSFET 100 is operated such that the drain-source voltage Vds adopts a similar waveform (see respective Vds in FIG. 15). Although ringing occurs in the case of p-type dopant rich, the ringing can be made small by allowing the MOSFET 100 to include a mechanism to remove ringing such as a snubber circuit.

(3) Gate-Source Voltage Vgs

Figure 15:
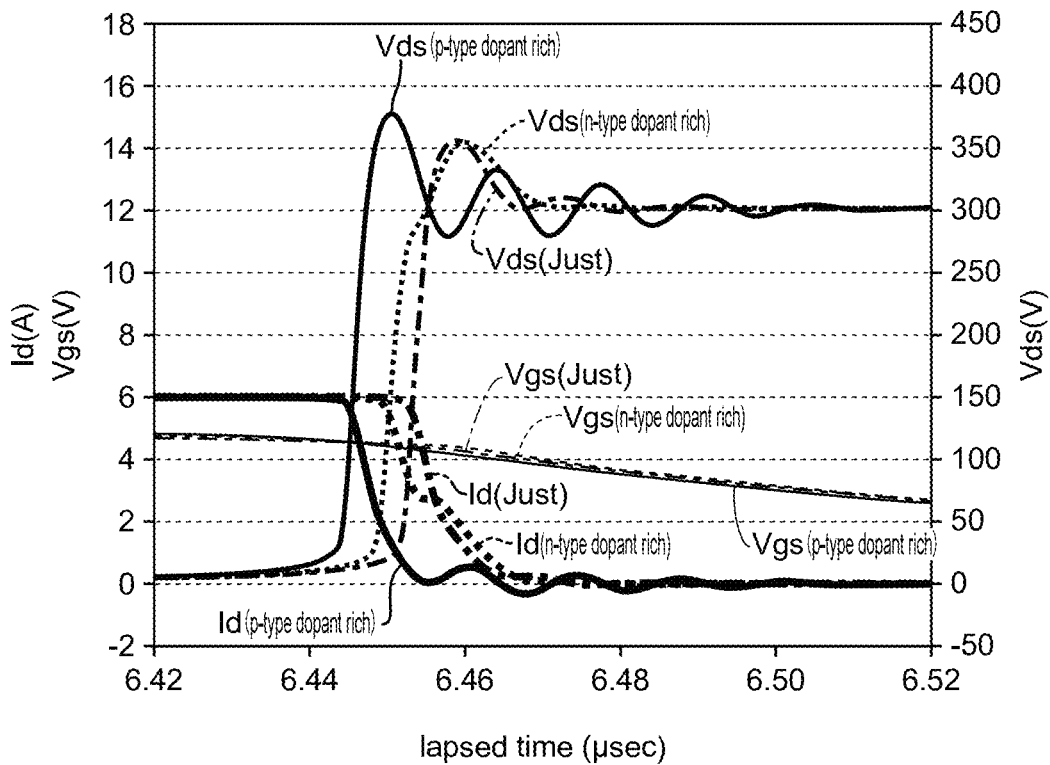
FIG. 15 is a graph showing a result of a time transition simulation of a drain-source voltage Vds, a drain current Id and a gate-source voltage Vgs when the MOSFET is turned off in a power conversion circuit 1 according to Embodiment 1.

In all cases, that is, in the case of Just, in the case of n-type dopant rich and in the case of p-type dopant rich, the MOSFET 100 is operated such that there is substantially no difference in waveform of the gate-source voltage Vgs between these cases (see respective Vgs in FIG. 15).

As can be understood from the above-mentioned (1) to (3), in the MOSFET 100 according to Embodiment 1, even when an irregularity exists in a charge balance around the gate (in case such as Just being changed to n-type dopant rich or p-type dopant rich), an irregularity in switching characteristics when the MOSFET is turned off can be made small.

Next, the reason is explained why the MOSFET 100 according to Embodiment 1 and the MOSFET 800 according to Comparison example 1 take the above-mentioned waveforms when the MOSFET is turned off.

Figure 16:
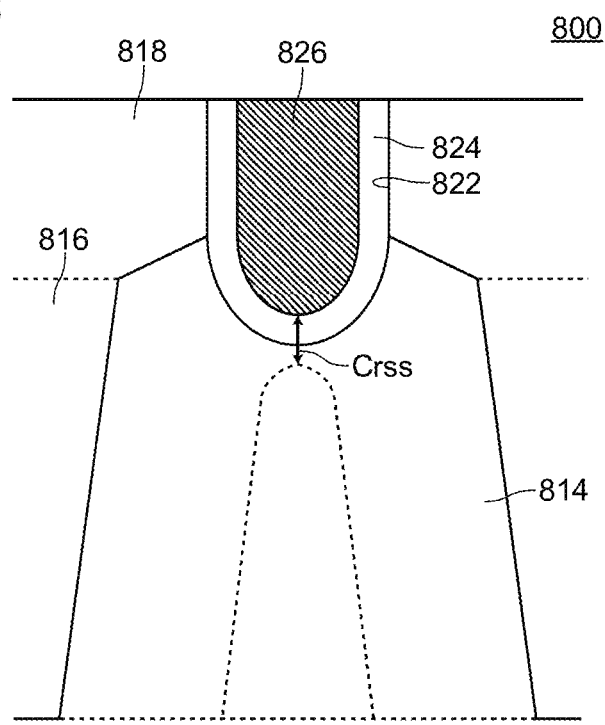
FIG. 16 is a schematic view showing a mode of the depletion layer at a moment during a turn-off period in the MOSFET 800 according to Comparison example 1.

Firstly, in the MOSFET 800 according to Comparison example 1, when the MOSFET is turned off, a depletion layer extends to the n-type column region 814 and the p-type column region 816 from the PN junction between the p-type column region 816 (and the base region 818) and the n-type column region 814. However, in the MOSFET 800 according to Comparison example 1, although the depletion layer extends to an area directly below the trench, the depletion layer minimally extends to a drain electrode side and hence, it is difficult to increase a distance between the region which is not depleted in the n-type column region 814 and the gate electrode 826 whereby it is difficult to decrease a feedback capacitance Crss (see FIG. 16). Accordingly, the gate electrode 826 is liable to be affected by a change in potential of the n-type column region 814 and hence, when an irregularity exists in a charge balance around the gate, it is difficult to decrease an irregularity in switching characteristics when the MOSFET is turned off.

Figure 17:
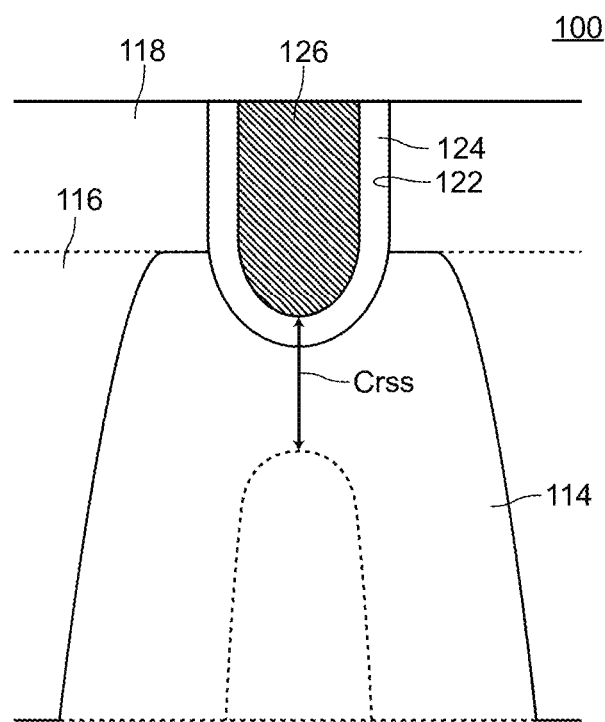
FIG. 17 is a schematic view showing a mode of the depletion layer at a moment when the MOSFET is turned off in the MOSFET 100 according to Embodiment 1.

To the contrary, in the MOSFET 100 according to Embodiment 1, a depletion layer easily extends also to a drain electrode side and hence, a distance between the region which is not depleted in the n-type column region 114 and the gate electrode 126 can be easily increased whereby a feedback capacitance Crss can be easily made small (see FIG. 17). Accordingly, the gate electrode 126 can be minimally affected by a change in potential of the n-type column region 114 and hence, when an irregularity exists in a charge balance around the gate, an irregularity in switching characteristics when the MOSFET is turned off can be made small.

The above-mentioned reason is explained from an aspect of equal potential lines.

Figure 18A:
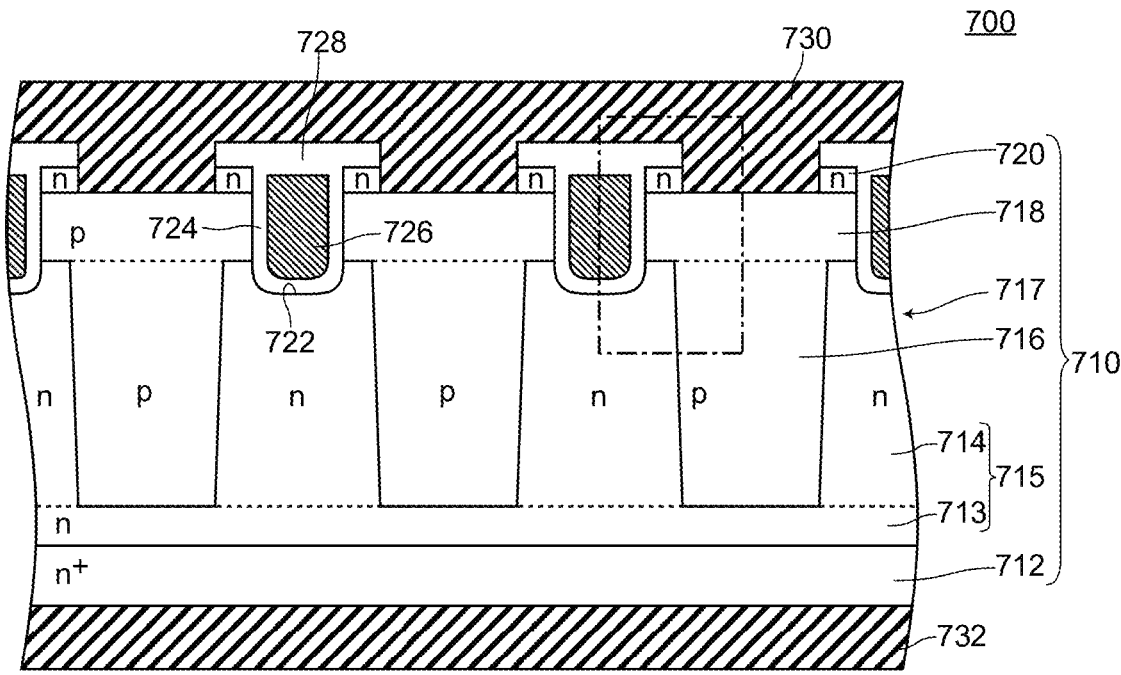
FIG. 18A and FIG. 18B are cross-sectional views showing a MOSFET 700 according to Comparison example 2 and a MOSFET 100A according to a present invention example respectively.
Figure 18B:
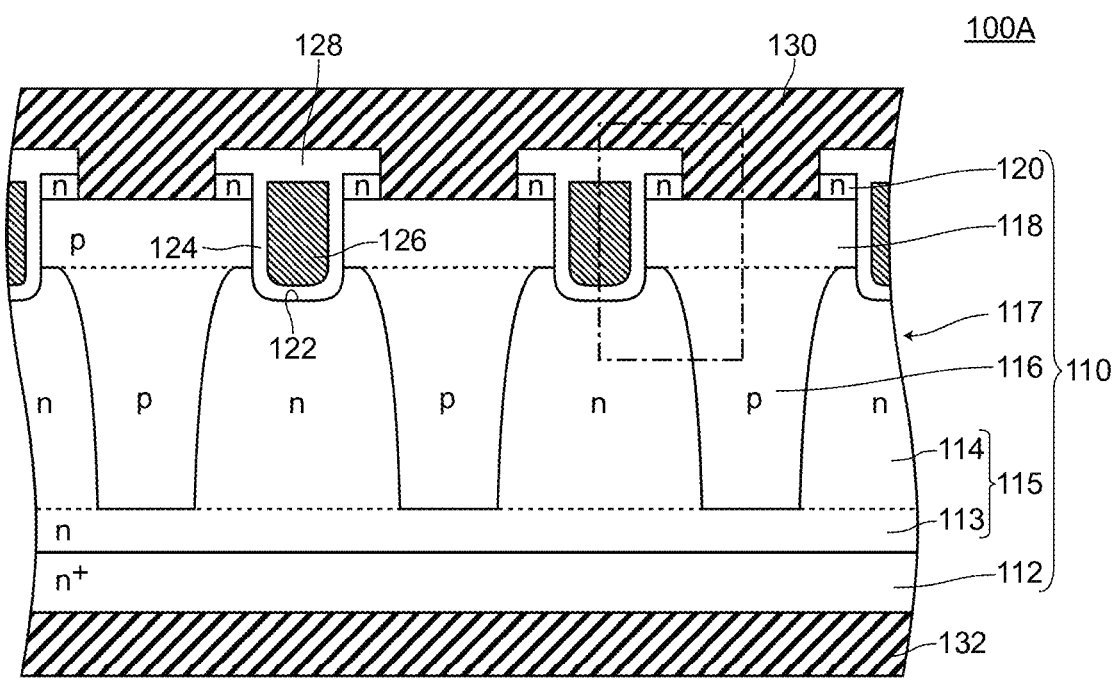

A MOSFET 700 according to Comparison example 2 is a MOSFET having substantially the same configuration as the MOSFET 800 according to Comparison example 1 except for a point that a portion of the MOSFET 700 which is brought into contact with the source electrode is dug to a depth position of a lowermost portion of the source region (see FIG. 18A). A MOSFET 100A according to a present invention example is a MOSFET having substantially the same configuration as the MOSFET 100 according to Embodiment 1 except for a point that a portion of the MOSFET 100A which is brought into contact with the source electrode is dug to a depth position of a lowermost portion of the source region (see FIG. 18B).

Figure 19A:
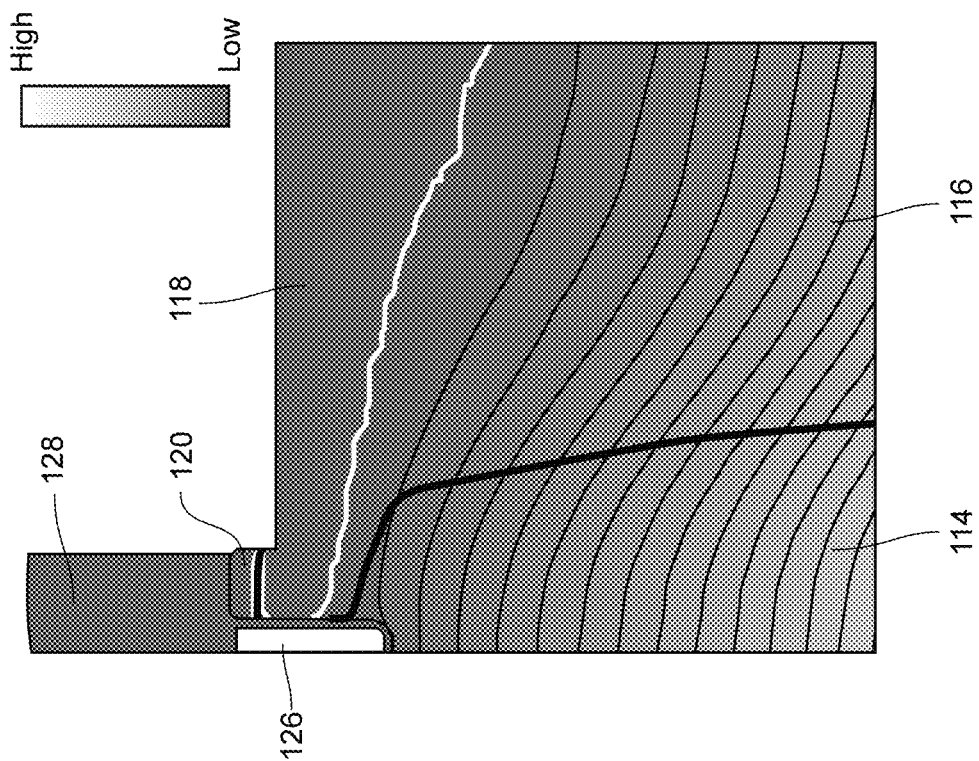
FIG. 19A and FIG. 19B are views showing a simulation result of equal potential lines when the MOSFET is turned off in the MOSFET 700 according to Comparison example 2 and the MOSFET 100A according to the present invention example respectively.

In the MOSFET 700 according to Comparison example 2, when the MOSFET is turned off, a state arises where a distance between the equal potential lines on a bottom portion of a trench is narrow (see FIG. 19A). This is because a distance between a non-depleted region in an n-type column region 714 and a gate electrode 726 is short. Accordingly, a potential gradient in the vicinity of the bottom portion of the trench is increased and hence, the gate electrode 726 is liable to be affected by a change in potential of the n-type column region 714. Accordingly, when an irregularity exists in a charge balance around the gate, it is difficult to decrease an irregularity in switching characteristics when the MOSFET 700 is turned off.

Figure 19B:
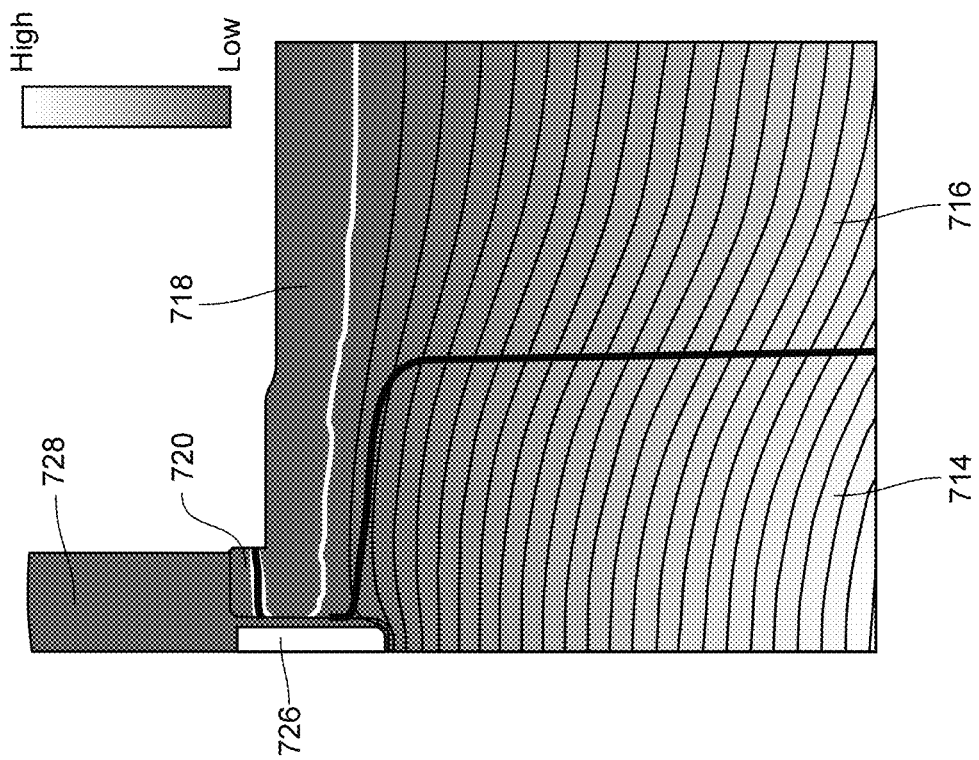

On the other hand, in the MOSFET 100A according to the present invention example, when the MOSFET is turned off, a state arises where a distance between the equal potential lines in the vicinity of a bottom portion of a trench 122 is wide (see FIG. 19B). This is because a distance between a non-depleted region in the n-type column region 114 and the gate electrode 126 is long. Accordingly, a potential gradient in the vicinity of the bottom portion of the trench 122 is decreased and hence, the gate electrode 126 is minimally affected by a change in potential of the n-type column region 114. Accordingly, even when an irregularity exists in a charge balance around the gate, an irregularity in switching characteristics when the MOSFET 100A is turned off can be made small.

6. Advantageous Effects Acquired by MOSFET 100 and Power Conversion Circuit 1 According to Embodiment 1

According to the MOSFET 100 and the power conversion circuit 1 of Embodiment 1, the relationship of $|X_0-X_0'| \leq |X_m-X_m'|$ is satisfied and hence, even when an irregularity occurs in a charge balance so that the MOSFET 100 becomes n-type dopant rich, deviation of average positive charge density $\rho(x)$ on a first main surface side (gate electrode side) is small so that a region where an electric field $E(x)$ is high minimally approaches the gate electrode. Accordingly, an electric field $E(x)$ of the n-type column region 114 around the gate electrode becomes minimally high so that a change in potential of the n-type column region around the gate becomes small easily. As a result, an irregularity minimally occurs in switching characteristics when the MOSFET is turned off.

According to the MOSFET 100 and the power conversion circuit 1 of Embodiment 1, the relationship of $|X_0-X_0'| \leq |X_m-X_m'|$ is satisfied and hence, even when an irregularity occurs in a charge balance, an irregularity in a switching loss when the MOSFET is turned off minimally becomes large. Accordingly, it is possible to prevent the occurrence of a defect in an operation of the power conversion circuit (particularly, a circuit largely affected by a switching loss at the time of turning off the MOSFET such as a current critical type PFC or a current discontinuous type PFC).

Further, the MOSFET 100 according to Embodiment 1 includes the semiconductor base substrate 110 where the super junction structure 117 is formed of the n-type column regions 114 and the p-type column regions 116. Accordingly, in the same manner as the conventional MOSFET 900, the MOSFET 100 becomes a switching element having a low ON resistance and a high withstand voltage.

In the MOSFET 100 according to Embodiment 1, the value of the average positive charge density $\rho(0)$ when x=0 takes a negative value, and the value of the average positive charge density $\rho(a)$ when x=a takes a positive value. Accordingly, at a depth position in the vicinity of a bottom portion of the p-type column region 116, a total amount of dopant in the p-type column region 116 becomes smaller than a total amount of dopant in the n-type column region 114 (becoming n-type dopant rich). With such a configuration, a depletion layer generated from the p-type column region 116 when the MOSFET is turned off minimally extends toward a second main surface side. Accordingly, it is possible to provide a MOSFET where a breakdown in a reach through mode minimally occurs so that a withstand voltage is minimally lowered.

According to the MOSFET 100 and the power conversion circuit 1 of Embodiment 1, the average positive charge density $\rho(x)$ is expressed by an upward convex curve projecting in a right upward direction. With such a configuration, in a depth position around the gate (a region where x is close to 0), the average positive charge density $\rho(x)$ becomes smaller (larger on a negative side) than a conventional MOSFET 900, and the difference between a charge amount of a negative charge in the p-type column region 116 and a charge amount of a positive charge in the n-type column region 114 becomes large compared to the conventional MOSFET 900. Accordingly, the following advantages can be acquired.

(1) The n-type column region 114 around the gate becomes easily depleted compared to the conventional MOSFET 900 and hence, even when a drain voltage is increased, a potential of the n-type column region 114 around the gate is minimally increased.

(2) A distance between a non-depleted region in the n-type column region 114 and the gate electrode 126 becomes long compared to the conventional MOSFET 900 and hence, a feedback capacitance Crss (equal to a gate-drain capacitance Cgd) becomes small compared to the conventional MOSFET 900. Accordingly, even when a potential of the n-type column region 114 (the non-depleted region of the n-type column region 114) is increased along with the increase of a drain voltage which takes place when the MOSFET is turned off, the gate electrode 126 is minimally affected by a change in potential of the n-type column region 114. As a result, even when an irregularity exists in a charge balance around the gate, an irregularity in switching characteristics when the MOSFET is turned off can be made small compared to the prior art.

Further, according to the MOSFET 100 of Embodiment 1, the average positive charge density $\rho(x)$ is expressed as an upward convex curve projecting in a right upward direction. With such a configuration, at a depth position around the gate, average positive charge density $\rho(x)$ becomes small (large on a negative side) and hence, a charge amount of a negative charge in the p-type column region 116 becomes larger than a charge amount of a positive charge in the n-type column region. Accordingly, holes around the gate can be easily extracted by a negative charge in the p-type column region 116. As a result, an L-load avalanche breakdown resistance can be increased.

According to the MOSFET 100 of Embodiment 1, a width $Wp(x)$ of the p-type column region is expressed by the following formula (2), and

[Formula 2]

$$Wp(x) = -\left[-A\exp\left(-\frac{x}{\lambda}\right) + B\right] + W \quad (2)$$

(symbols A, B, $\lambda$ being constants)

a width $Wn(x)$ of the n-type column region is expressed by the following formula (3).

[Formula 3]

$$Wn(x) = \left[-A\exp\left(-\frac{x}{\lambda}\right) + B\right] + W \quad (3)$$

(symbols A, B, $\lambda$ being constants)

With such a configuration, at the depth position around the gate, the average positive charge density $\rho(x)$ becomes small (large on a negative side) and hence, a charge amount of a negative charge in the p-type column region 116 becomes larger than a charge amount of a positive charge in the n-type column region. Accordingly, holes around the gate can be easily extracted by a negative charge in the p-type column region 116. As a result, an L-load avalanche breakdown resistance can be increased.

In the MOSFET 100 according to Embodiment 1, since $\rho_0(X_0) > \rho(X_0')$ is satisfied, when the MOSFET 100 is brought into a state where a total amount of dopant in the n-type column region differs from a total amount of dopant in the p-type column region, a first main surface side (gate electrode side) becomes p-type dopant rich more easily. Accordingly, even when an irregularity exists in a charge balance around the gate, an irregularity in switching characteristics when the MOSFET 100 is turned off can be made further small.

In the MOSFET 100 according to Embodiment 1, a relationship of $|X_m - X_m'| < |X_1 - X_1'|$ is satisfied and hence, a region where an electric field $E(X)$ is high minimally reaches the gate electrode. Accordingly, an electric field $E(X)$ in the n-type column region 114 around the gate electrode minimally becomes high and hence, a change in potential of the n-type column region around the gate becomes small easily. As a result, an irregularity minimally occurs in switching characteristics when the MOSFET 100 is turned off.

In the MOSFET 100 according to Embodiment 1, when the MOSFET 100 becomes p-type dopant rich, a curve which expresses the depth $X_1$ is converged to a predetermined value when a difference between a total amount of dopant in the n-type column region and a total amount of dopant in the p-type column region is increased and hence, extension of a depletion layer into a region deeper than the bottom of the p-type column region becomes difficult. Accordingly, it is possible to prevent the buffer layer 113 disposed in the region deeper than the p-type column region 116 from being completely depleted. As a result, even when the MOSFET 100 becomes p-type dopant rich, it is possible to maintain an L-load avalanche breakdown resistance. It is considered that the reason the depletion layer minimally extends into the region deeper than the bottom of the p-type column region is that only the n-type region (buffer layer 113 and low-resistance semiconductor layer 112) exists.

In general, in designing and manufacturing a MOSFET having a super junction structure, the configuration where a withstand voltage becomes highest when a charge balance is changed forms a charge balance point, and such a charge balance point is regarded as the configuration where a total amount of dopant in a p-type column region and a total amount of dopant in an n-type column region become equal to each other. In this case, the total amounts of dopants become equal in the depleted regions in a p-type column region and an n-type column region respectively.

Also in the MOSFET 100 according to Embodiment 1, the configuration where a withstand voltage becomes highest is found by changing a charge balance, and the configuration is regarded as a charge balance point. Further, in the MOSFET 100 according to Embodiment 1, when the MOSFET 100 becomes p-type dopant rich, a curve which expresses the depth $X_1$ is converged to a predetermined value when a difference between a total amount of dopant in an n-type column region and a total amount of dopant in a p-type column region is increased. As can be also understood from the above, in the MOSFET 100 according to Embodiment 1, the configuration which is regarded as a charge balance point (the configuration where a withstand voltage becomes highest) is originally formed at a position where a depletion layer is disposed at a slightly deeper position.

Accordingly, in a manufacturing process of the MOSFET, in a state where a charge balance is deviated to n-type dopant rich, even when an upper end $X_0$ of the depletion layer moves in a shallower direction, a distance from the gate electrode to the upper end of the depletion layer is sufficiently long and hence, the charge balance minimally affects the distribution of an electric field around a gate whereby it is possible to maintain the distribution of an electric field around the gate in a stable state.

In a process control for mass production, a control of a predetermined characteristic is performed such that an irregularity in the predetermined characteristic is measured by measuring the transition of the predetermined characteristic between wafers which are flow products or the transition of the predetermined characteristic between lots which are flow products, and the irregularity is returned to Just when an irregularity width becomes large. In the process control, an irregularity in a charge balance is detected as lowering of a withstand voltage. When a withstand voltage exhibits lowering tendency because of a gradual increase of an irregularity width toward n-type dopant rich in a charge balance as the transition of a predetermined characteristic between a plurality of lots, this tendency is fed back to a dopant doping step for returning the charge balance to Just.

With respect to several lots which indicate tendency where an irregularity width is gradually increased toward n-type dopant rich, to observe the inside of the device, a range where a depletion layer is formed is moved to a shallower side. However, as described above, the distribution of an electric field around the gate is held stable and hence, switching characteristics is not strongly affected by an irregularity in a charge balance. That is, in the MOSFET 100 according to Embodiment 1, in a usual mass production process control, by controlling a charge balance by monitoring a withstand voltage, there is no possibility that an irregularity in switching characteristics is increased within a range of a width of such a control. That is, the MOSFET 100 according to Embodiment 1 has the structure where a dynamic characteristic (switching characteristic) is automatically controlled by controlling a static characteristic.

The MOSFET 100 according to Embodiment 1 is a trench-gate-type MOSFET. With such a configuration, also in the trench-gate-type MOSFET where the gate electrode and the drain electrode are arranged close to each other so that a potential of the n-type column region 114 around the gate is liable to be increased compared to a planar-gate-type MOSFET, an irregularity in switching characteristics when the MOSFET is turned off can be made small compared to the prior art.

In the MOSFET 100 according to Embodiment 1, assuming a shallowest depth position of a surface of the depletion layer on the second main surface side when a depletion layer extends most in the super junction structure 117 by turning off the MOSFET as a, and a depth of a depth position where the average positive charge density $\rho(x)$ becomes 0 in the super junction structure 117 as d, a relationship of $0<d<a/2$ is satisfied (see FIGS. 7A to 7D). Accordingly, the difference between a charge amount of a negative charge in the p-type column region 116 and a charge amount of a positive charge in the n-type column region 114 becomes large at a depth position around the gate and hence, the n-type column region 114 around the gate becomes easily depleted. Accordingly, even when an irregularity exists in a charge balance around the gate, an irregularity in switching characteristics when the MOSFET is turned off can be made further more small.

According to the MOSFET 100 of Embodiment 1, assuming an axis along a depth direction as an x axis, an x coordinate at a depth position of a lowermost surface of the base region 11 as $-t$, an x coordinate at a depth position of a lowermost portion of the p-type column region 116 as b, and an x coordinate at a depth position where the average positive charge density $\rho(x)$ becomes 0 as d, a relationship of $0<t+d<(t+b)/2$ is satisfied (see FIGS. 7A to 7D). Accordingly, with such a configuration, the difference between a charge amount of a negative charge in the p-type column region 116 and a charge amount of a positive charge in the n-type column region 114 becomes large at a depth position around the gate and hence, the n-type column region 114 around the gate becomes easily depleted. As a result, even when an irregularity exists in a charge balance around the gate, an irregularity in switching characteristics when the MOSFET is turned off can be made further more small.

In the power conversion circuit 1 according to Embodiment 1, the rectifier element is a fast recovery diode and hence, a turn-off period is short whereby, when the MOSFET is turned off, a potential of the n-type column region 114 is minimally increased along with the increase of a drain voltage. Accordingly, a potential of the gate electrode is also minimally increased. As a result, even when an irregularity exists in a charge balance around the gate, an irregularity in switching characteristics when the MOSFET is turned off can be made small compared to the prior art.

[Modification]

A MOSFET according to Modification (not shown in the drawing) basically has substantially the same configuration as MOSFET 100 according to Embodiment 1. However, the MOSFET according to Modification differs from MOSFET 100 according to Embodiment 1 with respect to a point that a case is considered where an irregularity occurs not in a dopant concentration in the n-type column region but occurs in a width $W_p(x)$ at a predetermined depth position of a p-type column region and a width $W_n(x)$ at a predetermined depth position of an n-type column region. That is, in the MOSFET according to Modification, a width $W_p(x)$ at the predetermined depth position of the p-type column region is narrowed by $\delta$ as expressed by a following formula (15), and the width $W_n(x)$ at the predetermined depth position of the n-type column region is narrowed by $\delta$ as expressed by a following formula (16).

[Formula 15]

$$Wp(x) = -B\left[-\exp\left(-\frac{x - \lambda \ln\frac{A}{B}}{\lambda}\right) + 1\right] + W - \delta \quad (15)$$

[Formula 16]

$$Wn(x) = -B\left[-\exp\left(-\frac{x - \lambda \ln\frac{A}{B}}{\lambda}\right) + 1\right] + W + \delta \quad (16)$$

In this case, average positive charge density $\rho(x)$ is expressed by a following formula (17).

[Formula 17]

$$\rho(x) = \frac{qN_0}{W}(B + \delta)\left[-\exp\left(-\frac{x + \frac{\lambda \delta}{B}}{\lambda}\right) + 1\right] \quad (17)$$

In this case, average positive charge density $\rho(x)$ is 0 ($\rho(x)=0$) at a maximum electric field intensity point $X_m$ and hence, the maximum electric field intensity point $X_m$ appears when $x=\lambda\delta W/B$. To compare the formula (10) with the formula (17), the maximum electric field intensity point $X_m$ is moved toward a source electrode side by an amount of $x=\lambda\delta W/B$ when an irregularity occurs in a charge balance. To substitute numerical values in such a manner that $W=5$ μm, $\lambda=10$ μm, $N_0=3\times10^{15}$ cm$^{-3}$, $B=0.868$ μm in the formula, a moving amount $\Delta X_m$ of the maximum electric field intensity point $X_m$ becomes 1.44 μm ($\Delta X_m=1.44$ μm).

A deepest depth position of a surface of a depletion layer on the first main surface side when the depletion layer extends most in the super junction structure by turning off the MOSFET is a point where $\rho(x)$ becomes minimum. Accordingly, to compare the formula (10) with the formula (17), such a position is translated toward a source electrode side by (B+δ) due to an irregularity in a charge balance. To substitute the above-mentioned numerical values such as W=5 μm in the formula, a moving amount $\Delta X_0$ of the deepest depth position of a surface of a depletion layer on the first main surface side when the depletion layer extends most in the super junction structure by turning off the MOSFET becomes 0.44 μm ($\Delta X_0$=0.44 μm).

Accordingly, in this case also, a relationship of $\Delta X_0 < \Delta X_m$ is obtained.

In this manner, the MOSFET and the power conversion circuit according to Modification differ from the MOSFET 100 according to Embodiment 1 with respect to the point that the case is considered where an irregularity occurs not in the dopant concentration in the n-type column region but occurs in a width $W_p(x)$ at a predetermined depth position of the p-type column region and in a width $W_n(x)$ at a predetermined depth position of the n-type column region. However, in the same manner as the MOSFET 100 according to Embodiment 1, a relationship of $|X_0-X_0'| \leq |X_m-X_m'|$ is satisfied and hence, even when an irregularity occurs in a charge balance so that the MOSFET becomes n-type dopant rich, deviation of average positive charge density ρ(x) on a first main surface side (gate electrode side) is small whereby a region where an electric field E(x) is high minimally approaches the gate electrode. Accordingly, an electric field E(x) of the n-type column region 114 around the gate electrode becomes minimally high so that a change in potential of the n-type column region around the gate becomes small easily. As a result, an irregularity minimally occurs in switching characteristics when the MOSFET is turned off.

Embodiment 2

Figure 20A:
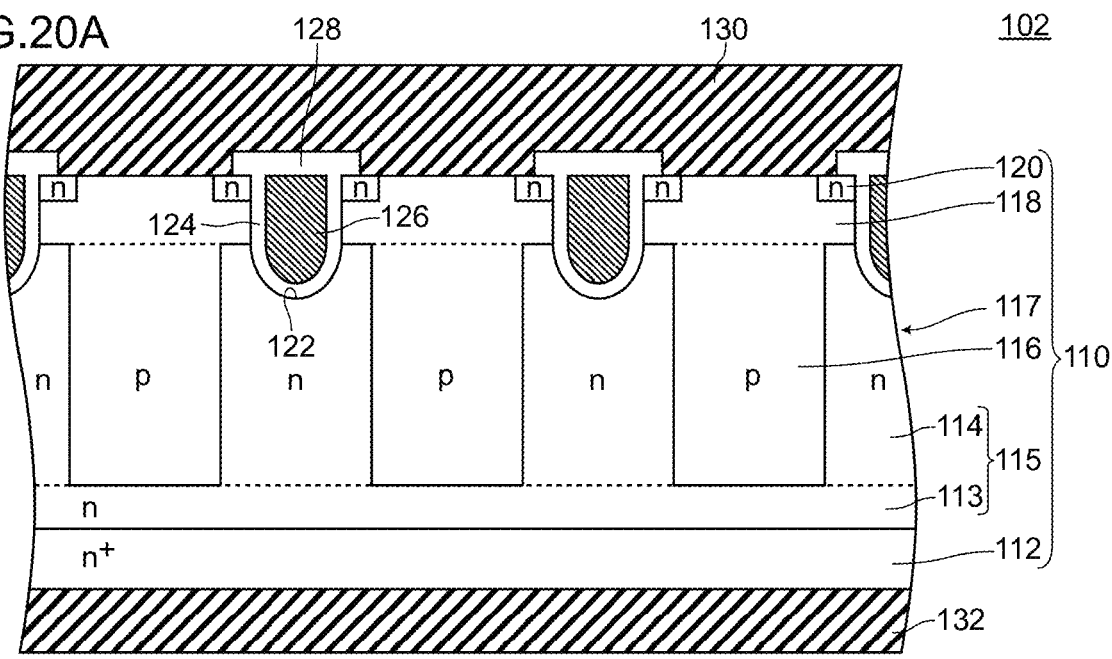
FIG. 20A to FIG. 20C are views for explaining the MOSFET 102 according to Embodiment 2.
Figure 20B:
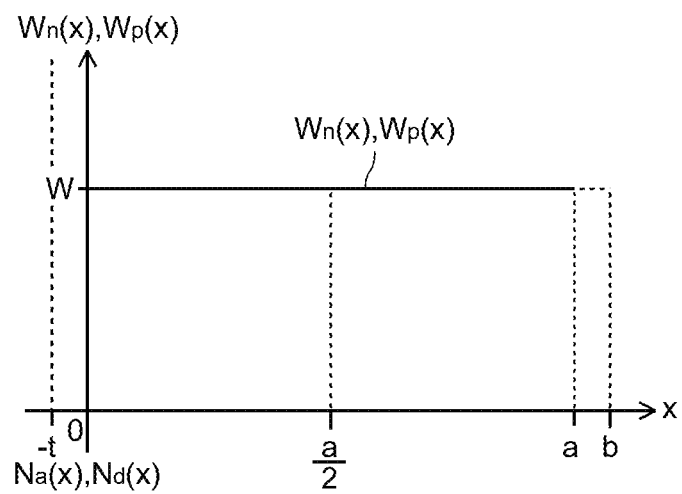
Figure 20C:
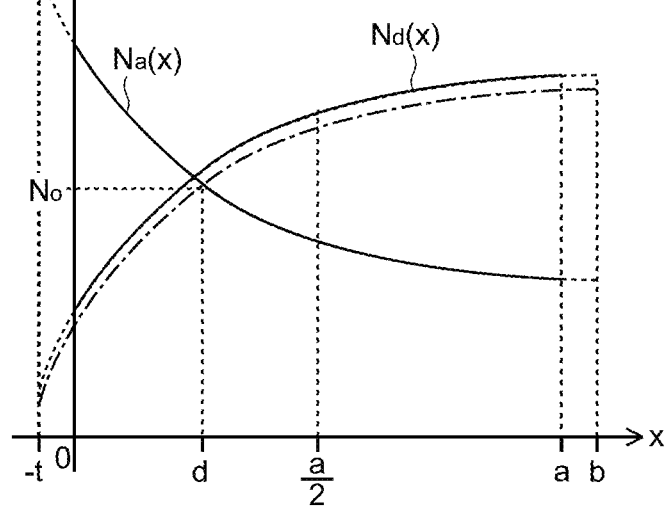

A MOSFET 102 according to Embodiment 2 basically has substantially the same configuration as MOSFET 100 according to Embodiment 1. However, MOSFET 102 according to Embodiment 2 differs from MOSFET 100 according to Embodiment 1 with respect to a point that average density $N_d(x)$ of a positive charge at a predetermined depth position of an n-type column region and average density $N_a(x)$ of a negative charge at a predetermined depth position of a p-type column region when a super junction structure is depleted by turning off the MOSFET are changed in place of changing of a width $W_n(x)$ at a predetermined depth position of the n-type column region and a width $W_p(x)$ at a predetermined depth position of the p-type column region. That is, in the MOSFET 102 according to Embodiment 2, in a graph where a depth x is taken on an axis of abscissas, average density $N_d(x)$ of a positive charge at the predetermined depth position of the n-type column region 114 and average density $N_a(x)$ of a negative charge at the predetermined depth position of the p-type column region 116 are taken on an axis of ordinates, average density $N_d(x)$ of a positive charge is expressed by a monotonous upward convex curve projecting in a right upward direction, and average density $N_a(x)$ of a negative charge is expressed by a monotonous downward convex curve projecting in a right downward direction (see FIG. 20C). The width of the n-type column region 114 and the width of the p-type column region 116 are set to a fixed value regardless of depth (see FIG. 20A and FIG. 20B).

Using a deepest depth position of a surface of a depletion layer on the first main surface side when the depletion layer extends most in the super junction structure by turning off the MOSFET as a reference, in a graph where a depth x at a predetermined depth position of the super junction structure is taken on an axis of abscissas, average density $N_d(x)$ of a positive charge at the predetermined depth position of the n-type column region 114 or average density $N_a(x)$ of a negative charge at the predetermined depth position of the p-type column region 116 is taken on an axis of ordinates, average density $N_d(X)$ of a positive charge at the predetermined depth position of the n-type column region 114 is expressed by the following formula (4), and

[Formula 4]

$$Na(x) = -\left[-A\exp\left(-\frac{x}{\lambda}\right)+B\right]+N \tag{4}$$

(symbols A, B, λ being constants)

average density $N_a(x)$ of a negative charge at a predetermined depth position of the p-type column region is expressed by the following formula (5).

[Formula 5]

$$Nd(x) = \left[-A\exp\left(-\frac{x}{\lambda}\right)+B\right]+N \tag{5}$$

(symbols A, B, λ being constants)

In this manner, the MOSFET 102 according to Embodiment 2 differs from the MOSFET 100 according to Embodiment 1 with respect to the point that the average density $N_d(x)$ of a positive charge at the predetermined depth position of the n-type column region and the average density $N_a(x)$ of a negative charge at the predetermined depth position of the p-type column region when the super junction structure is depleted by turning off the MOSFET are changed in place of changing of the width $W_p(x)$ at a predetermined depth position of the p-type column region and the width $W_n(x)$ at the predetermined depth position of the n-type column region. However, in the same manner as the MOSFET 100 according to Embodiment 1, the relationship of $|X_0-X_0'| \leq |X_m-X_m'|$ is satisfied and hence, even when an irregularity occurs in a charge balance so that the MOSFET becomes n-type dopant rich, deviation of average positive charge density ρ(x) on a first main surface side (gate electrode side) is small so that a region where an electric field E(x) is high minimally approaches the gate electrode. Accordingly, an electric field E(x) of the n-type column region 114 around the gate electrode becomes minimally high so that a change in potential of the n-type column region around the gate becomes small easily. As a result, an irregularity minimally occurs in switching characteristics when the MOSFET is turned off.

The MOSFET 102 according to Embodiment 2 has substantially the same configuration as the MOSFET 100 according to Embodiment 1 with respect to points other than the point where the MOSFET 102 according to Embodiment 2 is characterized in that the average density $N_d(x)$ of a positive charge at the predetermined depth position of the n-type column region and the average density $N_a(x)$ of a negative charge at the predetermined depth position of the p-type column region when the super junction structure is depleted by turning off the MOSFET are changed in place of changing of the width $W_n(x)$ at a predetermined depth position of the n-type column region and the width $W_p(x)$ at a predetermined depth position of the p-type column region. Accordingly, the MOSFET 102 according to Embodiment 2 acquires advantageous effects corresponding to the advantageous effects which the MOSFET 100 according to Embodiment 1 acquires among all advantageous effects which the MOSFET 100 according to Embodiment 1 possesses.

Embodiment 3

Figure 21:
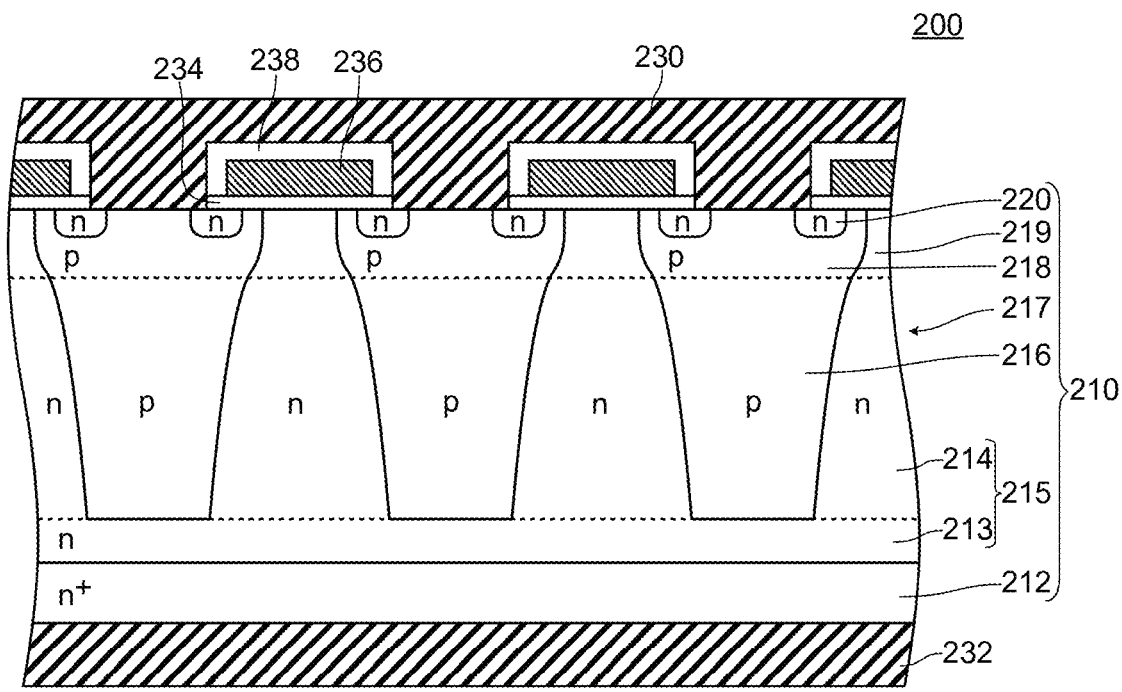
FIG. 21 is a cross-sectional view of a MOSFET 200 according to Embodiment 3.

MOSFET 200 according to Embodiment 3 basically has substantially the same configuration as MOSFET 100 according to Embodiment 1. However, MOSFET 200 according to Embodiment 3 differs from MOSFET 100 according to Embodiment 1 with respect to a point that the MOSFET 200 according to Embodiment 3 is not a trench-gate-type MOSFET but is a planar-gate-type MOSFET. That is, in the MOSFET 200 according to Embodiment 3, as shown in FIG. 21, a semiconductor base substrate 210 has: a base region 218 which is formed on a surface of a first main surface of the semiconductor base substrate 210, a whole surface of a p-type column region 216 and on a portion of a surface of an n-type column region 214; an n-type surface high concentration region 219 formed on a surface of a first main surface of the semiconductor base substrate 210 and on a surface of the n-type column region 214 in a state where the n-type surface high concentration region 219 is disposed adjacently to a base region 218; and an n-type source region 220 formed on a surface of the base region 218. A gate electrode 236 is formed on the surface of the base region 218 sandwiched between source regions 220 and the n-type surface high concentration regions 219 by way of gate insulation films 234. A depth position of the n-type surface high concentration region 219 falls within a range of 1.0 μm to 4.0 μm, and dopant concentration in the n-type surface high concentration region 219 falls within a range of $1 \times 10^{14}$ cm$^{-3}$ to $1 \times 10^{16}$ cm$^{-3}$.

As described above, the MOSFET 200 according to Embodiment 3 differs from the MOSFET 100 according to Embodiment 1 with respect to the point where the MOSFET 200 according to Embodiment 3 is not a trench-gate-type MOSFET but is a planar-gate-type MOSFET. However, in the same manner as the MOSFET 100 according to Embodiment 1, a relationship of $|X_0 - X_0'| \le |X_m - X_m'|$ is satisfied and hence, even when an irregularity occurs in a charge balance so that the MOSFET becomes n-type dopant rich, deviation of average positive charge density ρ(x) on a first main surface side (gate electrode side) is small so that a region where an electric field E(x) is high minimally approaches the gate electrode. Accordingly, an electric field E(x) of the n-type column region 114 around the gate electrode becomes minimally high so that a change in potential of the n-type column region around the gate becomes small easily. As a result, an irregularity minimally occurs in switching characteristics when the MOSFET is turned off.

The MOSFET 200 according to Embodiment 3 has substantially the same configuration as the MOSFET 100 according to Embodiment 1 with respect to points other than the point where the MOSFET 200 according to Embodiment 3 is not a trench-gate-type MOSFET but is a planar-gate-type MOSFET and hence, the MOSFET 200 according to Embodiment 3 acquires advantageous effects corresponding to the advantageous effects which the MOSFET 100 according to Embodiment 1 acquires among all advantageous effects which the MOSFET 100 according to Embodiment 1 possesses.

Embodiment 4

Figure 22:
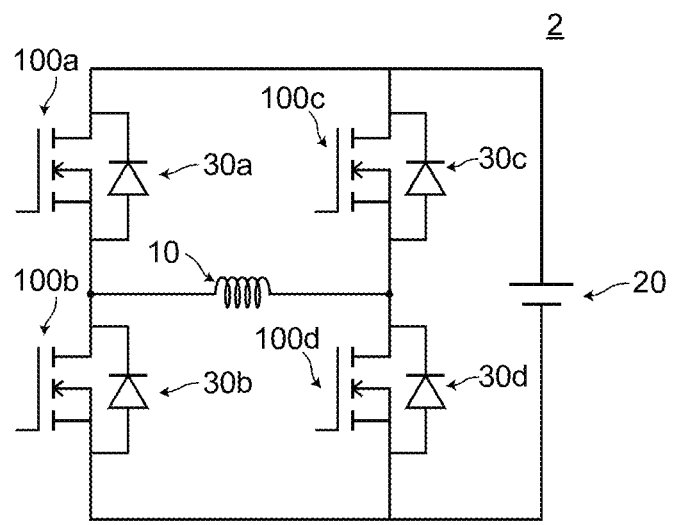
FIG. 22 is a circuit diagram showing a power conversion circuit 2 according to Embodiment 4.

A power conversion circuit 2 according to Embodiment 4 basically has the same configuration as the configuration of the power conversion circuit 1 according to Embodiment 1. However, the power conversion circuit 2 according to Embodiment 4 differs from the power conversion circuit 1 according to Embodiment 1 with respect to a point where the power conversion circuit is a full bridge circuit. That is, as shown in FIG. 22, the power conversion circuit 2 according to Embodiment 4 includes four MOSFETs 100 (100a to 100d) as the MOSFET, and also includes built-in diodes of the respective MOSFETs as rectifier elements.

As described above, the power conversion circuit 2 according to Embodiment 4 differs from the power conversion circuit 1 according to Embodiment 1 with respect to the point where the power conversion circuit is a full bridge circuit. However, in the same manner as the power conversion circuit 1 according to Embodiment 1, a relationship of $|X_0 - X_0'| \le |X_m - X_m'|$ is satisfied and hence, even when an irregularity occurs in a charge balance so that the MOSFET becomes n-type dopant rich, deviation of average positive charge density ρ(x) on a first main surface side (gate electrode side) is small whereby a region where an electric field E(x) is high minimally approaches a gate electrode. Accordingly, an electric field E(x) of an n-type column region 114 around the gate electrode becomes minimally high so that a change in potential of the n-type column region around the gate becomes small easily. As a result, an irregularity minimally occurs in switching characteristics when the MOSFET is turned off.

In the power conversion circuit 2 according to Embodiment 4, the average positive charge density ρ(x) is expressed by an upward convex curve projecting in a right upward direction. Accordingly, as described above, even when a potential of the n-type column region 114 (non-depleted region of the n-type column region 114) is increased along with the increase of a drain voltage which takes place when the MOSFET is turned off, the gate electrode 126 is minimally affected by a change in potential of the n-type column region 114. Accordingly, a phenomenon referred to as "false turn-on (erroneous ON)" minimally occurs.

The phenomenon referred to as "false turn-on" is a phenomenon where, in a circuit where two or more MOSFETs are connected to each other, when either one of the MOSFETs is turned on, the other MOSFETs are also erroneously turned on due to a change in potential.

Further, according to the power conversion circuit 2 of Embodiment 4, the rectifier element is the built-in diode of the MOSFET and hence, it is unnecessary to prepare a rectifier element as an additional part.

The power conversion circuit 2 according to Embodiment 4 has substantially the same configuration as the power conversion circuit 1 according to Embodiment 1 with respect to points other than the point where the power conversion circuit is a full bridge circuit. Accordingly, the power conversion circuit 2 according to Embodiment 4 acquires advantageous effects corresponding to the advantageous effects which the power conversion circuit 1 according to Embodiment 1 acquires among all advantageous effects which the power conversion circuit 1 according to Embodiment 1 possesses.

Although the present invention has been described based on the above-mentioned embodiments, the present invention is not limited to the above-mentioned embodiments. The present invention can be carried out in various modes without departing from the gist of the present invention, and, for example, the following modifications are also conceivable.

(1) The numbers, materials, shapes, positions, sizes and the like of the constitutional elements described in the above-mentioned respective Embodiments are provided only for an exemplifying purpose, and can be changed within a scope where advantageous effects of the present invention are not impaired.

(2) In the above-mentioned Embodiments 1 and 2, a width $W_n(x)$ at a predetermined depth position of the n-type column region and a width $W_p(x)$ at a predetermined depth position of the p-type column region or the average density $N_d(x)$ of a positive charge at a predetermined depth position of the n-type column region and the average density $N_a(x)$ of a negative charge at a predetermined depth position of the p-type column region are expressed in the form of an exponential. However, the present invention is not limited to such a configuration. Provided that the relationship of $|X_0-X_0'| \le |X_m-X_m'|$ is satisfied, the width $W_n(x)$ and the width $W_p(x)$ or the average density $N_d(x)$ and the average density $N_a(x)$ may be expressed in other forms besides an exponential.

Figure 23:
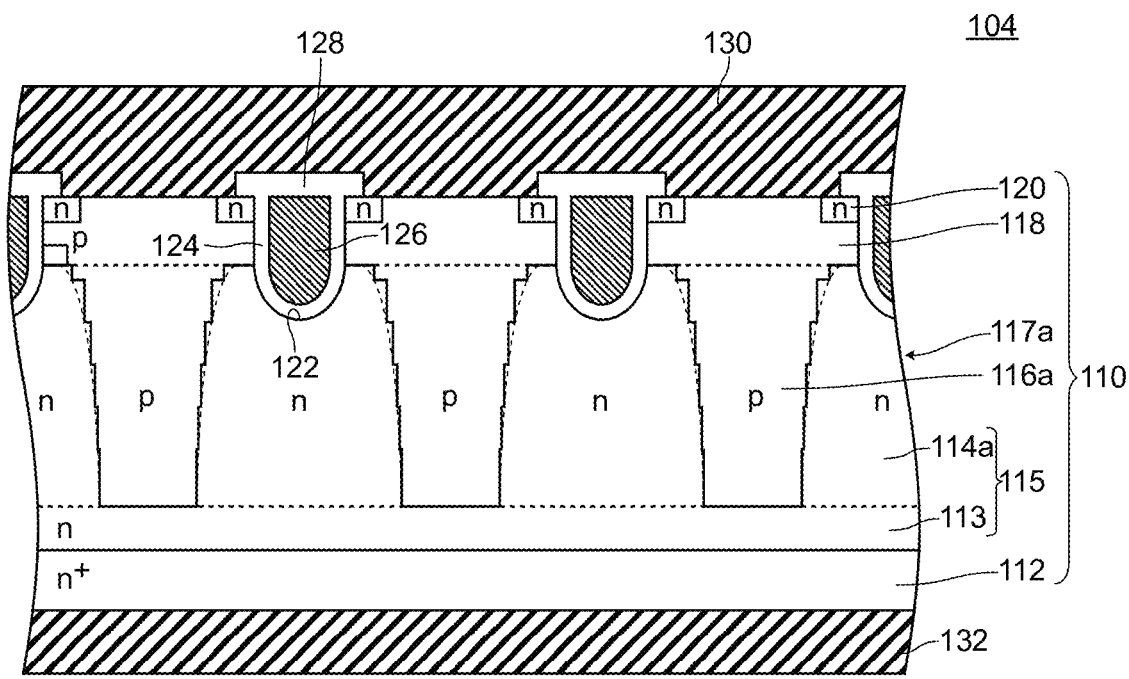
FIG. 23 is a cross-sectional view showing a MOSFET 104 according to Modification 1.
Figure 24:
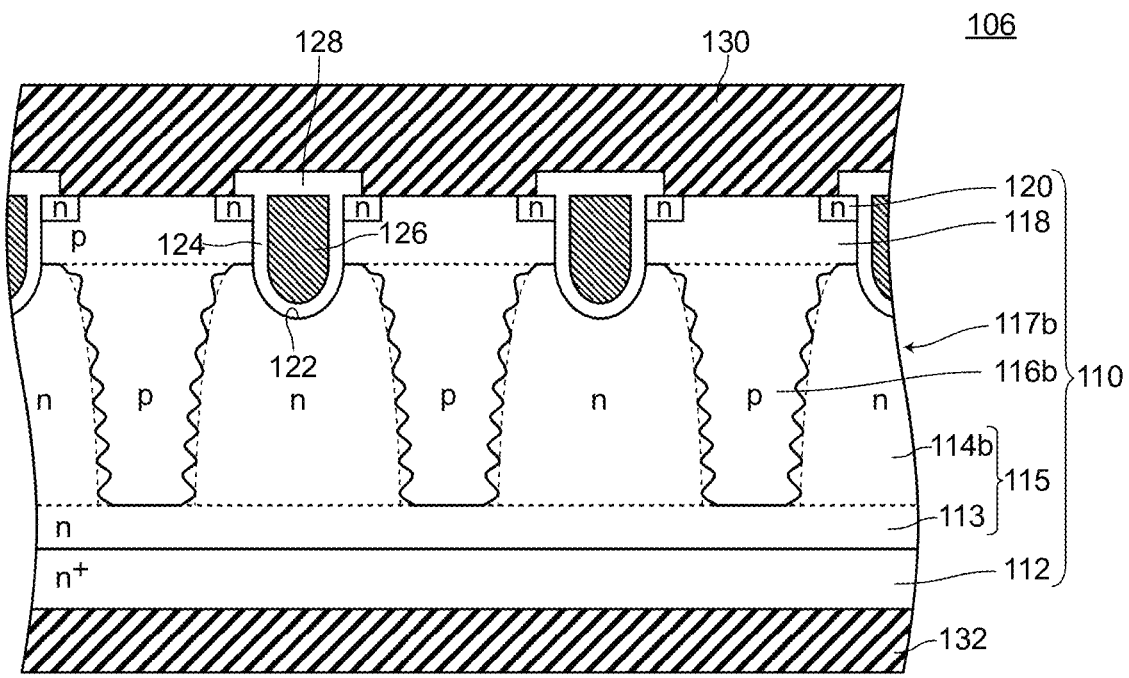
FIG. 24 is a cross-sectional view showing a MOSFET 106 according to Modification 2.
Figure 25:
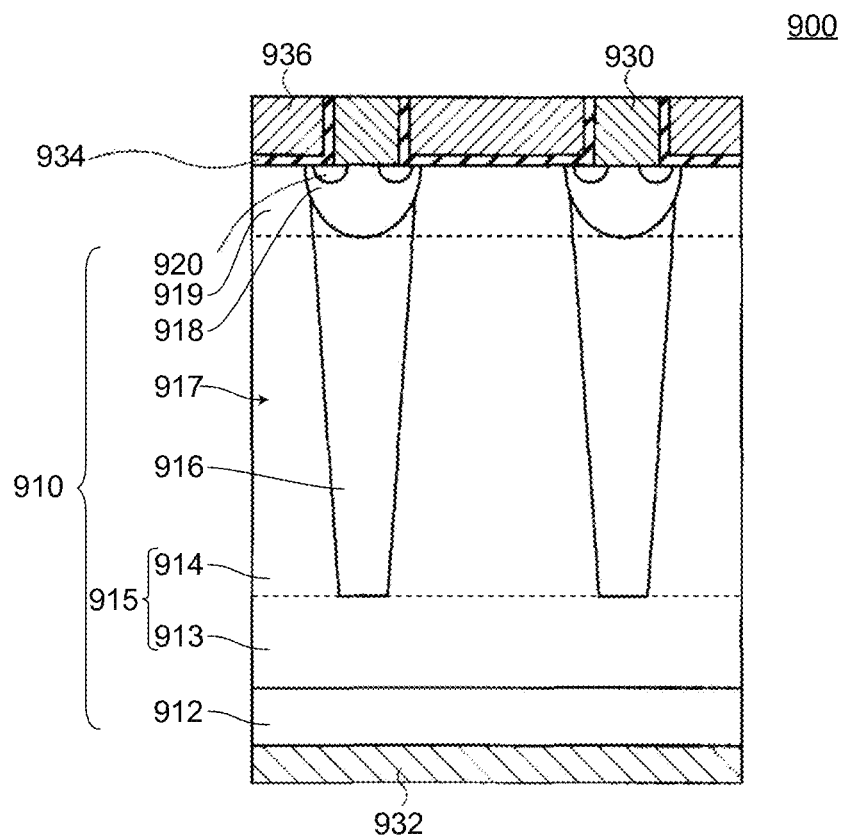
FIG. 25 is a cross-sectional view showing a conventional MOSFET 900. Symbol 912 indicates a low-resistance semiconductor layer, symbol 913 indicates a buffer layer, symbol 915 indicates an n-type semiconductor layer, symbol 930 indicates a source electrode, and symbol 932 indicates a drain electrode.

(3) In the above-mentioned embodiment 1, a width $W_n(x)$ at the predetermined depth position of the n-type column region is expressed by a monotonous upward convex curve projecting in a right upward direction, and a width $W_p(x)$ at a predetermined depth position of the p-type column region is expressed by a monotonous downward convex curve projecting in a right downward direction. However, the present invention is not limited to such a configuration. For example, the width $W_n(x)$ at a predetermined depth position of the n-type column region may be expressed by a stepped shape (a line (envelope) which connects corner portions of steps forming a monotonous upward convex curve projecting in a right upward direction), and the width $W_p$ at a predetermined depth position of the p-type column region may be expressed by a stepped shape (a line (envelope) which connects corner portions of steps forming a monotonous downward convex curve projecting in a right downward direction) (see FIG. 23). Further, the width $W_n(x)$ at a predetermined depth position of the n-type column region may be expressed by a curve where a concave shape and a convex shape are repeated (an envelope made by the concaves and the convexes forming a monotonous upward convex curve projecting in a right upward direction), and the width $W_p$ at a predetermined depth position of the p-type column region may be expressed by a curve where a concave shape and a convex shape are repeated (an envelope made by the concaves and the convexes forming a monotonous downward convex curve projecting in a right downward direction)(see FIG. 24).

(4) In the above-mentioned Embodiment 2, average density $N_d(x)$ of a positive charge at a predetermined depth position of the n-type column region is expressed by a monotonous upward convex curve projecting in a right upward direction. However, the present invention is not limited to such a case. For example, average density $N_d(x)$ of a positive charge at a predetermined depth position of the n-type column region may be expressed by a stepped shape (a line which connects corner portions of steps forming a monotonous upward convex curve projecting in a right upward direction) or may be expressed by a curve where a concave shape and a convex shape are repeated (an envelope made by the concaves and the convexes forming a monotonous upward convex curve projecting in a right upward direction).

(5) In the above-mentioned Embodiment 2, average density $N_a(x)$ of a negative charge at a predetermined depth position of the p-type column region is expressed by a monotonous downward convex curve projecting in a right downward direction. However, the present invention is not limited to such a case. For example, average density $N_a(x)$ of a negative charge at a predetermined depth position of the p-type column region may be expressed by a stepped shape (a line which connects corner portions of steps forming a monotonous downward convex curve projecting in a right downward direction) or may be expressed by a curve where a concave shape and a convex shape are repeated (an envelope made by the concaves and the convexes forming a monotonous downward convex curve projecting in a right downward direction).

(6) In the above-mentioned respective embodiments, the n-type column regions 114, the p-type column regions 116, the trenches 122, and the gate electrodes 126 are formed in a stripe shape as viewed in a plan view. However, the present invention is not limited to such a configuration. The n-type column regions 114, the p-type column regions 116, the trenches 122, and the gate electrodes 126 may be formed in a circular shape (in a columnar shape as viewed stereoscopically), a quadrangular frame shape, a circular frame shape, a circular grid shape or the like as viewed in a plan view.

(7) In the above-mentioned respective embodiments, a DC power source is used as the power source. However, the present invention is not limited to such a configuration. An AC power source may be also used as the power source.

(8) A chopper circuit is used as the power conversion circuit in the above-mentioned respective Embodiments 1 to 3, and a full bridge circuit is used as the power conversion circuit in the above-mentioned Embodiment 4. However, the present invention is not limited to such configurations. As the power conversion circuit, a half bridge circuit, a three-phase AC converter, a non-insulation-type full bridge circuit, a non-insulation-type half bridge circuit, a push-pull circuit, an RCC circuit, a forward converter, a fly-back converter, a PFC circuit (a current critical type PFC circuit, a current discontinuous type PFC circuit, a current continuous type PFC or other PFC circuits) and other circuits can be used.

(9) A PIN diode is used as the rectifier element in the above-mentioned Embodiments 1 to 3, and a built-in diode of the MOSFET is used as the rectifier element in the above-mentioned Embodiment 4. However, the present invention is not limited to such configurations. As the rectifier element, a JBS, a MPS, or other fast recovery diodes, a silicon-carbide Schottky barrier diode or other diodes may be used.

(10) In the above-mentioned Embodiment 4, only a built-in diode of the MOSFET is used as the rectifier element. However, the present invention is not limited to such a configuration. When a recovery loss of the built-in diode is excessively large, a rectifier element provided as an additional part may be connected to the MOSFET in parallel.

The invention claimed is:

1. A MOSFET comprising:
a semiconductor base substrate having a super junction structure which is formed of an n-type column region and a p-type column region; and
a gate electrode formed on a first main surface side of the semiconductor base substrate by way of a gate insulation film, wherein
using a deepest depth position of a surface of a depletion layer on the first main surface side when the depletion layer extends most in the super junction structure by turning off the MOSFET as a reference, in a graph where a depth x at a predetermined depth position of the super junction structure is taken on an axis of abscissas, average positive charge density $\rho(x)$ at the predetermined depth position of the super junction structure expressed by a following formula (1) when the super junction structure is depleted by turning off the MOSFET is taken on an axis of ordinates, and assuming a depth of a surface of the depletion layer on a second main surface side at a shallowest depth position when the depletion layer extends most in the super junction structure by turning off the MOSFET as a, in a curve which expresses the average positive charge density ρ(x), a value of the average positive charge density ρ(0) when x=0 becomes a negative value and a value of the average positive charge density ρ(a) when x=a becomes a positive value, an area of a region surrounded by a curve which expresses the average positive charge density ρ(x), a straight line when x=0, and an x axis is equal to an area of a region surrounded by the curve which expresses the average positive charge density ρ(x), a straight line when x=a, and the x axis, in a case that a state where a total amount of dopant in the n-type column region differs from a total amount of dopant in the p-type column region is brought about, using a surface of the super junction structure on the first main surface side as a reference, in the state where the total amount of dopant in the n-type column region differs from the total amount of dopant in the p-type column region, assuming a depth position where the average positive charge density ρ(x) becomes 0 as $X_m'$, and assuming a deepest depth position of the surface of the depletion layer on the first main surface side when the depletion layer extends most in the super junction structure by turning off the MOSFET as $X_0'$, and using the surface of the super junction structure on the first main surface side as a reference, in a case where the average positive charge density when the super junction structure is depleted by turning off the reference MOSFET which is configured such that the total amount of dopant in the n-type column region is set equal to the total amount of dopant in the p-type column region is set as a reference average positive charge density $ρ_0(x)$, assuming a depth position where the reference average positive charge density $ρ_0(x)$ becomes 0 as $X_m$, and assuming a deepest depth position of the depletion layer on the first main surface side when the depletion layer extends most in the super junction structure by turning off the reference MOSFET as $X_0$, a relationship of $|X_0-X_0'|<|X_m-X_m'|$ is satisfied,

[Formula 1]

$$ρ(x) = \frac{q}{2w}[w_n(x) \cdot N_d(x) - w_p(x) \cdot N_a(x)] \quad (1)$$

(In the formula (1), $W_n(x)$ indicates a width of the n-type column region at the predetermined depth position, $N_d(x)$ indicates average density of a positive charge at the predetermined depth position of the n-type column region when the super junction structure is depleted by turning off the MOSFET, $W_p(x)$ indicates a width of the p-type column region at the predetermined depth position, $N_a(x)$ indicates average density of a negative charge at the predetermined depth position of the p-type column region when the super junction structure is depleted by turning off the MOSFET, q indicates an elementary charge, and w indicates a positive constant which satisfies $W_n(x)+W_p(x)=2w$).

2. The MOSFET according to claim 1, wherein the average positive charge density ρ(x) is expressed by an upward convex curve projecting in a right upward direction.

3. The MOSFET according to claim 1, wherein in a graph where a depth x of the predetermined depth position of the super junction structure is taken on an axis of abscissas and a width $W_p(x)$ at the predetermined depth position of the p-type column region or a width $W_n(x)$ at the predetermined depth position of the n-type column region is taken on an axis of ordinates, the width $W_p(x)$ at the predetermined depth position of the p-type column region is expressed by a following formula (2), and

[Formula 2]

$$Wp(x) = -\left[-A\exp\left(-\frac{x}{\lambda}\right)+B\right]+W \quad (2)$$

(symbols A, B, λ being constants)

the width $W_n(x)$ at the predetermined depth position of the n-type column region is expressed by a following formula (3).

[Formula 3]

$$Wn(x) = \left[-A\exp\left(-\frac{x}{\lambda}\right)+B\right]+W \quad (3)$$

(symbols A, B, λ being constants).

4. The MOSFET according to claim 1, wherein in a graph where a depth x at a predetermined depth position of the super junction structure is taken on an axis of abscissas and average density $N_a(x)$ of a negative charge at the predetermined depth position of the p-type column region or average density $N_d(x)$ of a positive charge at the predetermined depth position of the n-type column region when the super junction structure is depleted by turning off the MOSFET is taken on an axis of ordinates, the average density $N_a(x)$ of a negative charge at the predetermined depth position of the p-type column region when the super junction structure is depleted by turning off the MOSFET is expressed by a following formula (4), and

[Formula 4]

$$Na(x) = -\left[-A\exp\left(-\frac{x}{\lambda}\right)+B\right]+N \quad (4)$$

(symbols A, B, λ being constants)

the average density $N_d(x)$ of the positive charge at the predetermined depth position of the n-type column region when the super junction structure is depleted by turning off the MOSFET is expressed by a following formula (5).

[Formula 5]

$$Nd(x) = \left[-A\exp\left(-\frac{x}{\lambda}\right) + B\right] + N \qquad (5)$$

(symbols A, B, λ being constants).

5. The MOSFET according to claim 1, wherein in the case that in the state where the total amount of dopant in the n-type column region differs from the total amount of dopant in the p-type column region is brought about,
  using the surface of the super junction structure on the first main surface side as the reference,
  in the state where the total amount of dopant in the n-type column region differs from the total amount of dopant in the p-type column region, assuming the average positive charge density at the deepest depth position $X_0'$ of the surface of the depletion layer on the first main surface side when the depletion layer extends most in the super junction structure by turning off the MOSFET as $\rho(X_0')$, and
  assuming the reference average positive charge density at the deepest depth position $X_0$ of the depletion layer on the first main surface side when the depletion layer extends most in the super junction structure by turning off the reference MOSFET as $\rho_0(X_0)$, a relationship of $\rho_0(X_0) > \rho(X_0')$ is satisfied.

6. The MOSFET according to claim 1, wherein in the case that in the state where the total amount of dopant in the n-type column region differs from the total amount of dopant in the p-type column region is brought about,
  using the surface of the super junction structure on the first main surface side as the reference,
  in the state where the total amount of dopant in the n-type column region differs from the total amount of dopant in the p-type column region, assuming the depth position where the average positive charge density $\rho(x)$ becomes 0 as $X_m'$, and assuming the depth of the surface of the depletion layer on the second main surface side at a shallowest depth position when the depletion layer extends most in the super junction structure by turning off the MOSFET as $X_1'$,
  assuming the depth position where the reference average positive charge density $\rho_0(x)$ becomes 0 as $X_m$, and assuming the shallowest depth position of the surface of the depletion layer on the second main surface side when the depletion layer extends most in the super junction structure by turning off the reference MOSFET as $X_1$, a relationship of $|X_m - X_m'| < |X_1 - X_1'|$ is satisfied.

7. The MOSFET according to claim 1, wherein in the case that in the state where the total amount of dopant in the n-type column region differs from the total amount of dopant in the p-type column region is brought about,
  using the surface of the super junction structure on the first main surface side as the reference,
  in the state where the total amount of dopant in the n-type column region differs from the total amount of dopant in the p-type column region, assuming the average positive charge density at a depth $X_1'$ of the surface of the depletion layer on the second main surface side at the shallowest depth position when the depletion layer extends most in the super junction structure by turning off the MOSFET as $\rho(X_1')$, and
  assuming the reference average positive charge density at the shallowest depth position $X_1$ of the surface of the depletion layer on the second main surface side when the depletion layer extends most in the super junction structure by turning off the reference MOSFET as $\rho_0(X_1)$, a relationship of $\rho_0(X_1) < \rho(X_1')$ is satisfied.

8. The MOSFET according to claim 1, wherein in a graph where a difference between the total amount of dopant in the n-type column region and the total amount of dopant in the p-type column region is taken on an axis of abscissas, and a depth $X_1$ of a surface of the depletion layer on the second main surface side at a shallowest depth position when the depletion layer extends most in the super junction structure by turning off the MOSFET using the surface of the super junction structure on the first main surface side as a reference is taken on an axis of ordinates,
  in a case where the total amount of dopant in the p-type column region is larger than the total amount of dopant in the n-type column region, a curve which expresses the depth $X_1$ is converged to a predetermined value when a difference between the total amount of dopant in the n-type column region and the total amount of dopant in the p-type column region is increased.

9. The MOSFET according to claim 1, wherein in the state where the total amount of dopant in the n-type column region differs from the total amount of dopant in the p-type column region, using a deepest depth position of a surface of a depletion layer on the first main surface side when the depletion layer extends most in the super junction structure by turning off the MOSFET as a reference, assuming a depth of a surface of the depletion layer on the second main surface side at a shallowest depth position when the depletion layer extends most in the super junction structure by turning off the MOSFET as a', and assuming a depth of a surface of the depletion layer on the second main surface side at a shallowest depth position when the depletion layer extends most in the super junction structure by turning off the reference MOSFET as a,
  an area of a region surrounded by a curve which expresses the average positive charge density $\rho(x)$, a straight line when x=a', and an x axis is set equal to an area of a region surrounded by a curve which expresses the reference average positive charge density $\rho_0(x)$, a straight line when x=a, and an x axis.

10. The MOSFET according to claim 1, wherein using a deepest depth position of a surface of a depletion layer on the first main surface side when the depletion layer extends most in the super junction structure by turning off the MOSFET as a reference, assuming a shallowest depth position of a surface of the depletion layer on the second main surface side when the depletion layer extends most in the super junction structure by turning off the MOSFET as a, and assuming a depth of a depth position where the average positive charge density $\rho(x)$ becomes 0 in the super junction structure as d, a relationship of $0 < d \leq a/2$ is satisfied.

11. The MOSFET according to claim 1, wherein the semiconductor base substrate further includes a p-type base region formed on the n-type column region and the p-type base region, and an n-type source region formed on a surface of the base region,
  the MOSFET further comprises, in a region where the n-type column region is positioned as viewed in a plan view, a trench formed so as to extend from a surface of the first main surface of the semiconductor base substrate to a depth position deeper than a deepest position of the base region and a portion of the source region is exposed on an inner peripheral surface of the trench,
  the gate insulation film is formed on the inner peripheral surface of the trench, and the gate electrode is embedded in the trench by way of the gate insulation film.

12. The MOSFET according to claim 1, wherein the semiconductor base substrate further includes: a base region formed on a surface of the first main surface of the semiconductor base substrate, a whole surface of the p-type column region, and a portion of a surface of the n-type column region; an n-type surface high concentration region formed on a surface of the first main surface of the semiconductor base substrate and a surface of the n-type column region such that the n-type surface high concentration region is disposed adjacently to the base region; and an n-type source region formed on a surface of the base region, and the gate electrode is formed on a surface of the base region sandwiched between the source region and the n-type surface high concentration region by way of the gate insulation film.

13. The MOSFET according to claim 11, wherein using a deepest depth position of a surface of a depletion layer on the first main surface side when the depletion layer extends most in the super junction structure by turning off the MOSFET as a reference, assuming an axis along a depth direction as an x axis, an x coordinate at a depth position of a lowermost surface of the base region as −t, an x coordinate at a depth position of a lowermost portion of the p-type column region as b, and an x coordinate at a depth position where the average positive charge density $\rho(x)$ becomes 0 as d, a relationship of $0 < t+d < (t+b)/2$ is satisfied.

14. A power conversion circuit comprising at least:
a reactor;
a power source which supplies an electric current to the reactor;
the MOSFET according to claim 1 for controlling an electric current supplied from the power source to the reactor; and
a rectifier element which performs a rectifying operation of the electric current supplied from the power source to the reactor or an electric current from the reactor.

15. The power conversion circuit according to claim 14, wherein the rectifier element is a fast recovery diode.

16. The power conversion circuit according to claim 14, wherein the rectifier element is a built-in diode of the MOSFET.

17. The power conversion circuit according to claim 14, wherein the rectifier element is a silicon-carbide Schottky barrier diode.

* * * * *